(12) United States Patent
Yu et al.

(10) Patent No.: US 12,500,142 B2
(45) Date of Patent: Dec. 16, 2025

(54) SEMICONDUCTOR DEVICES INCLUDING THROUGH VIAS AND METHODS OF FORMING THE SAME

(71) Applicant: Taiwan Semiconductor Manufacturing Co., Ltd., Hsinchu (TW)

(72) Inventors: Li-Zhen Yu, New Taipei (TW); Huan-Chieh Su, Tianzhong Township (TW); Lin-Yu Huang, Hsinchu (TW); Chih-Hao Wang, Baoshan Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 477 days.

(21) Appl. No.: 18/149,899

(22) Filed: Jan. 4, 2023

(65) Prior Publication Data

US 2023/0386971 A1   Nov. 30, 2023

Related U.S. Application Data

(60) Provisional application No. 63/406,003, filed on Sep. 13, 2022, provisional application No. 63/365,351, filed on May 26, 2022.

(51) Int. Cl.
| | | |
|---|---|---|
| H01L 23/48 | (2006.01) | |
| B82Y 10/00 | (2011.01) | |
| H01L 21/762 | (2006.01) | |
| H01L 21/768 | (2006.01) | |
| H01L 23/485 | (2006.01) | |

(Continued)

(52) U.S. Cl.
CPC ...... *H01L 23/481* (2013.01); *H01L 21/76224* (2013.01); *H01L 21/76898* (2013.01); *H10D 84/83* (2025.01)

(58) Field of Classification Search
CPC .............. H01L 21/743; H01L 23/481; H01L 21/76898; H01L 23/5226; H01L 21/76224; H01L 2225/06548; H01L 21/768; H01L 21/76802; H01L 21/76816; H01L 21/76897; H10D 64/254; H10D 30/6735;
(Continued)

(56) References Cited

U.S. PATENT DOCUMENTS 9,209,247 B2   12/2015   Colinge et al.
9,236,267 B2   1/2016   De et al.
(Continued)

FOREIGN PATENT DOCUMENTS

| TW | 202141687 A | 11/2021 |
| TW | 202145360 A | 12/2021 |
| TW | 202145484 A | 12/2021 |

*Primary Examiner* — Sonya McCall-Shepard
(74) *Attorney, Agent, or Firm* — Slater Matsil, LLP

(57) ABSTRACT

Methods of forming through vias for providing connections between a front-side of a substrate and a backside of the substrate and semiconductor devices including the same are disclosed. In an embodiment, a semiconductor device includes a gate structure on a substrate; a first isolation feature extending partially through the gate structure; a first conductive feature extending through the first isolation feature; and a second conductive feature extending partially through the gate structure, the second conductive feature being electrically coupled to the first conductive feature.

20 Claims, 120 Drawing Sheets

(51) Int. Cl.
 *H10D 30/01* (2025.01)
 *H10D 30/43* (2025.01)
 *H10D 30/67* (2025.01)
 *H10D 30/69* (2025.01)
 *H10D 62/10* (2025.01)
 *H10D 62/13* (2025.01)
 *H10D 62/17* (2025.01)
 *H10D 62/822* (2025.01)
 *H10D 64/01* (2025.01)
 *H10D 84/01* (2025.01)
 *H10D 84/03* (2025.01)
 *H10D 84/83* (2025.01)

(58) Field of Classification Search
 CPC ........... H10D 84/0151; H10D 84/0149; H10D 84/83; H10D 30/6757
 See application file for complete search history.

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 11,349,004 | B2 | 5/2022 | Yu et al. |
| 2020/0395356 | A1* | 12/2020 | Shu ............... H10D 62/115 |
| 2021/0359091 | A1 | 11/2021 | Hsu et al. |
| 2021/0399109 | A1 | 12/2021 | Su et al. |
| 2022/0367454 | A1 | 11/2022 | Chung et al. |
| 2023/0268344 | A1 | 8/2023 | Huang et al. |

* cited by examiner

SEMICONDUCTOR DEVICES INCLUDING THROUGH VIAS AND METHODS OF FORMING THE SAME

PRIORITY CLAIM AND CROSS-REFERENCE

This application claims the benefit of U.S. Provisional Patent Application No. 63/365,351, filed on May 26, 2022 and U.S. Provisional Patent Application No. 63/406,003, filed on Sep. 13, 2022, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
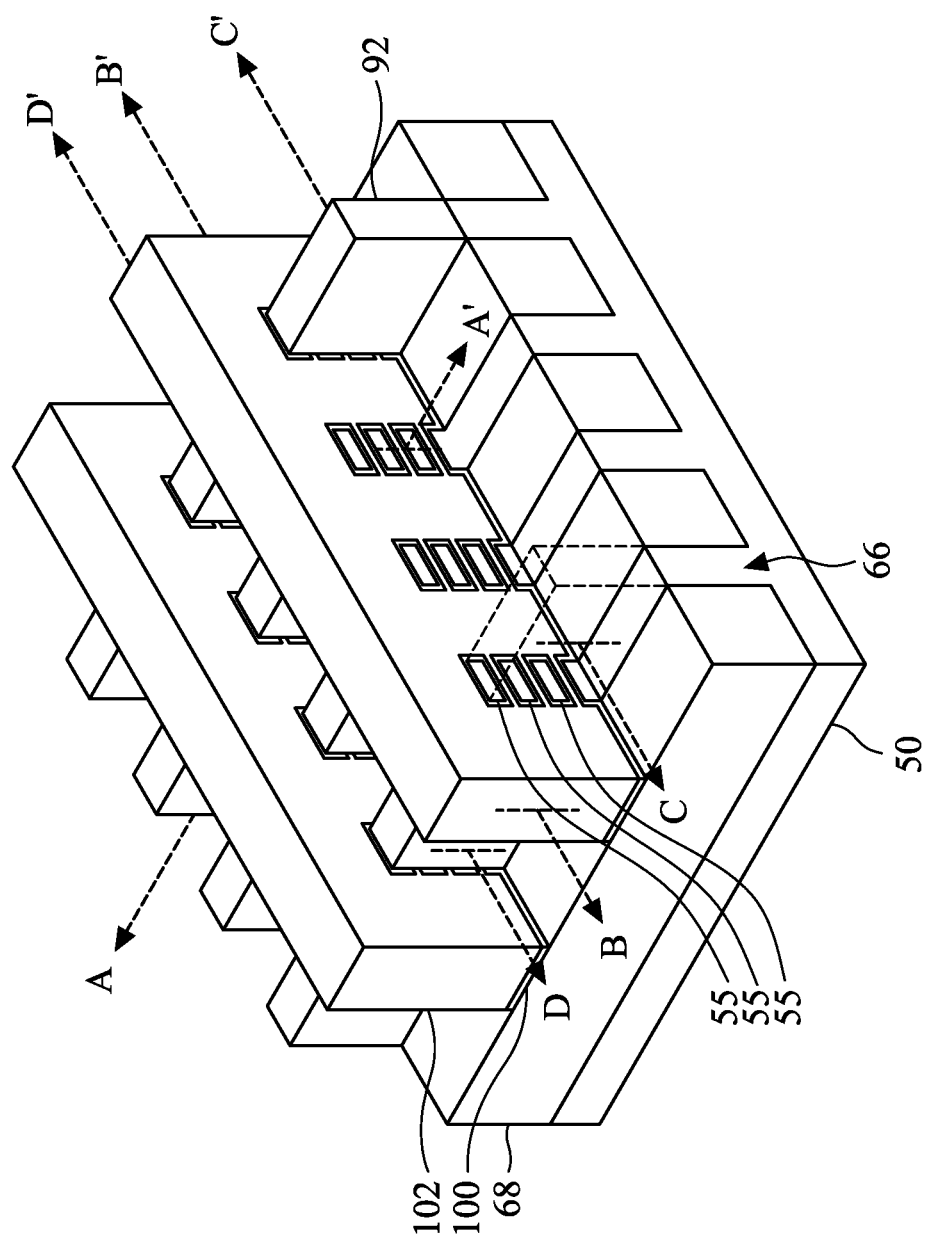
FIG. 1 illustrates an example of a nanostructure field-effect transistor (nanostructure FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide semiconductor devices including feedthrough vias and methods of forming the same. The method includes forming a transistor structure on a substrate, performing a gate patterning process to form a gate isolation trench in a gate structure and a feedthrough trench, forming a feedthrough isolation structure in the feedthrough trench, etching the feedthrough isolation structure to form a first recess, and forming a front-side via in the first recess. A backside of the substrate is thinned to expose the feedthrough isolation structure, the feedthrough isolation structure is etched to form a second recess, and a backside via is formed in the second recess. The backside via is physically and electrically coupled to the front-side via, and the backside via and the front-side via collectively form a feedthrough via. The feedthrough vias may replace routing through front-side interconnect structures with shorter, wider conductive lines. This reduces signal routing resistance and capacitance, which improves device performance. The front-side via and the backside via may be self-aligned to the feedthrough isolation structure, which reduces misalignment and reduces device defects.

Embodiments are described below in a particular context, namely, a die comprising nanostructure field-effect transistors (nanostructure FETs). Various embodiments may be applied, however, to dies comprising other types of transistors (e.g., fin field-effect transistors (FinFETs), planar transistors, or the like) in lieu of or in combination with the nanostructure FETs.

FIG. 1 illustrates an example of nanostructure FETs (e.g., nanowire FETs, nanosheet FETs, gate-all-around FETs, nano-ribbon FETs, multi-bridge-channel FETs (MBCFETs), or the like) in a three-dimensional view, in accordance with some embodiments. The nanostructure FETs comprise nanostructures 55 (e.g., nanosheets, nanowires, nano-ribbons, or the like) on fins 66 on a substrate 50 (e.g., a semiconductor substrate). The nanostructures 55 act as channel regions for the nanostructure FETs. The nanostructures 55 may include p-type nanostructures, n-type nanostructures, or a combination thereof. Shallow trench isolation (STI) regions 68 are disposed between adjacent fins 66, which may protrude above and from between neighboring STI regions 68. Although the STI regions 68 are described/illustrated as being separate from the substrate 50, as used herein, the term "substrate" may refer to the semiconductor substrate alone or a combination of the semiconductor substrate and the STI regions 68. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring STI regions 68

Gate dielectric layers 100 are on top surfaces of the fins 66 and along top surfaces, side surfaces, and bottom surfaces of the nanostructures 55. Gate electrodes 102 are on the gate dielectric layers 100. Epitaxial source/drain regions 92 are on the fins 66 on opposing sides of the gate dielectric layers 100 and the gate electrodes 102. The epitaxial source/drain region(s) 92 may refer to a source or a drain, individually or collectively, dependent upon the context.

FIG. 1 further illustrates reference cross-sections that are used in later figures. Cross-section A-A' is along a longitudinal axis of a fin 66 of a nanostructure FET and in a direction of, for example, a current flow between epitaxial source/drain regions 92 of the nanostructure FET. Cross-section A-A' may pass through a region in which an epitaxial source/drain region 92 is removed and a feedthrough via is formed. Cross-section B-B' is perpendicular to cross-section A-A' and is along a longitudinal axis of a gate electrode 102 and in a direction, for example, perpendicular to the direction of current flow between the epitaxial source/drain regions 92 of a nanostructure FET. Cross-section C-C' is parallel to cross-section B-B' and extends through some epitaxial source/drain regions 92 of nanostructure FETs. Cross-section C-C' may pass through the region in which epitaxial source/drain regions 92 are removed and the feedthrough via is formed. Cross-section D-D' is parallel to cross-section B-B' and extends through epitaxial source/drain regions 92 of nanostructure FETs. Cross-section D-D' may pass through the region in which epitaxial source/drain regions 92 are not removed. Subsequent figures refer to these reference cross-sections for clarity.

Some embodiments discussed herein are discussed in the context of nanostructure FETs formed using a gate-last process. In some embodiments, a gate-first process may be used. Also, some embodiments contemplate aspects used in planar devices, such as planar FETs or in fin field-effect transistors (FinFETs).

Figure 22A:
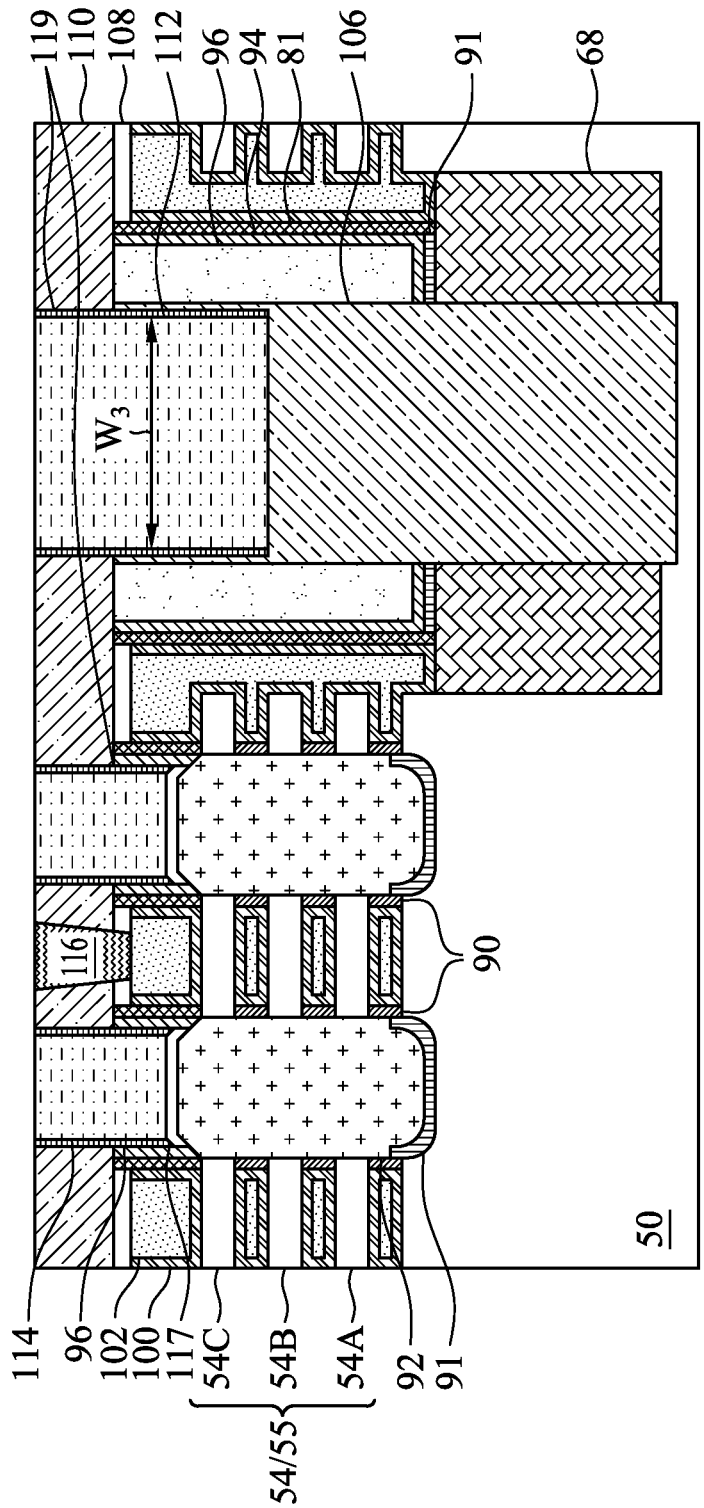
Figure 22B:
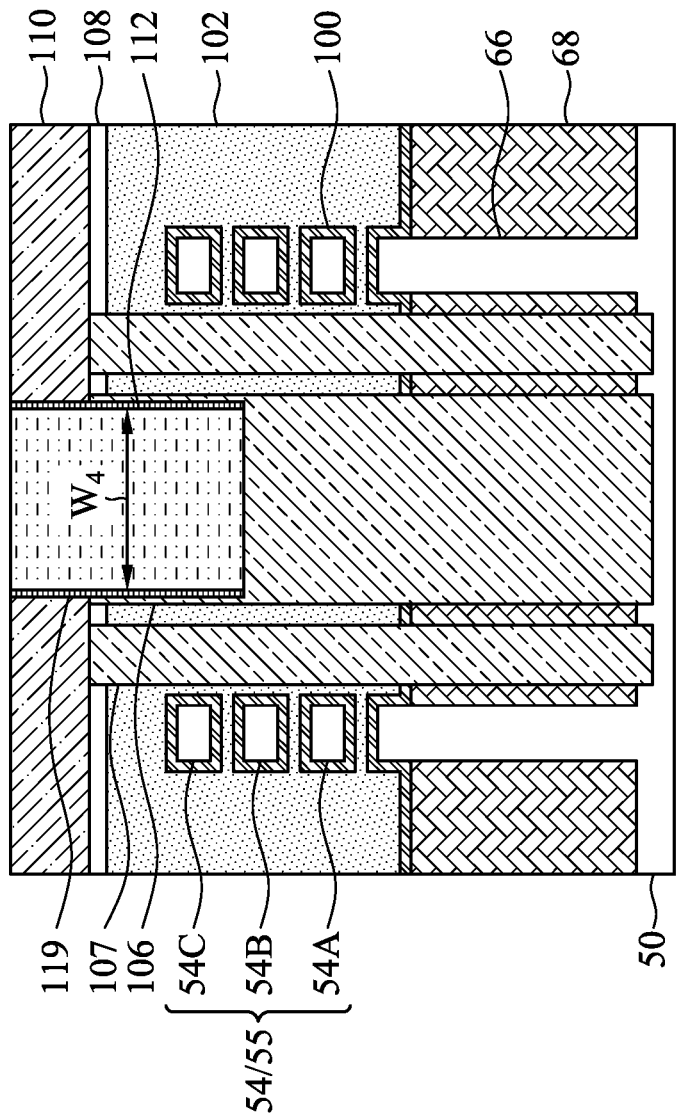
Figure 22C:
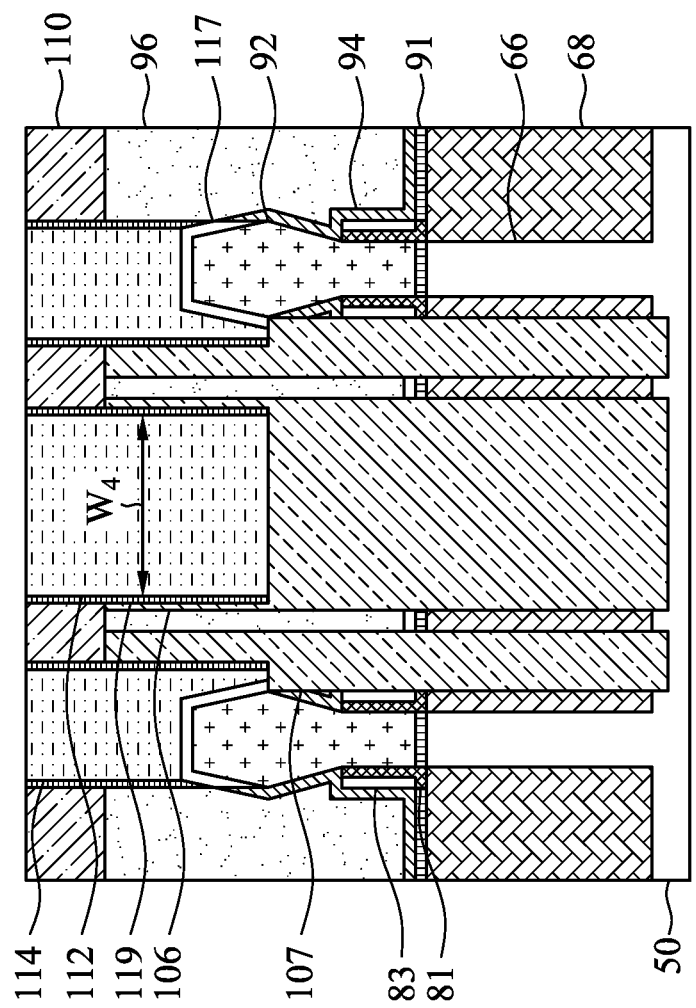
Figure 22D:
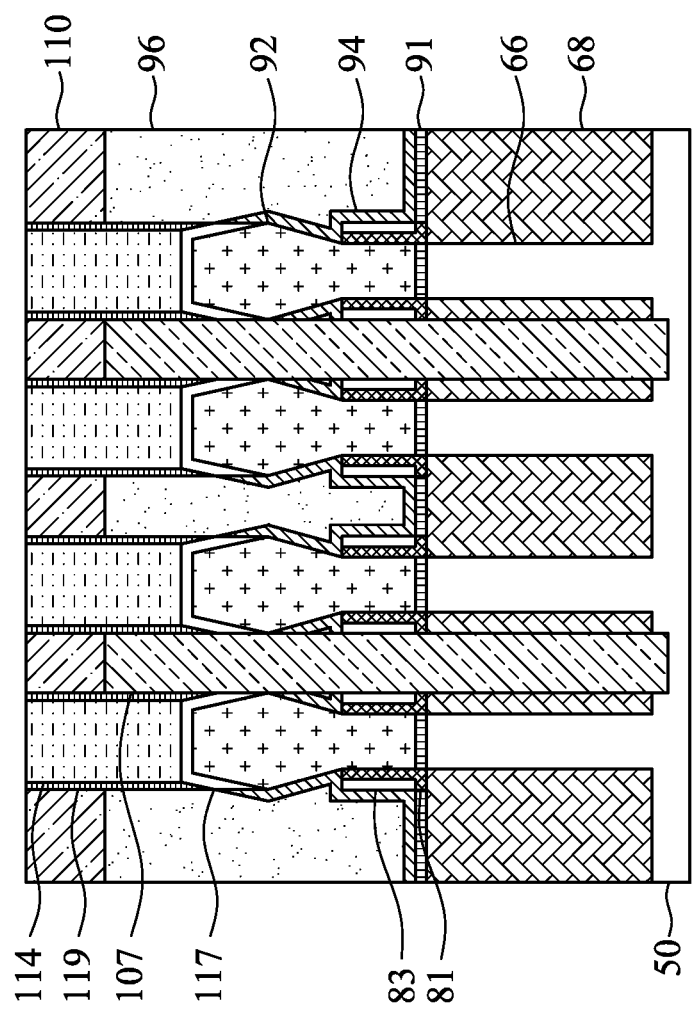
Figure 22E:
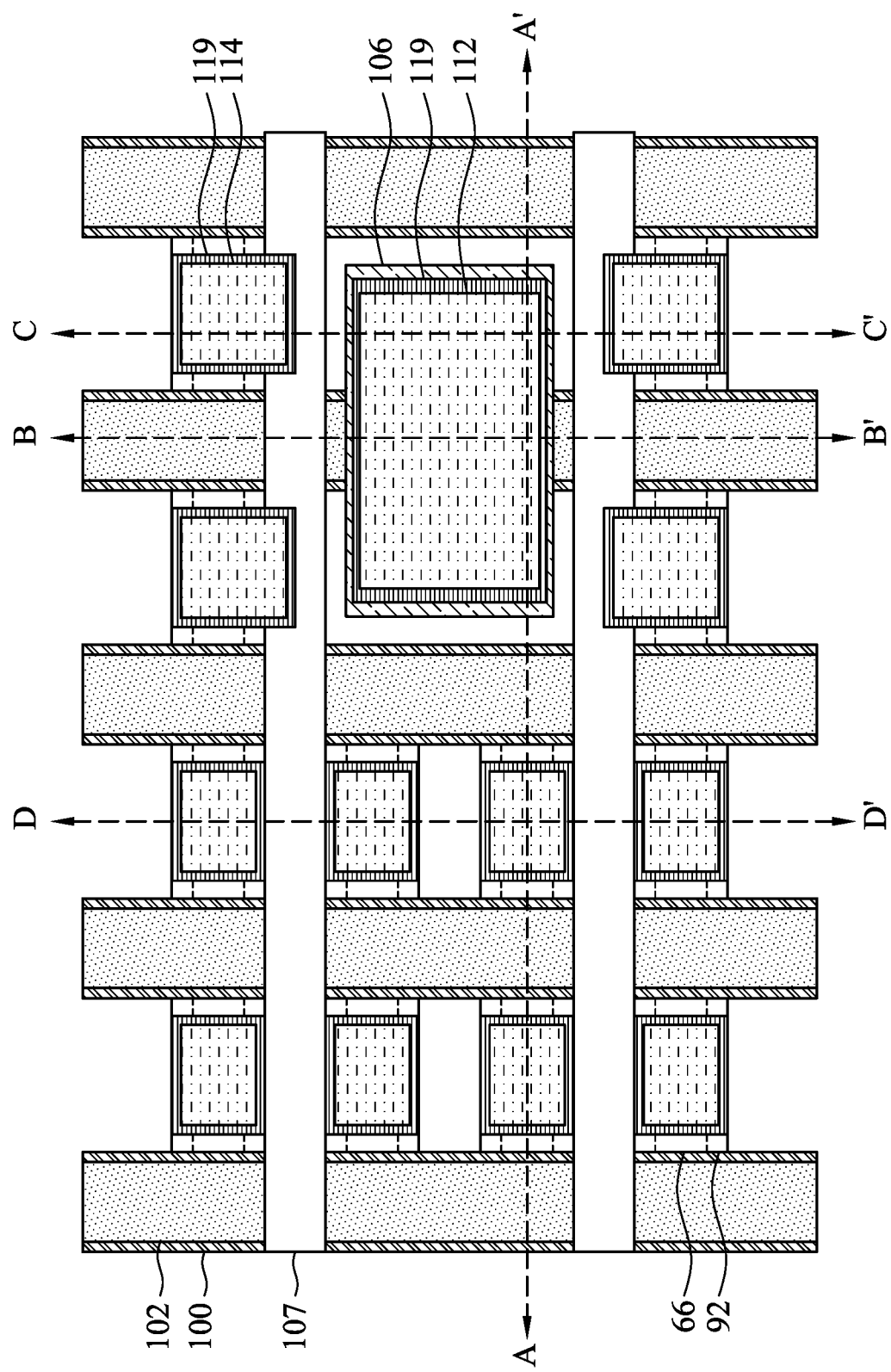
Figure 23A:
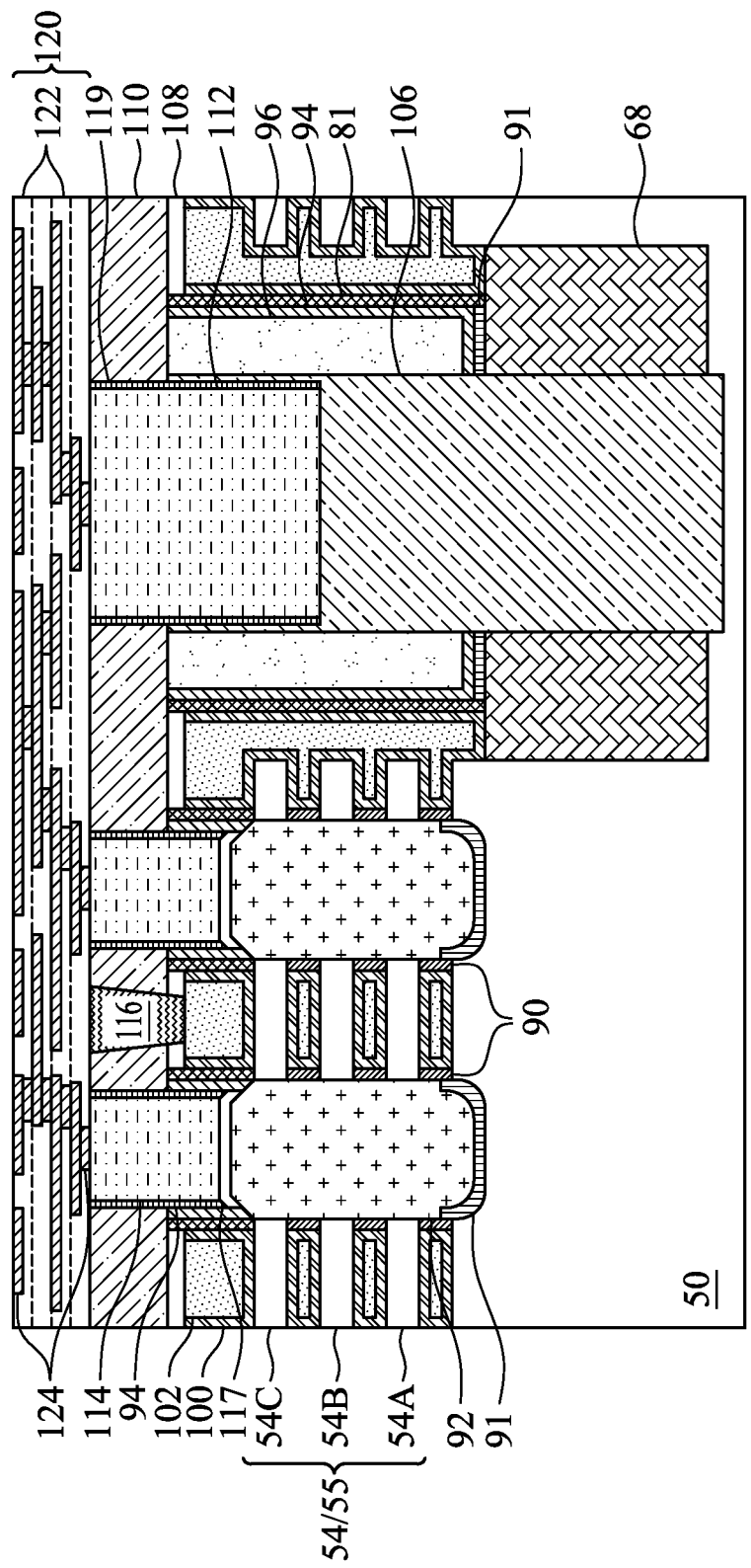
Figure 23B:
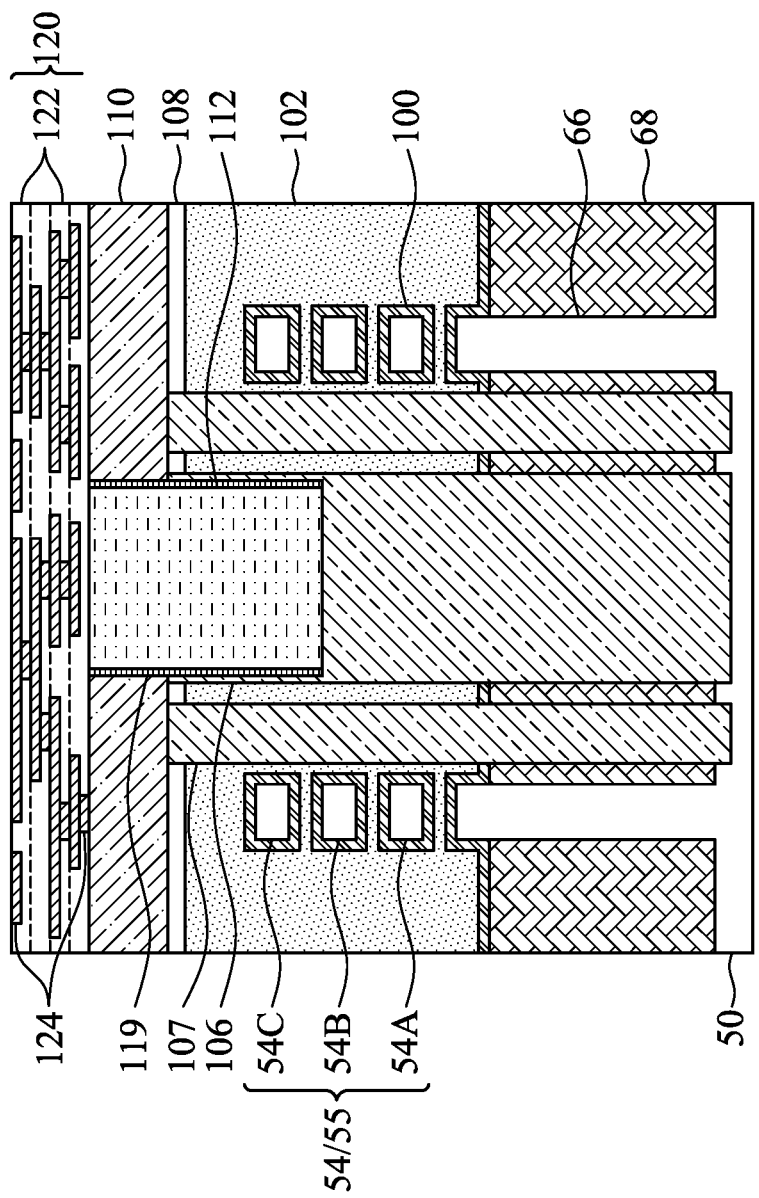
Figure 23C:
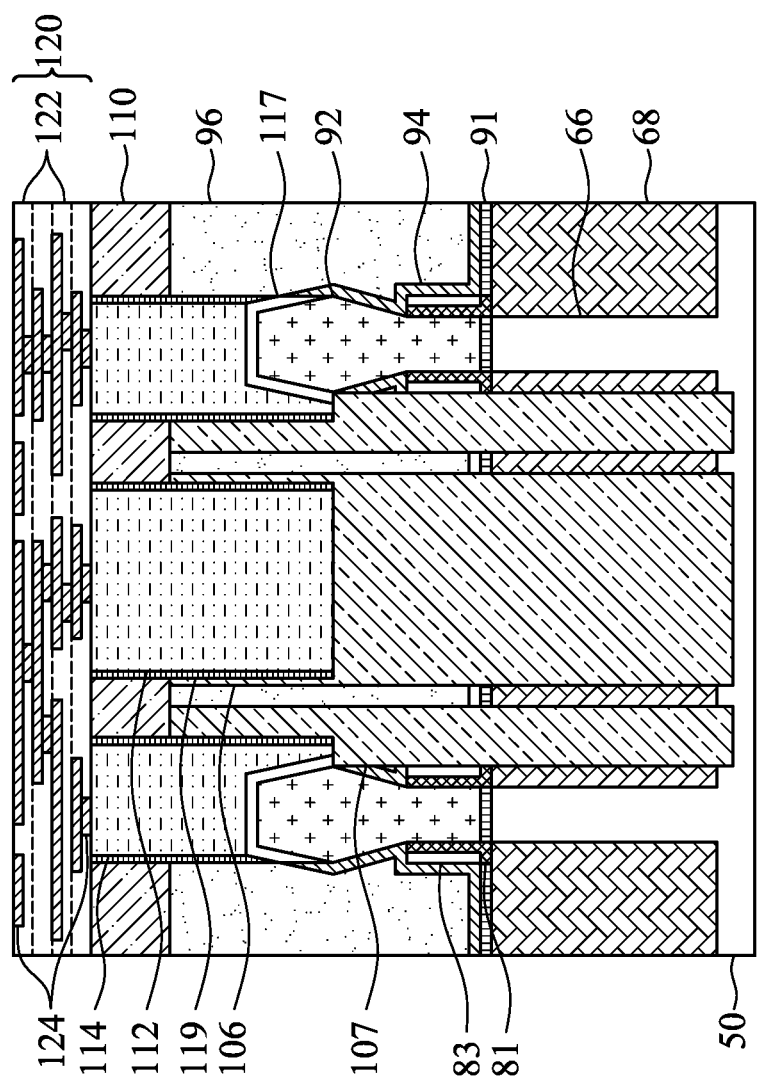
Figure 23D:
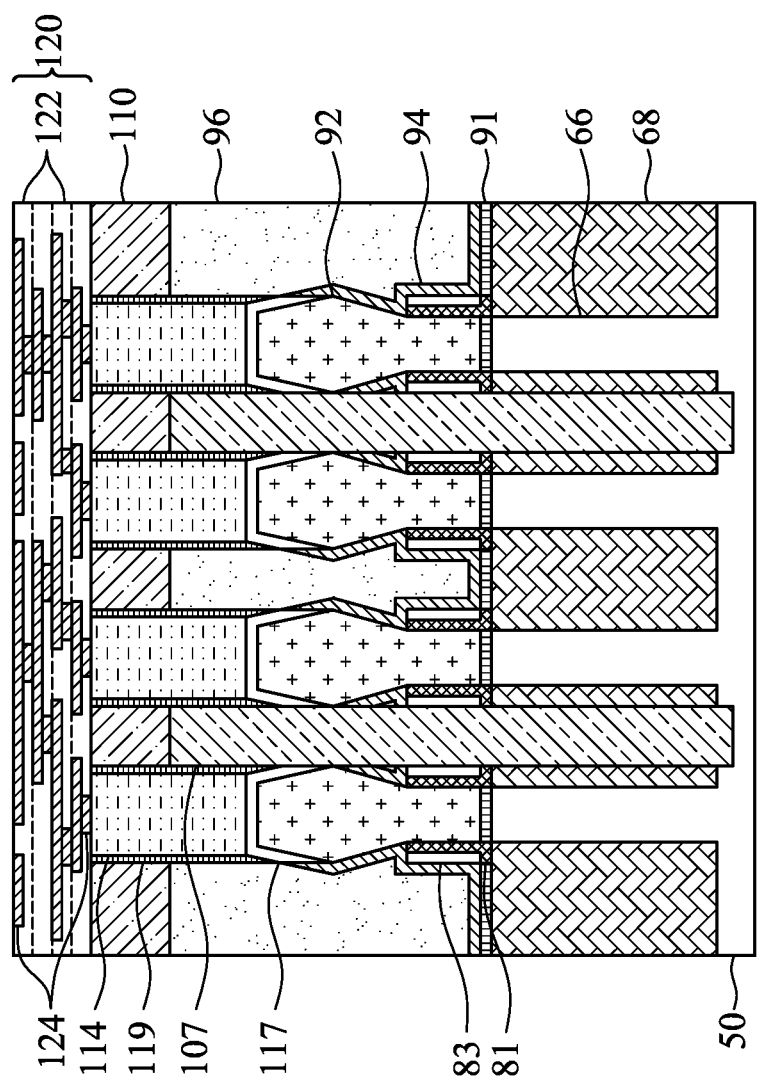
Figure 24A:
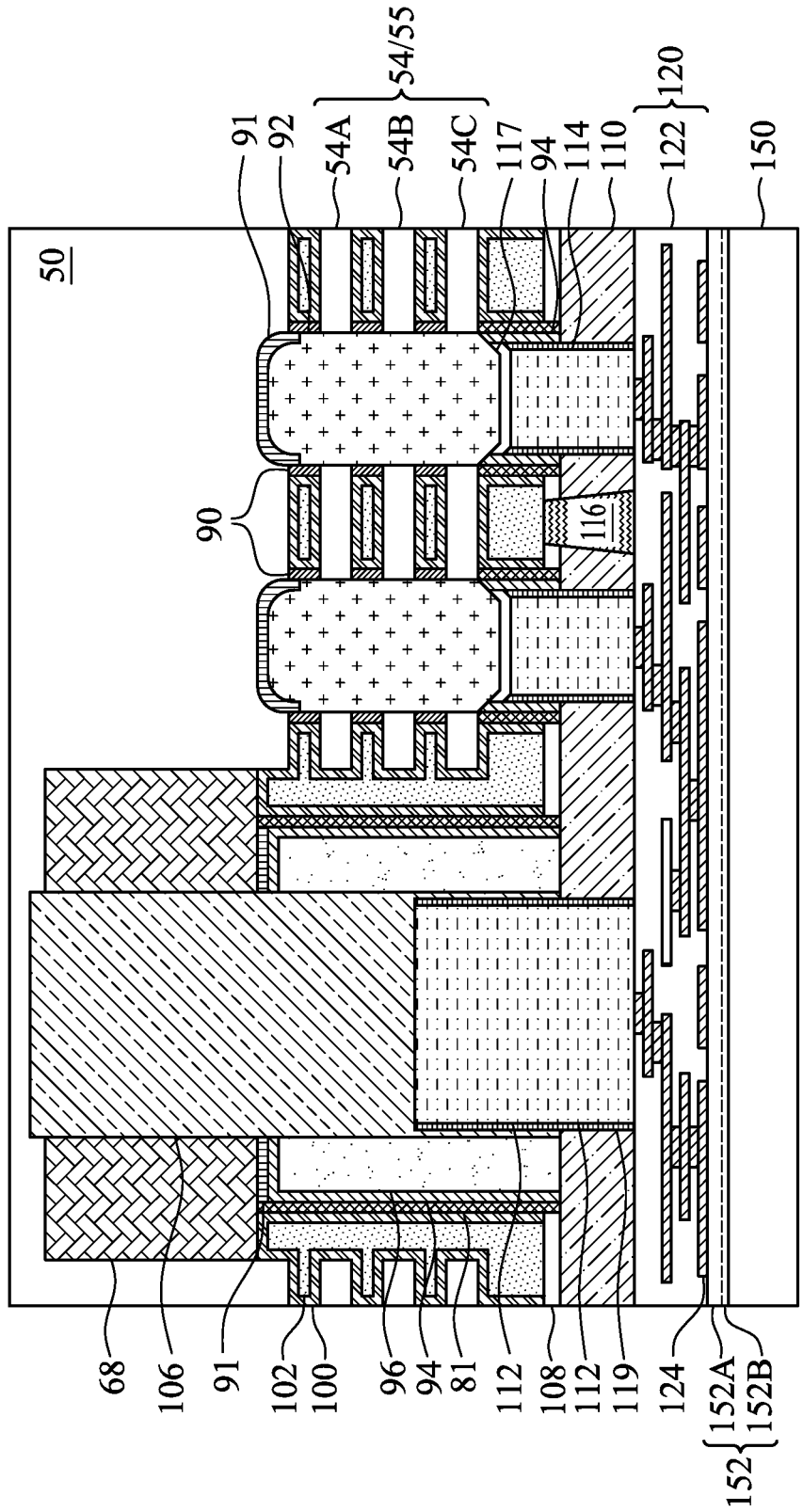
Figure 24B:
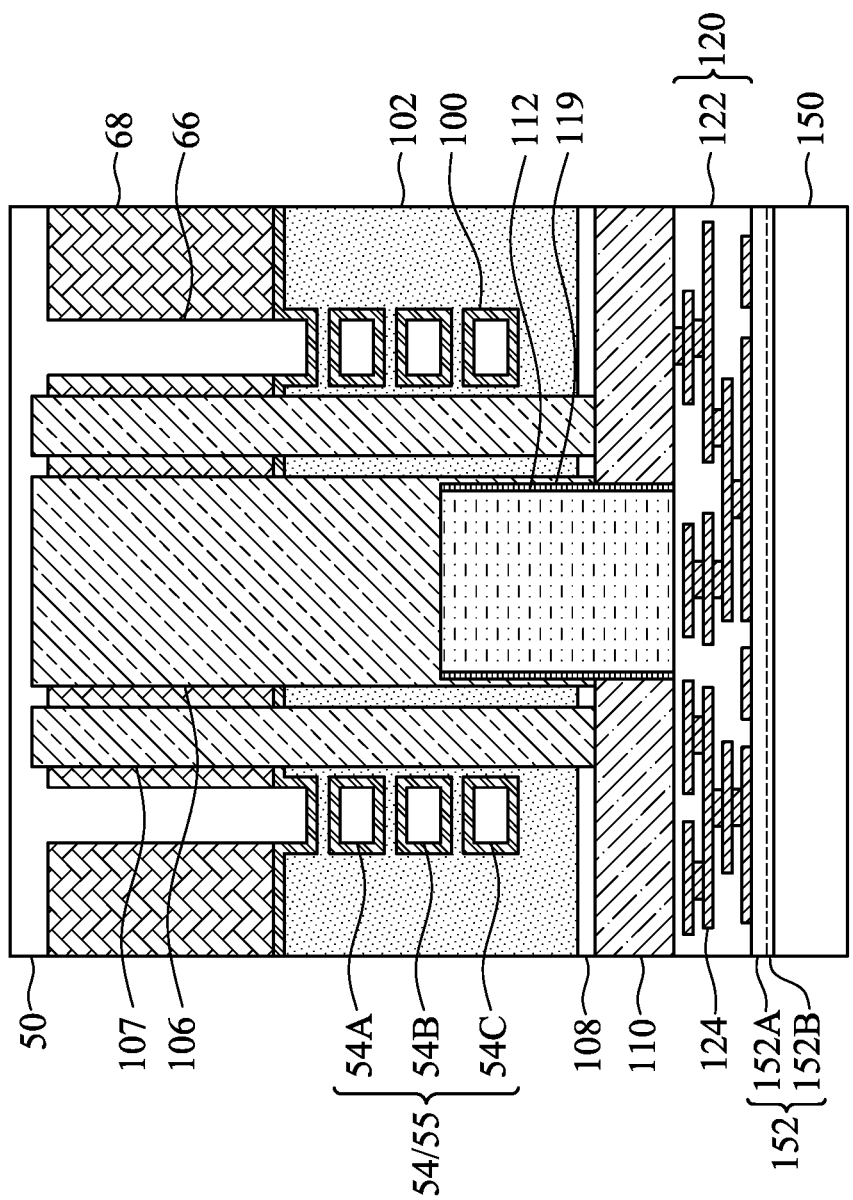
Figure 24C:
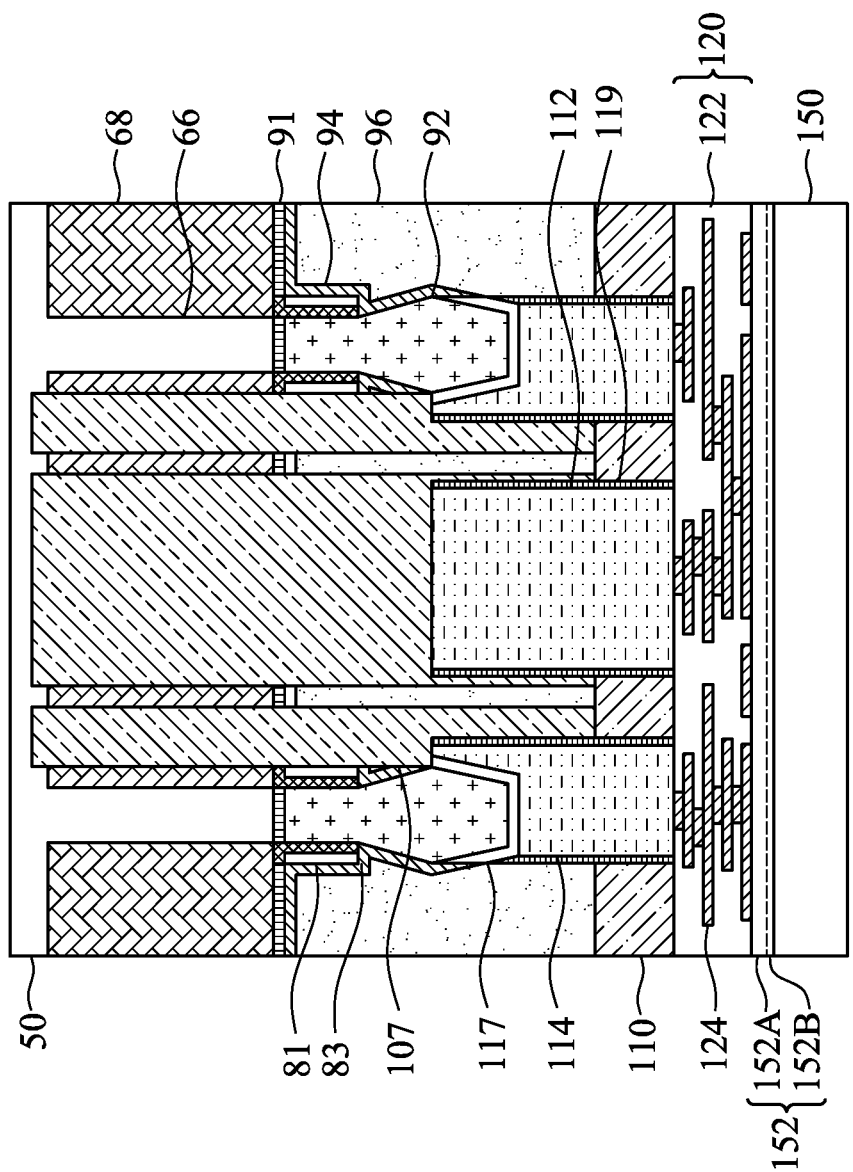
Figure 24D:
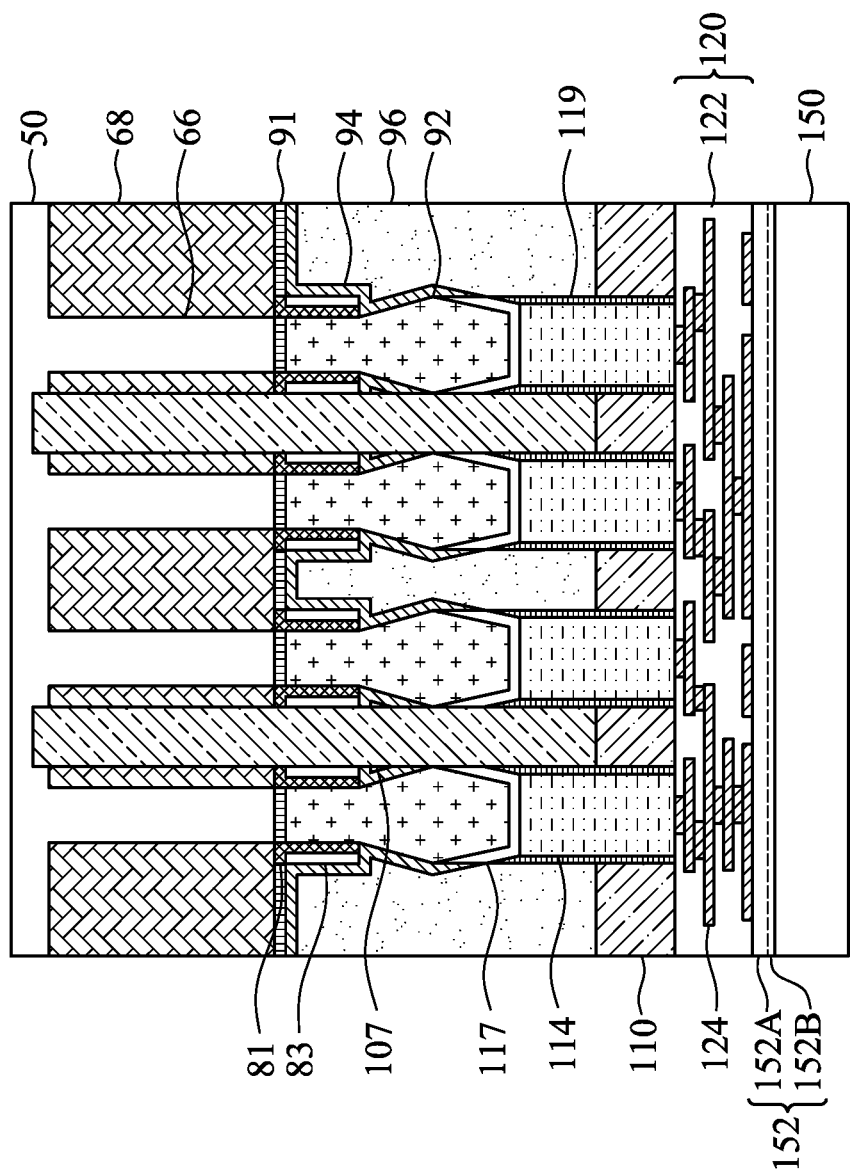
Figure 25A:
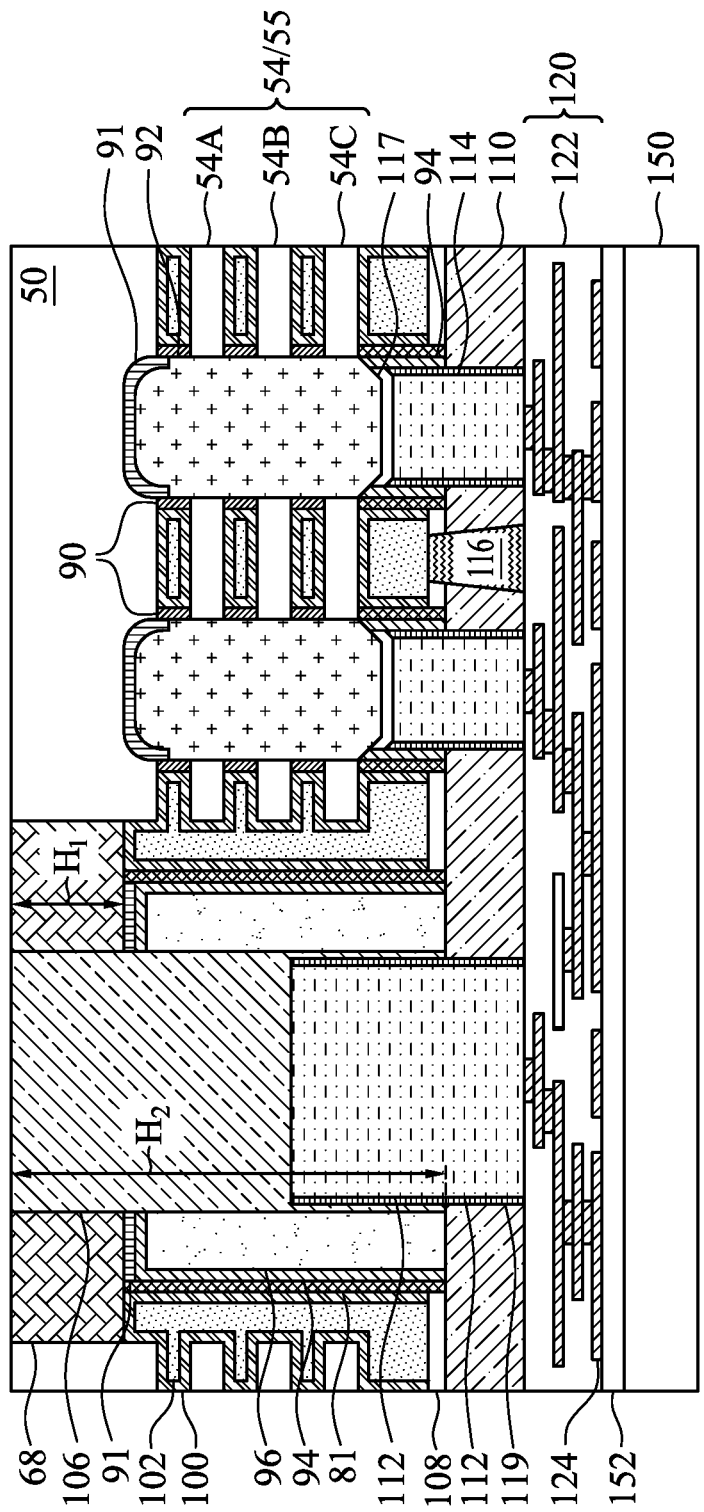
Figure 25B:
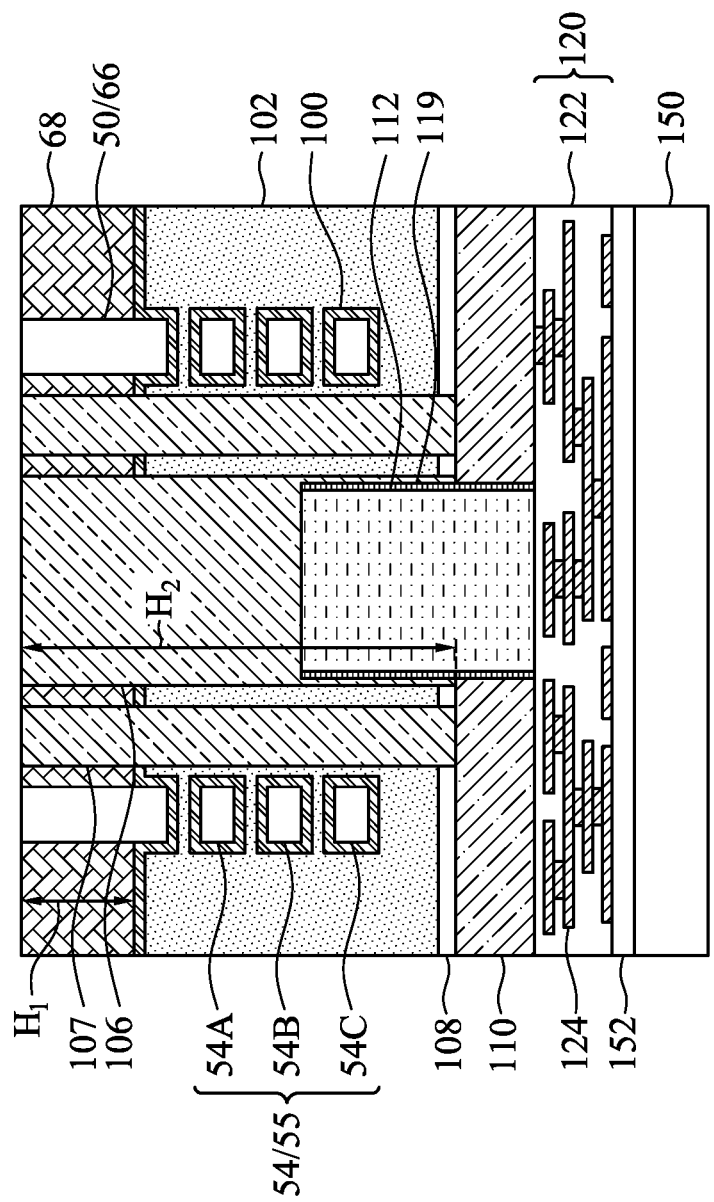
Figure 25C:
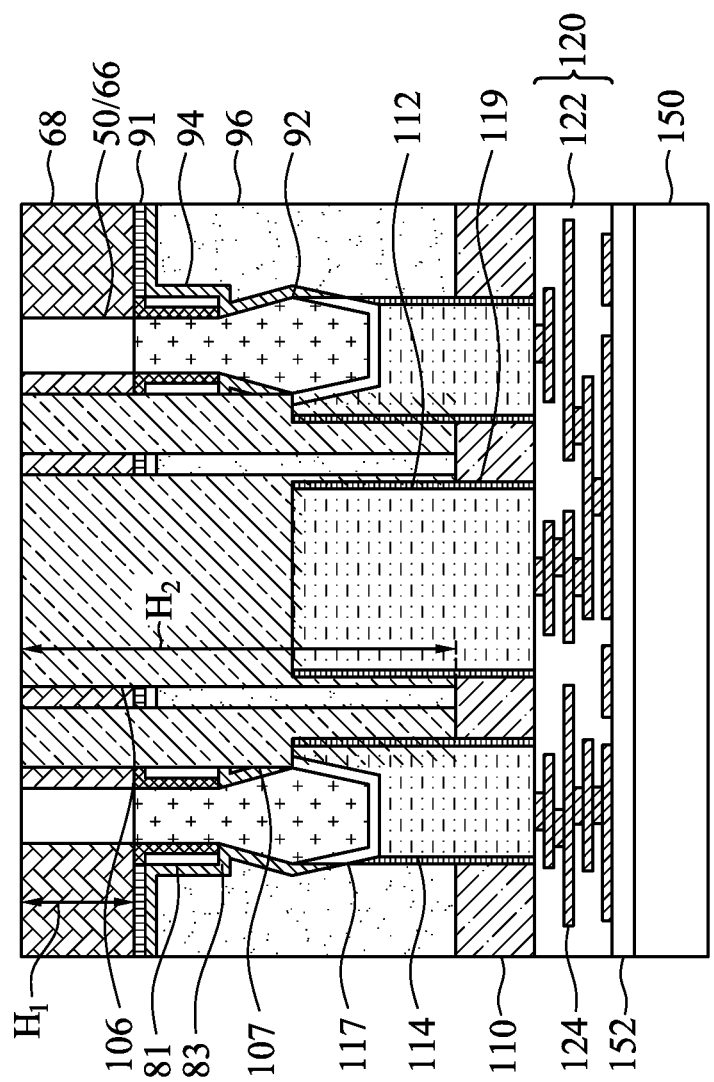
Figure 25D:
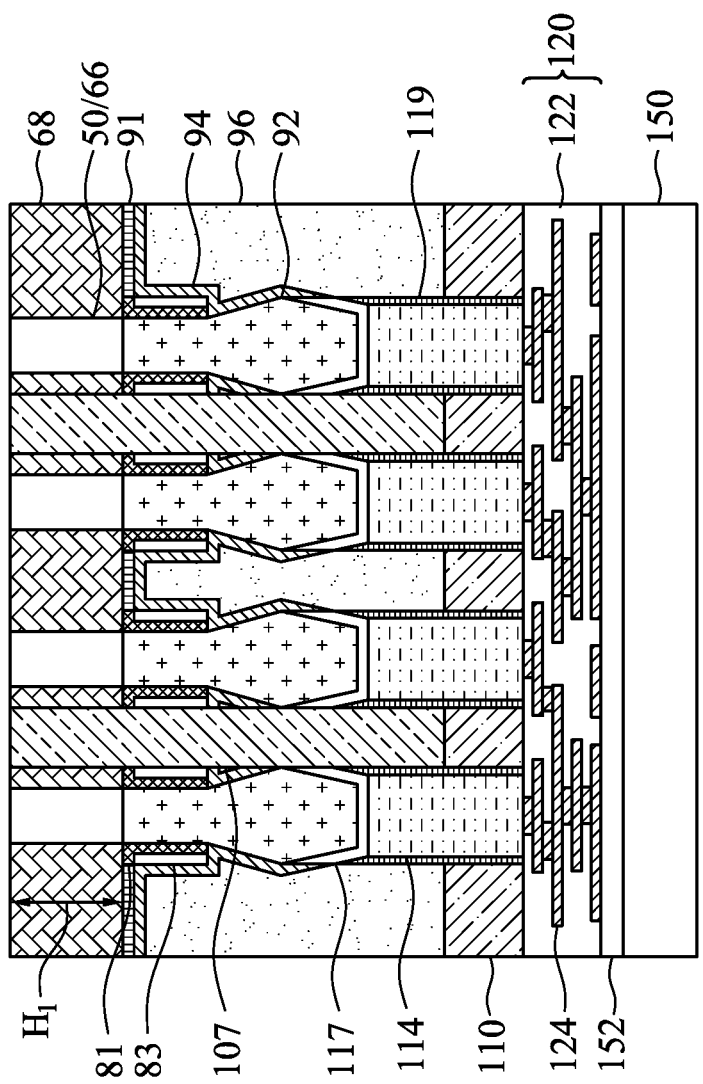
Figure 26A:
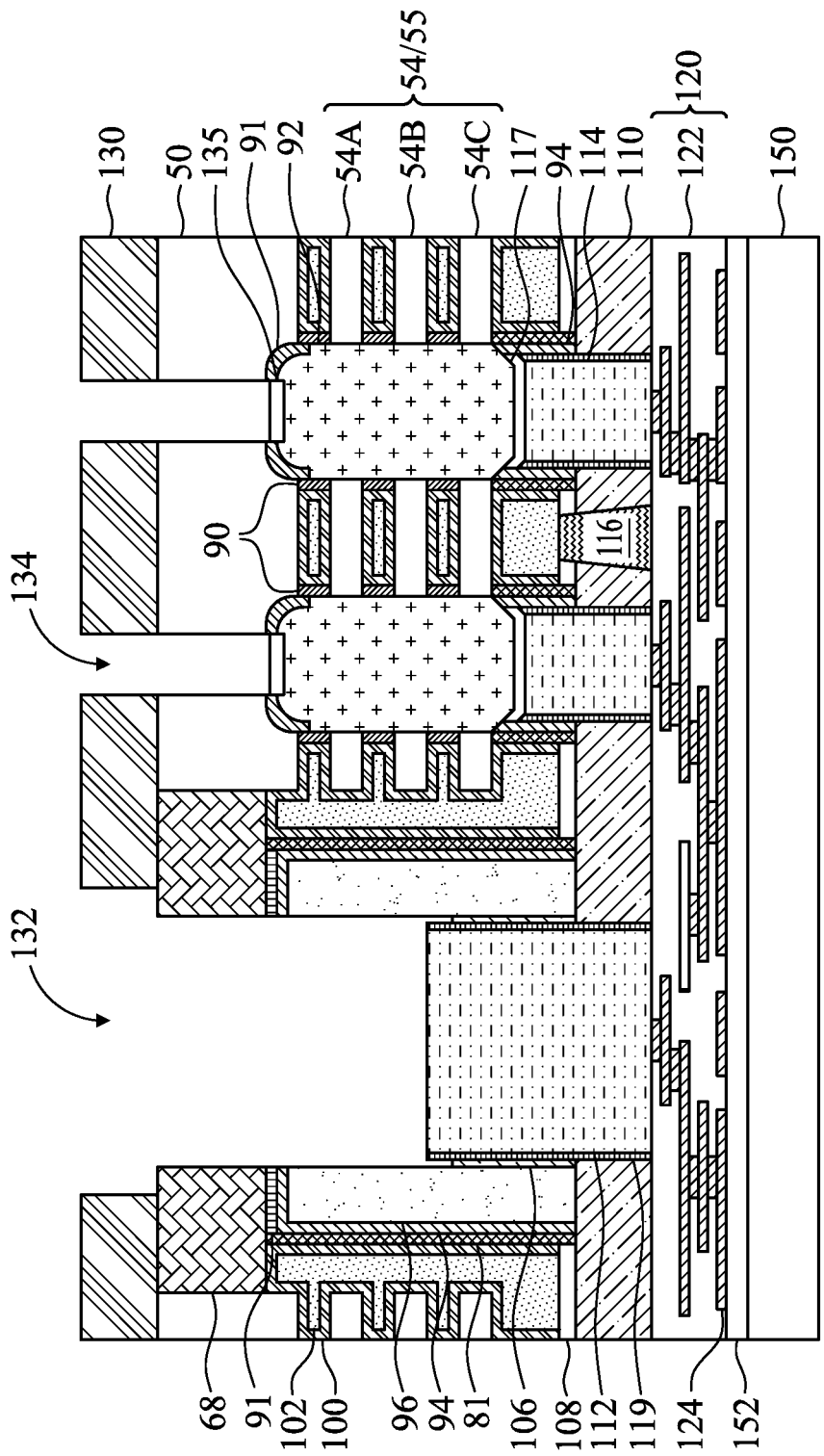
Figure 26B:
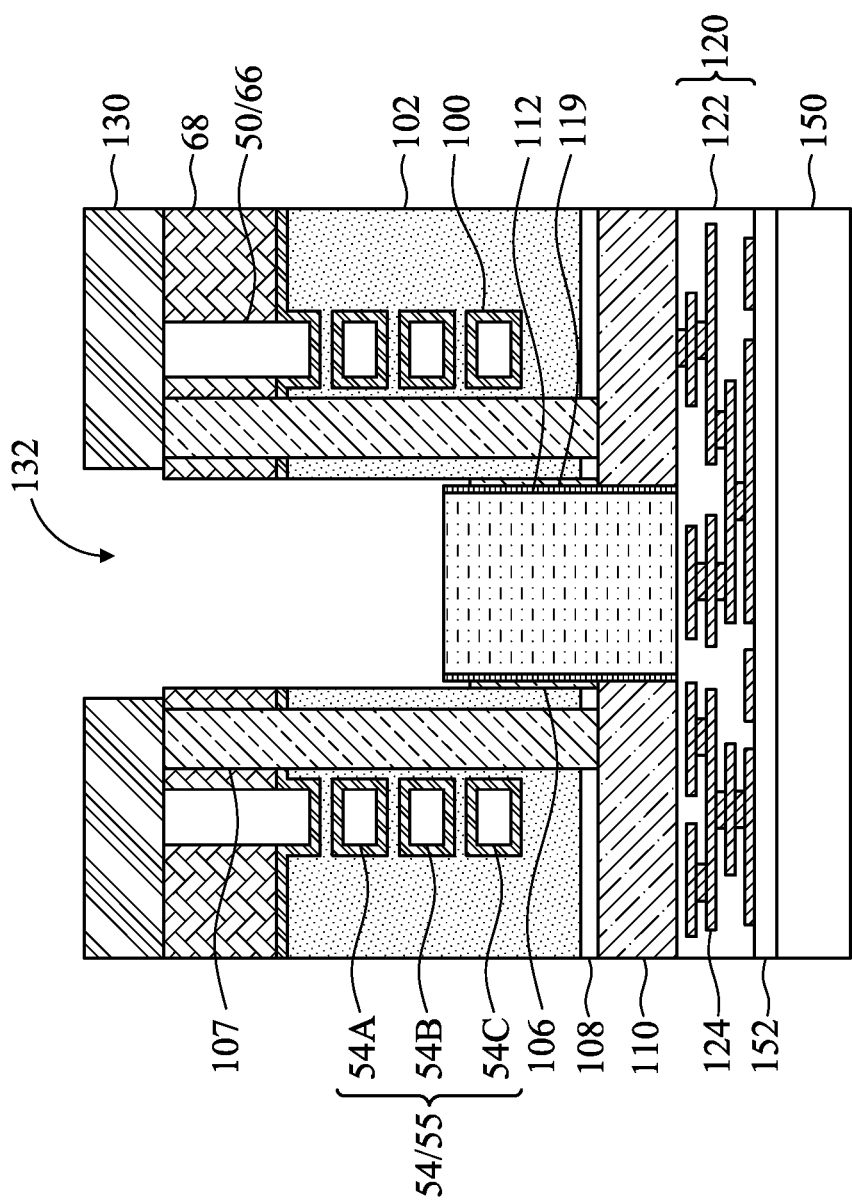
Figure 26C:
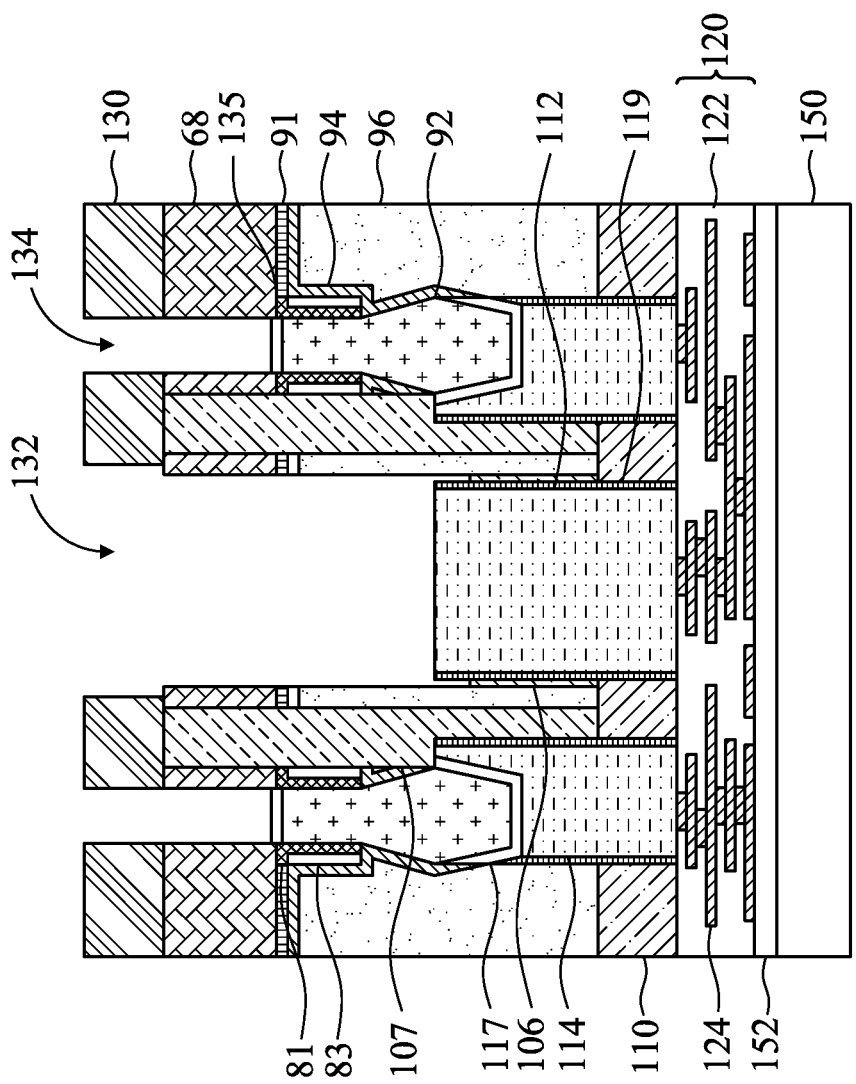
Figure 26D:
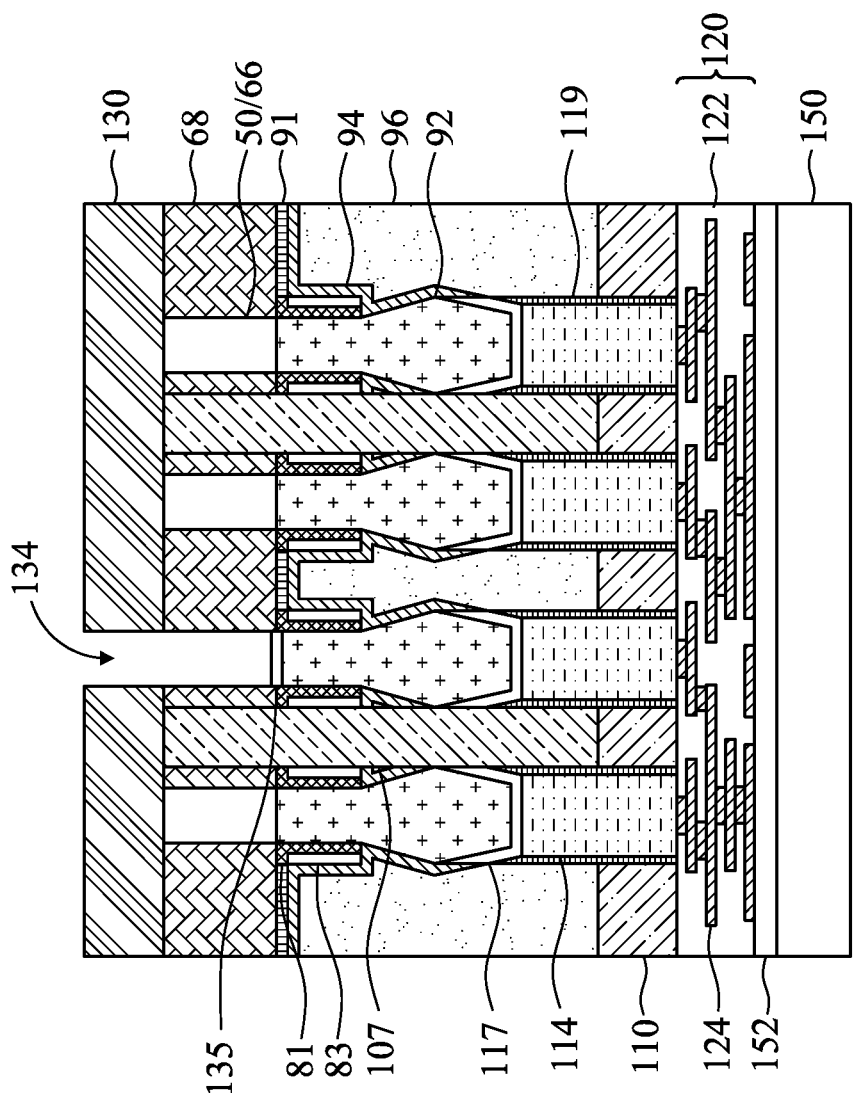
Figure 27A:
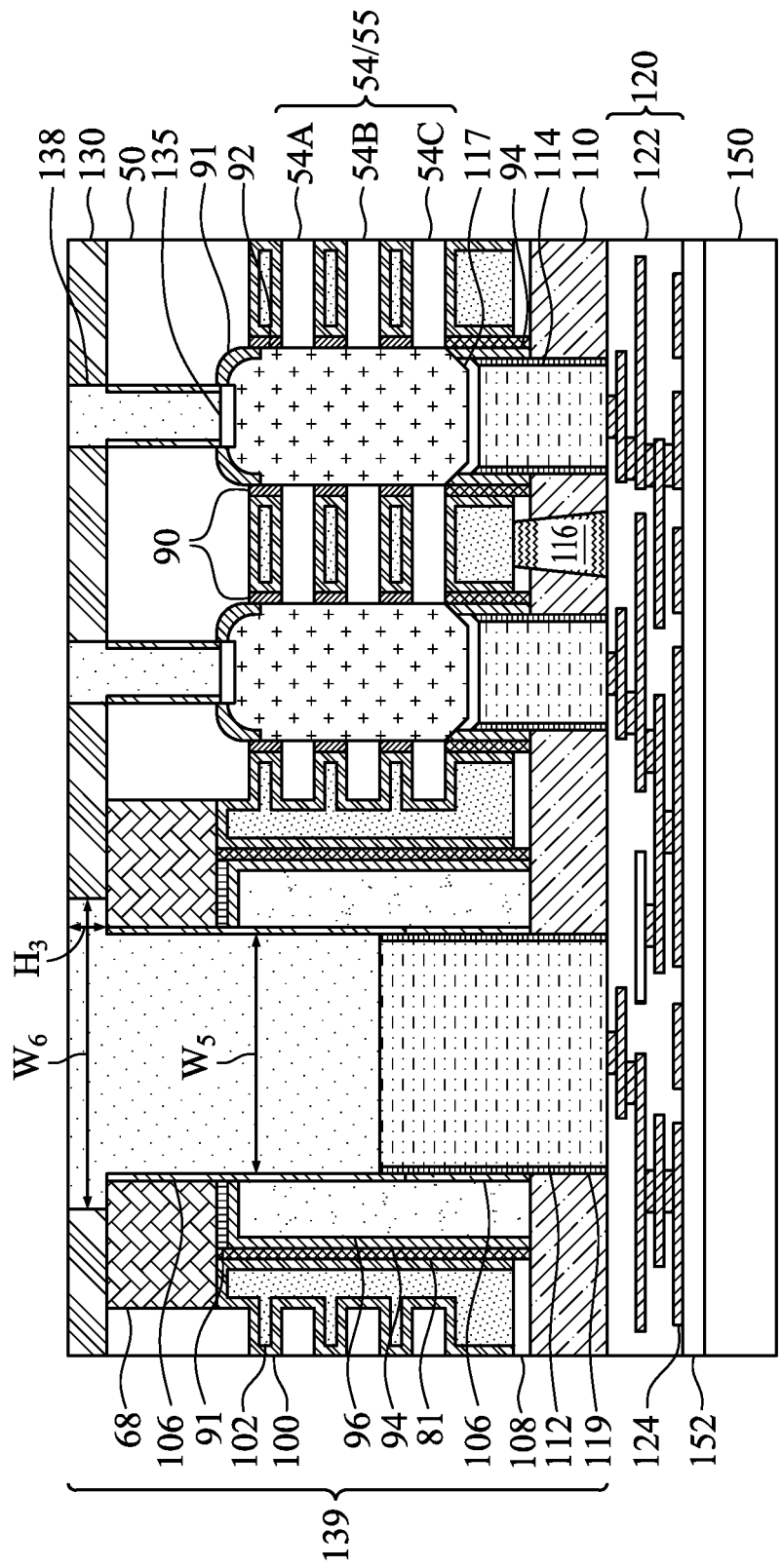
Figure 27B:
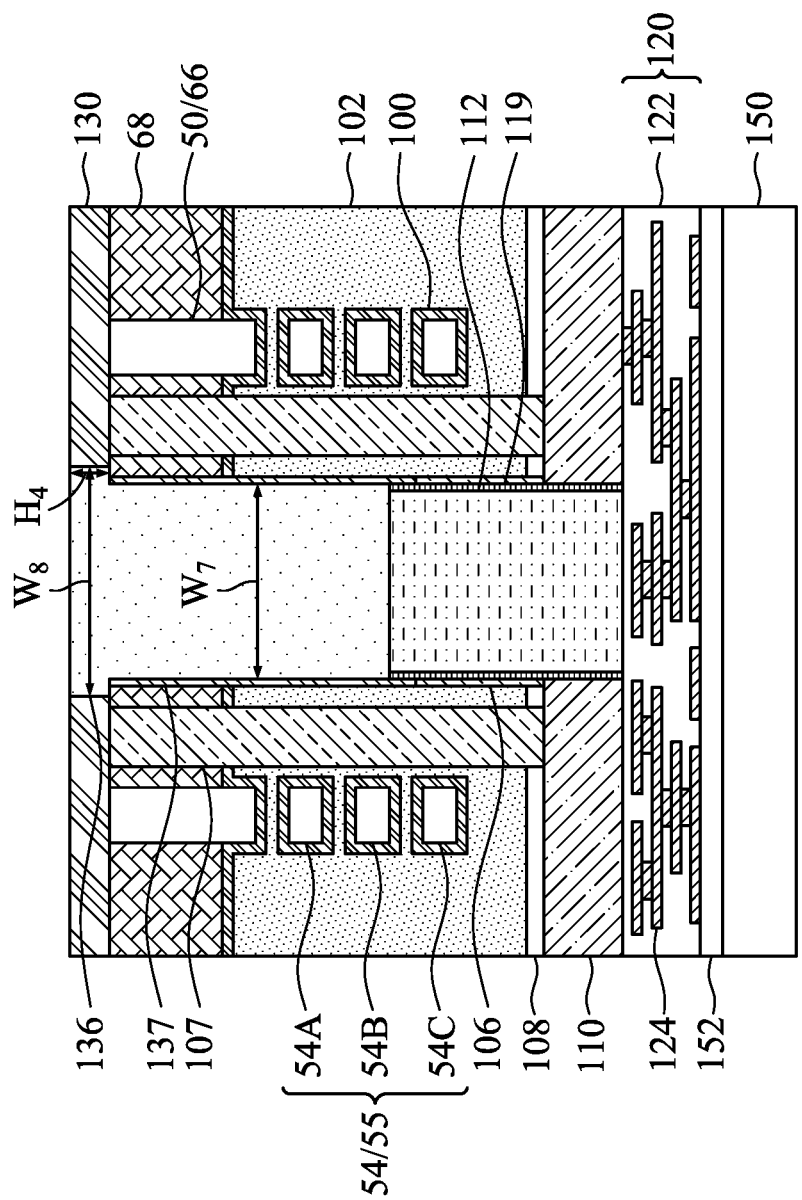
Figure 27C:
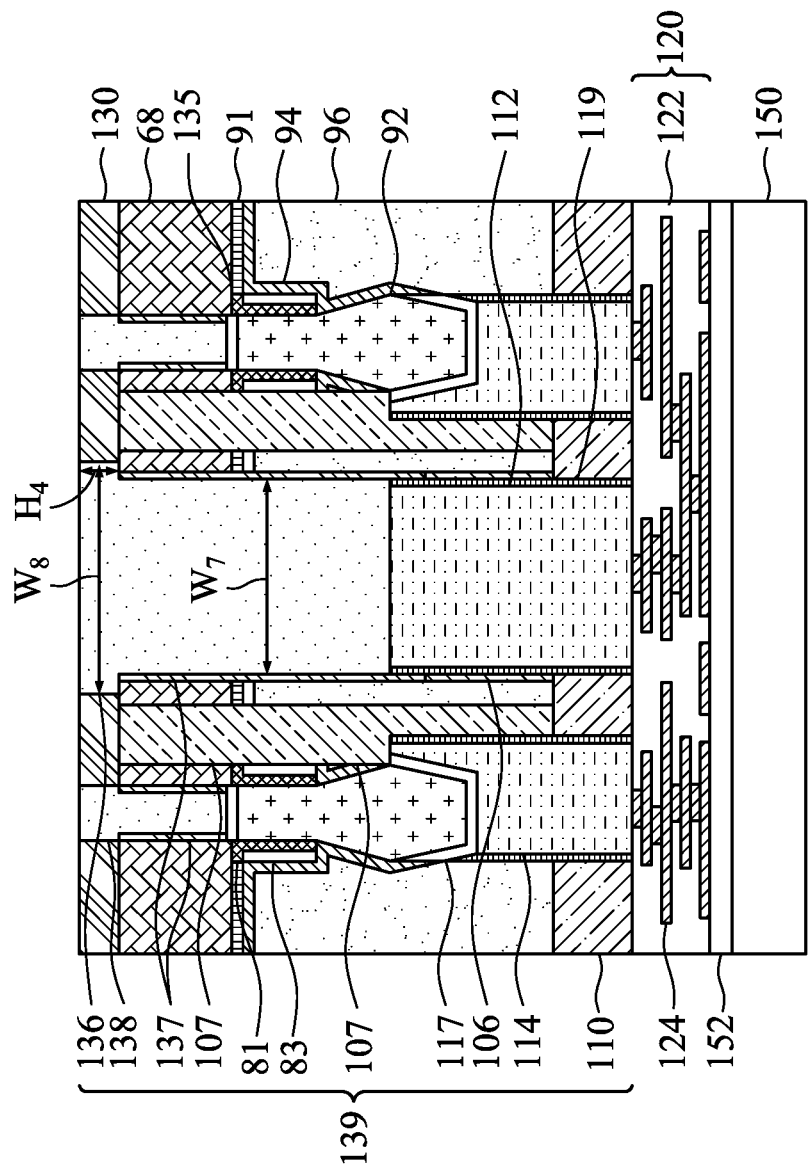
Figure 27D:
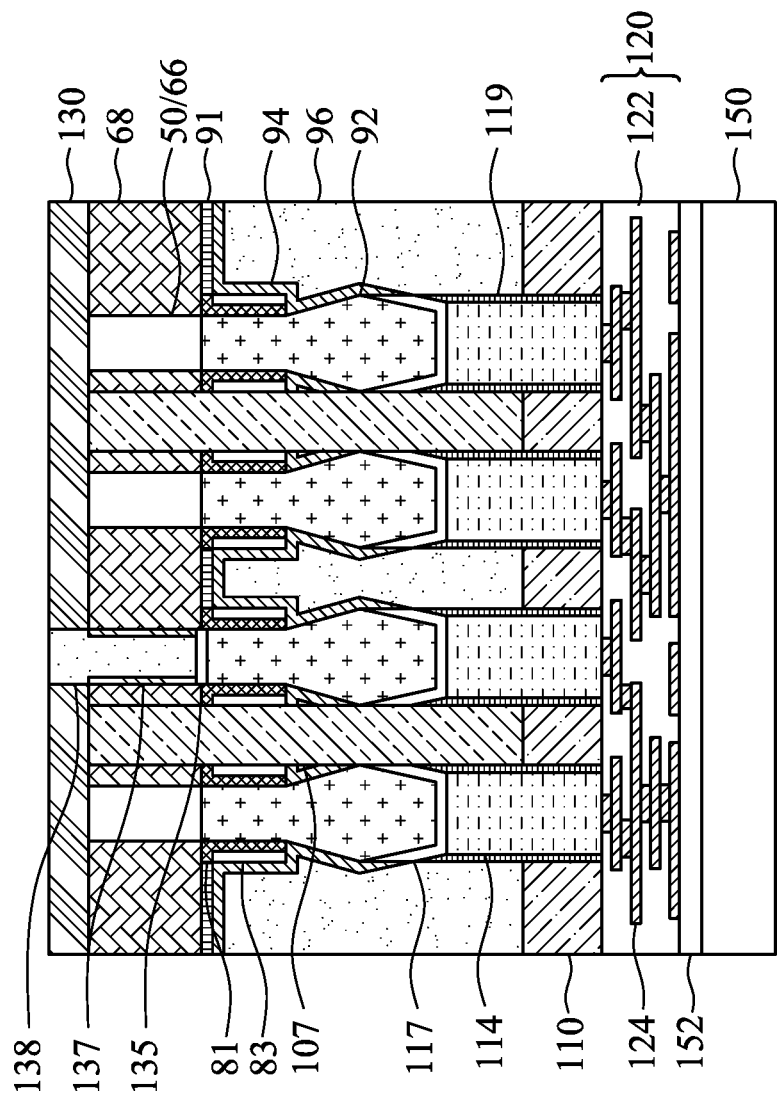
Figure 27E:
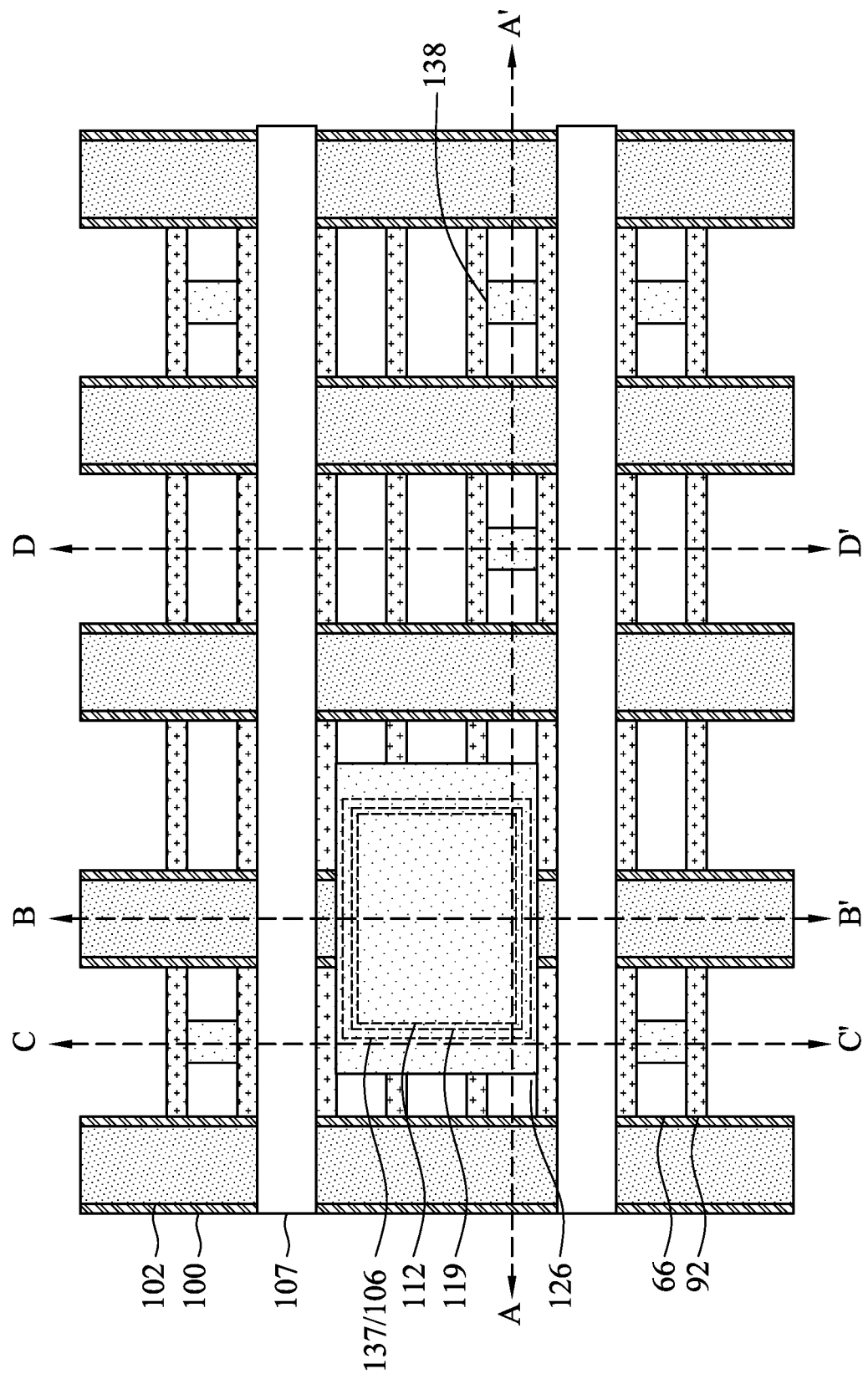
Figure 28A:
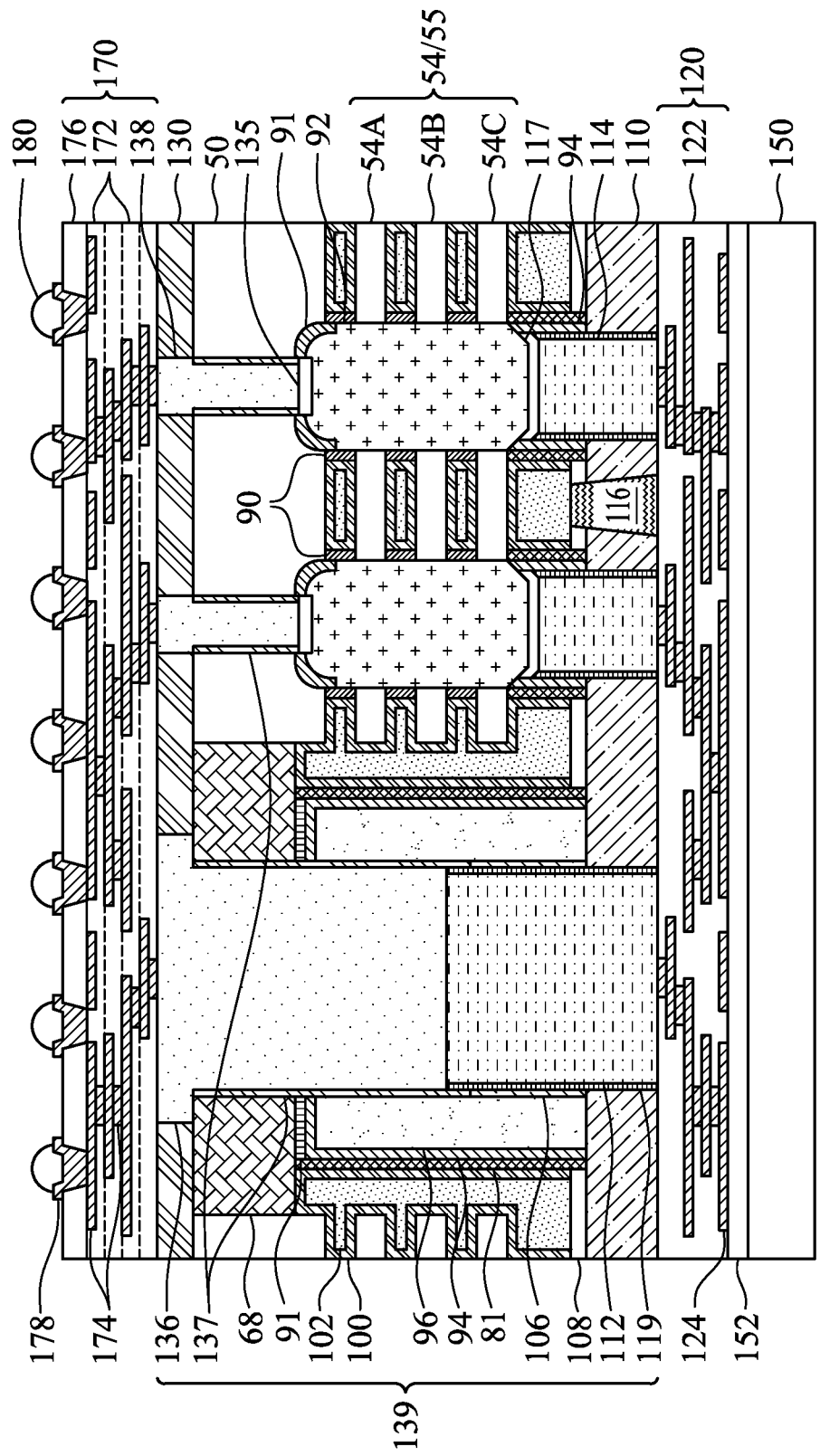
Figure 28B:
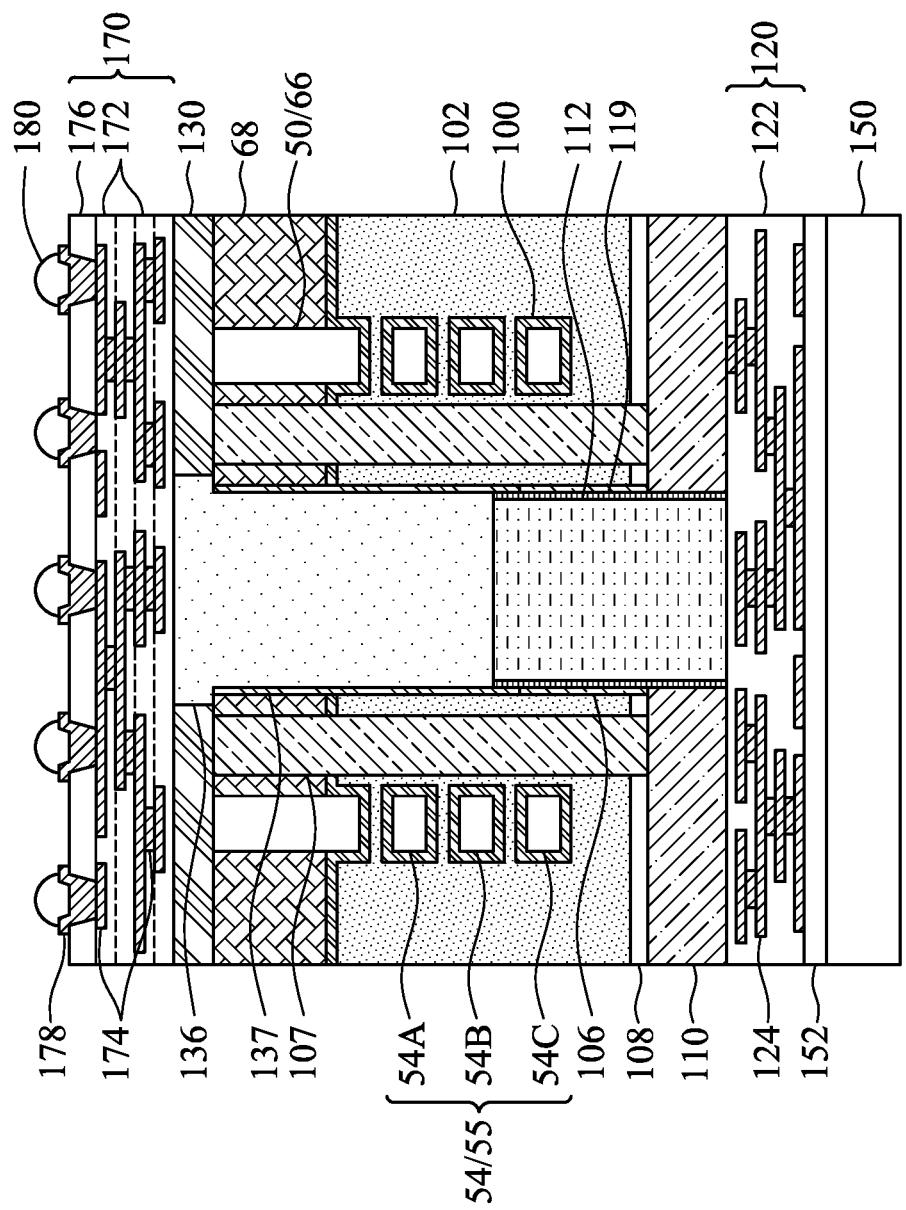
Figure 28C:
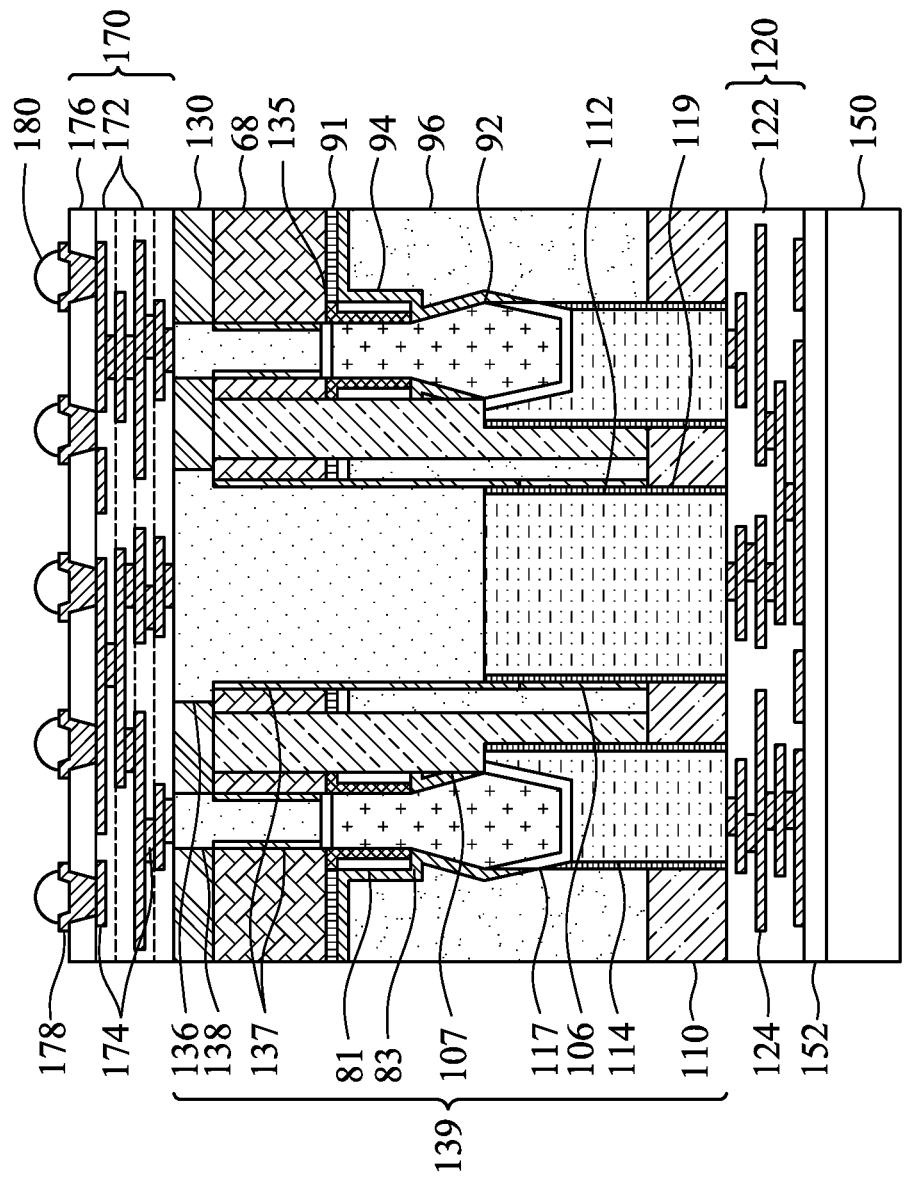
Figure 28D:
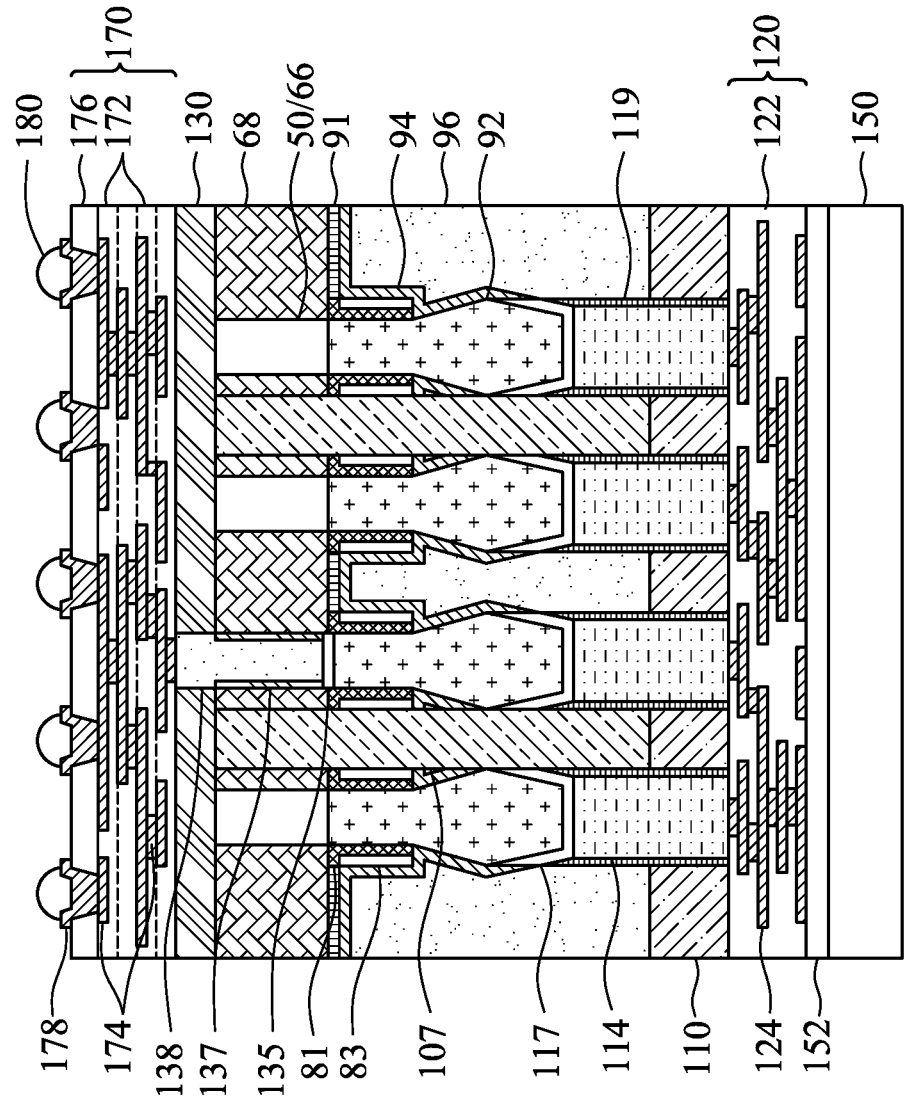

FIGS. 2 through 34 are cross-sectional views of intermediate stages in the manufacturing of nanostructure FETs, in accordance with some embodiments. FIGS. 2, 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29, 30A, 31, 32A, 33A, and 34 illustrate reference cross-section A-A' illustrated in FIG. 1. FIGS. 3B, 4B, 5B, 6B, 7B, 8B, 9B, 10B, 11B, 12B, 13B, 14B, 15B, 16B, 17B, 18B, 19B, 20B, 21B, 22B, 23B, 24B, 25B, 26B, 27B, 28B, 30B, and 32B illustrate reference cross-section B-B' illustrated in FIG. 1. FIGS. 3C, 4C, 5C, 6C, 7C, 8C, 9C, 10C, 11C, 12C, 13C, 14C, 15C, 16C, 17C, 18C, 19C, 20C, 21C, 22C, 23C, 24C, 25C, 26C, 27C, 28C, and 33B illustrate reference cross-section C-C' illustrated in FIG. 1. FIGS. 6D, 7D, 8D, 9D, 10D, 11D, 12D, 12E, 13D, 14D, 15D, 16D, 17D, 18D, 19D, 20D, 21D, 22D, 23D, 24D, 25D, 26D, 27D, and 28D illustrate reference cross-section D-D' illustrated in FIG. 1. FIGS. 22E and 27E illustrate top-down views.

Figure 2:
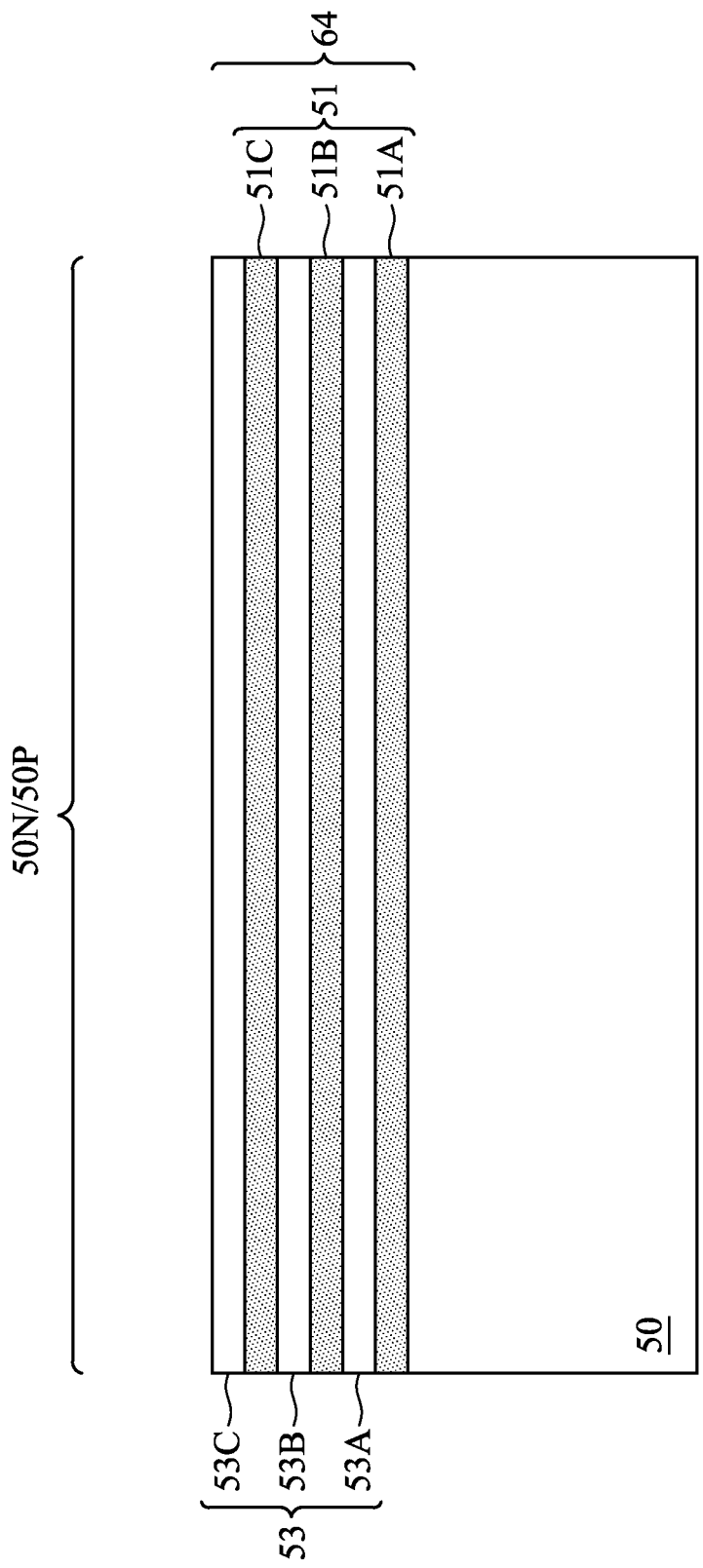
FIGS. 2, 3A, 3B, 3C, 4A, 4B, 4C, 5A, 5B, 5C, 6A, 6B, 6C, 6D, 7A, 7B, 7C, 7D, 8A, 8B, 8C, 8D, 9A, 9B, 9C, 9D, 10A, 10B, 10C, 10D, 11A, 11B, 11C, 11D, 12A, 12B, 12C, 12D, 12E, 13A, 13B, 13C, 13D, 14A, 14B, 14C, 14D, 15A, 15B, 15C, 15D, 16A, 16B, 16C, 16D, 17A, 17B, 17C, 17D, 18A, 18B, 18C, 18D, 19A, 19B, 19C, 19D, 20A, 20B, 20C, 20D, 21A, 21B, 21C, 21D, 22A, 22B, 22C, 22D, 22E, 23A, 23B, 23C, 23D, 24A, 24B, 24C, 24D, 25A, 25B, 25C, 25D, 26A, 26B, 26C, 26D, 27A, 27B, 27C, 27D, 27E, 28A, 28B, 28C, 28D, 29, 30A, 30B, 31, 32A, 32B, 33A, 33B, 34, 35A, 35B, 35C, and 35D are cross-sectional views of intermediate stages in the manufacturing of nanostructure FETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 may include an n-type region 50N and a p-type region 50P. The n-type region 50N can be for forming n-type devices, such as NMOS transistors, e.g., n-type nanostructure FETs, and the p-type region 50P can be for forming p-type devices, such as PMOS transistors, e.g., p-type nanostructure FETs. The n-type region 50N may be physically separated from the p-type region 50P, and any number of device features (e.g., other active devices, doped regions, isolation structures, or the like) may be disposed between the n-type region 50N and the p-type region 50P. Any number of n-type regions 50N and p-type regions 50P may be provided.

Further in FIG. 2, a multi-layer stack 64 is formed on the substrate 50. The multi-layer stack 64 includes alternating layers of first semiconductor layers 51A-51C (collectively referred to as first semiconductor layers 51) and second semiconductor layers 53A-53C (collectively referred to as second semiconductor layers 53). For purposes of illustration and as discussed in greater detail below, the first semiconductor layers 51 will be removed and the second semiconductor layers 53 will be patterned to form channel regions of nanostructure FETs in the n-type region 50N and the p-type region 50P. However, in some embodiments the first semiconductor layers 51 may be removed and the second semiconductor layers 53 may be patterned to form channel regions of nanostructure FETs in the n-type region 50N, and the second semiconductor layers 53 may be removed and the first semiconductor layers 51 may be patterned to form channel regions of nanostructure FETs in the p-type region 50P. In some embodiments the second semiconductor layers 53 may be removed and the first semiconductor layers 51 may be patterned to form channel regions of nanostructure FETs in the n-type region 50N, and the first semiconductor layers 51 may be removed and the second semiconductor layers 53 may be patterned to form channel regions of nanostructure FETs in the p-type region 50P. In some embodiments, the second semiconductor layers 53 may be removed and the first semiconductor layers 51 may be patterned to form channel regions of nanostructure FETs in both the n-type region 50N and the p-type region 50P.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In some embodiments, the first semiconductor layers 51 may be formed of a first semiconductor material such as silicon germanium, or the like, and the second semiconductor layers 53 may be formed of a second semiconductor material such as silicon, silicon carbon, or the like. The multi-layer stack 64 is illustrated as having a bottommost first semiconductor layer 51 formed of the first semiconductor material for illustrative purposes. In some embodiments, multi-layer stack 64 may be formed having a bottommost second semiconductor layer 53 formed of the second semiconductor material.

The first semiconductor materials and the second semiconductor materials may be materials having a high etch selectivity to one another. As such, the first semiconductor layers 51 of the first semiconductor material may be removed without significantly removing the second semiconductor layers 53 of the second semiconductor material thereby allowing the second semiconductor layers 53 to be patterned to form channel regions of resulting nanostructure FETs. Similarly, in embodiments in which the second semiconductor layers 53 are removed and the first semiconductor layers 51 are patterned to form channel regions, the second semiconductor layers 53 of the second semiconductor material may be removed without significantly removing the first semiconductor layers 51 of the first semiconductor material, thereby allowing the first semiconductor layers 51 to be patterned to form channel regions of resulting nanostructure FETs.

Figure 3A:
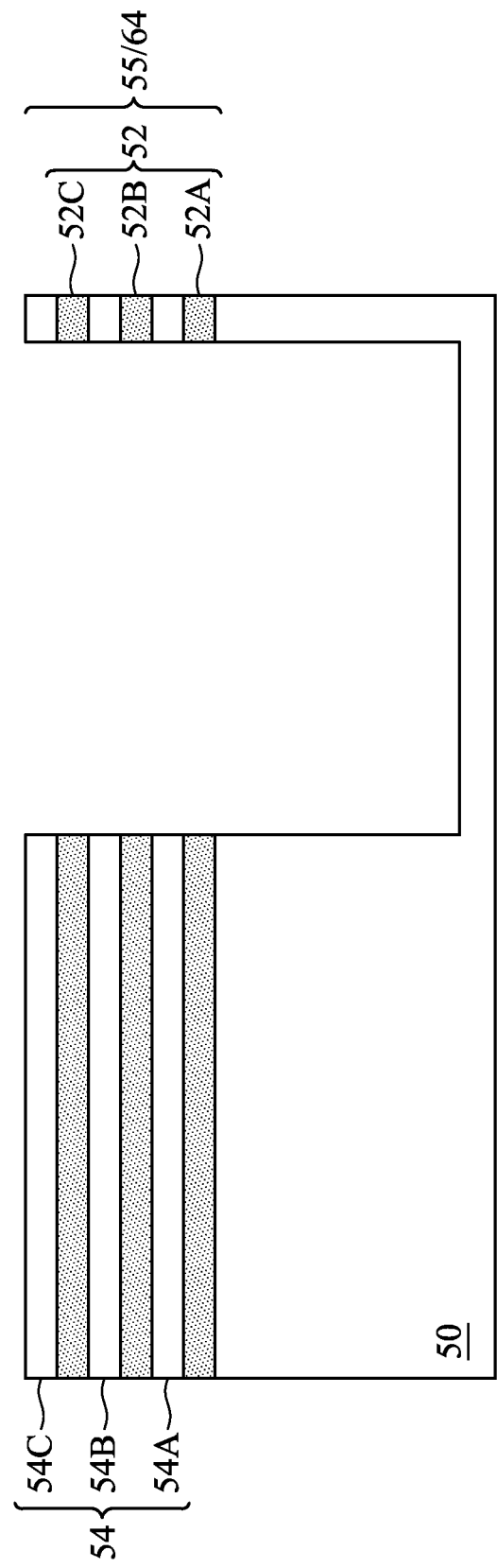
Figure 3B:
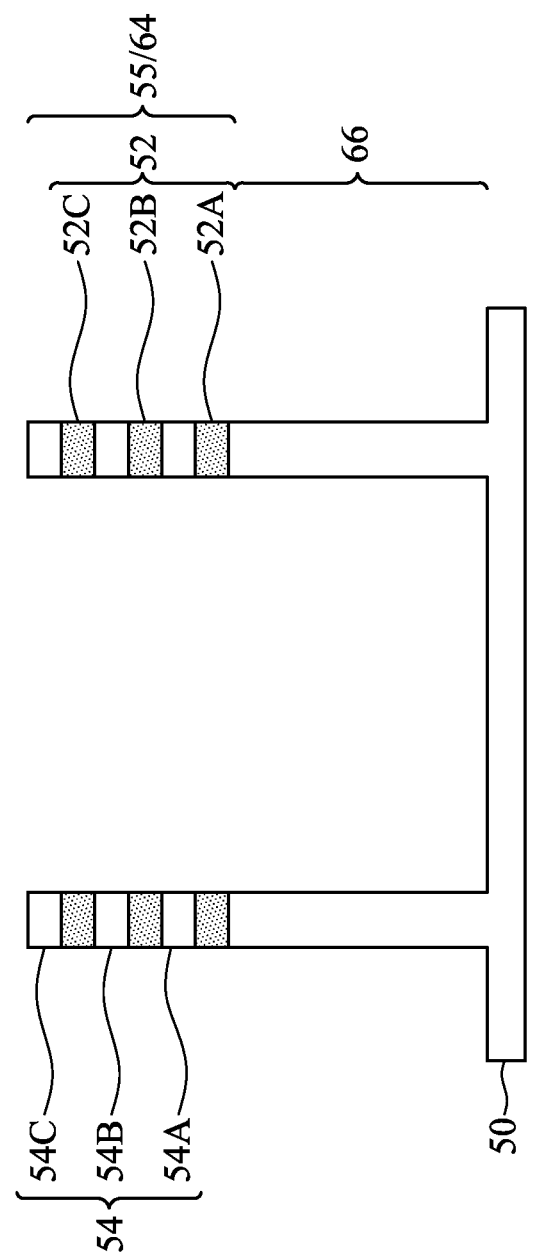
Figure 3C:
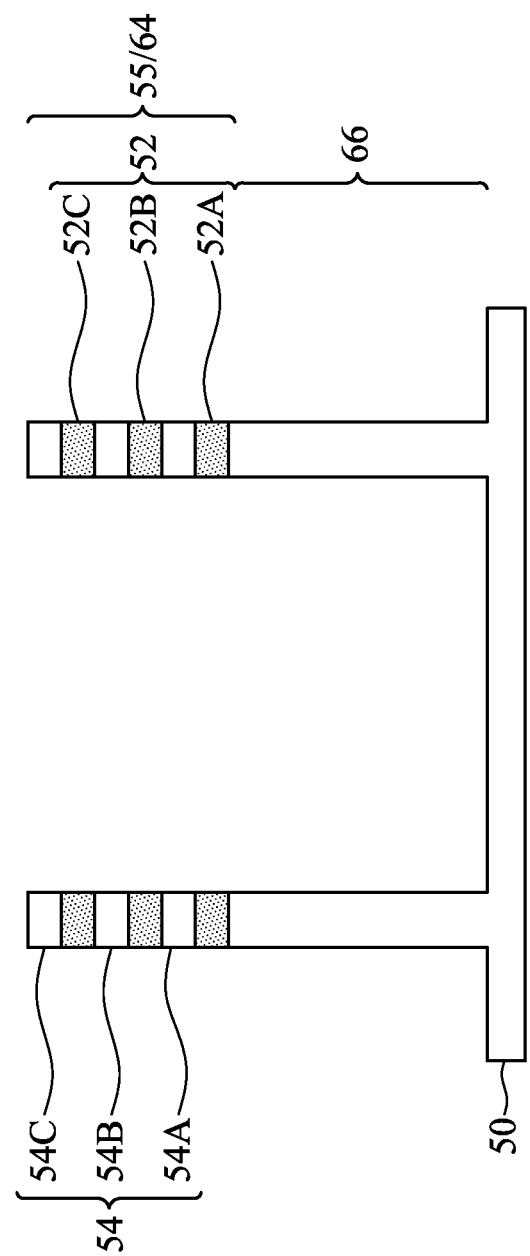

In FIGS. 3A through 3C, fins 66 are formed in the substrate 50 and nanostructures 55 are formed in the multi-layer stack 64. In some embodiments, the nanostructures 55 may be formed in the multi-layer stack 64, and the fins 66 may be formed in the substrate 50 by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-52C (collectively referred to as the first nanostructures 52) from the first semiconductor layers 51 and define second nanostructures 54A-54C (collectively referred to as the second nanostructures 54) from the second semiconductor layers 53. The first nanostructures 52 and the second nanostructures 54 may further be collectively referred to as nanostructures 55. As illustrated in FIG. 3A, the multi-layer stack 64 and the substrate 50 may be further patterned to define recesses in which shallow trench isolation regions will be subsequently formed.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed on a substrate and patterned using a photolithography process. Spacers are formed alongside the patterned sacrificial layer using a self-aligned process. The sacrificial layer is then removed, and the remaining spacers may then be used to pattern the fins 66.

The fins 66 and the nanostructures 55 in the n-type region and the p-type region may have substantially equal widths. In some embodiments, widths of the fins 66 and the nanostructures 55 in the n-type region may be greater or thinner than the fins 66 and the nanostructures 55 in the p-type region. Further, while each of the fins 66 and the nanostructures 55 are illustrated as having consistent widths throughout, in some embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and may be trapezoidal in shape.

Figure 4A:
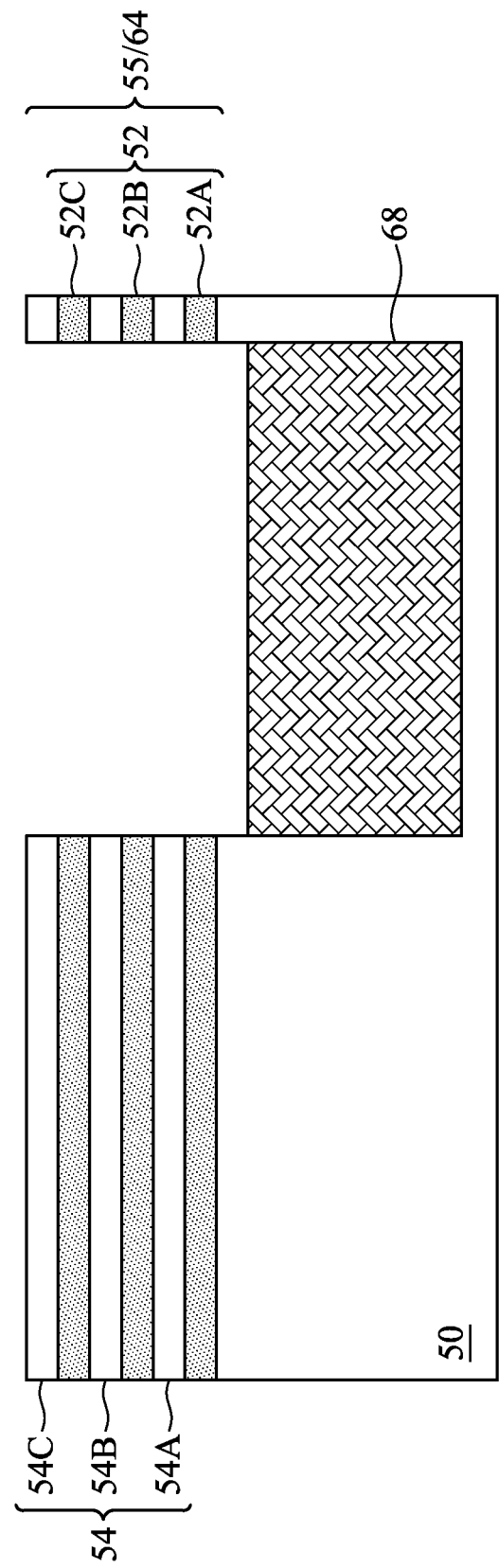
Figure 4B:
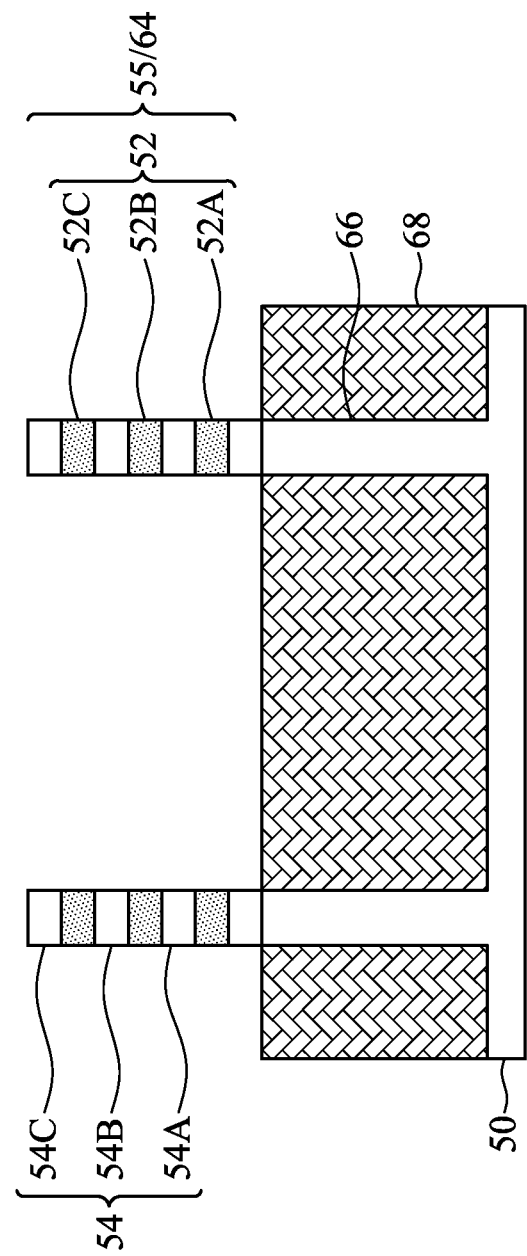
Figure 4C:
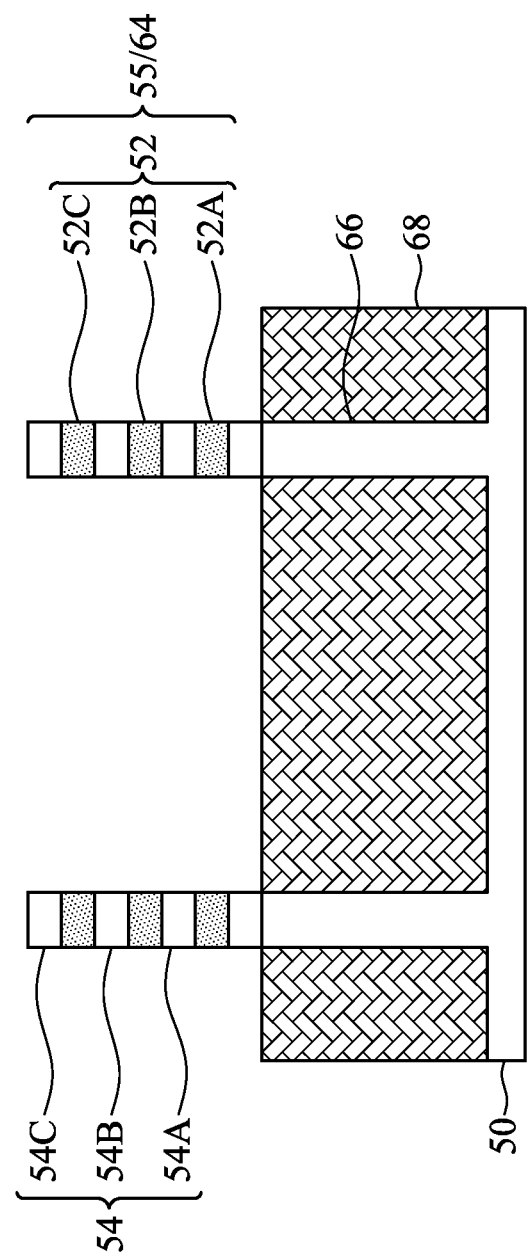

In FIGS. 4A through 4C, shallow trench isolation (STI) regions 68 are formed adjacent the fins 66. The STI regions 68 may be formed by depositing an insulation material on the substrate 50, the fins 66, and the nanostructures 55, and between adjacent fins 66 and nanostructures 55. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In some embodiments, the insulation material is formed such that excess insulation material covers the fins 66 and the nanostructures 55. Although the insulation material is illustrated as a single layer, some embodiments may utilize multiple layers. For example, in some embodiments a liner (not separately illustrated) may first be formed along surfaces of the substrate 50, the fins 66, and the nanostructures 55. Thereafter, a fill material, such as those discussed above, may be formed on the liner.

A removal process is applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is recessed to form the STI regions 68. The insulation material is recessed such that the nanostructures 55 and upper portions of the fins 66 protrude from between neighboring STI regions 68. The top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4C is just one example of how the fins 66 and the nanostructures 55 may be formed. In some embodiments, the fins 66 and/or the nanostructures 55 may be formed using a mask and an epitaxial growth process. For example, a dielectric layer can be formed on a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region and the n-type region for illustrative purposes only. As such, in some embodiments one or both of the first semiconductor layers 51 and the second semiconductor layers 53 may be different materials or formed in a different order in the p-type region and the n-type region.

Further in FIGS. 4A through 4C, appropriate wells (not separately illustrated) may be formed in the fins 66, the nanostructures 55, and/or the STI regions 68. In embodiments with different well types, different implant steps for the n-type region and the p-type region may be achieved using a photoresist or other masks (not separately illustrated). For example, a photoresist may be formed on the fins 66 and the STI regions 68 in the n-type region and the p-type region. The photoresist is patterned to expose the p-type region. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region, a photoresist or other masks (not separately illustrated) is formed on the fins 66, the nanostructures 55, and the STI regions 68 in the p-type region and the n-type region. The photoresist is patterned to expose the n-type region. The photoresist can be formed by using a spin-on technique and can be patterned using acceptable photolithography techniques. Once the photoresist is patterned, a p-type impurity implant may be performed in the n-type region, and the photoresist may act as a mask to substantially prevent p-type impurities from being implanted into the p-type region. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region and the p-type region, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5A:
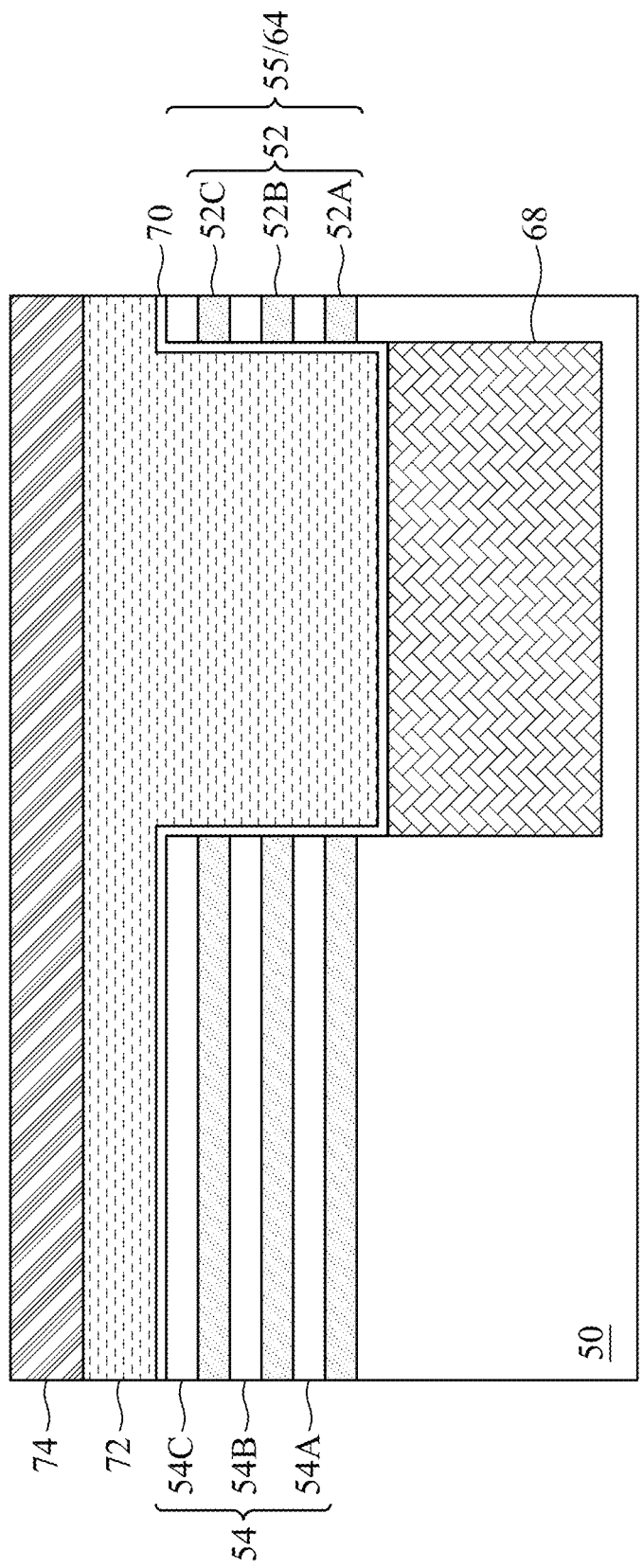
Figure 5B:
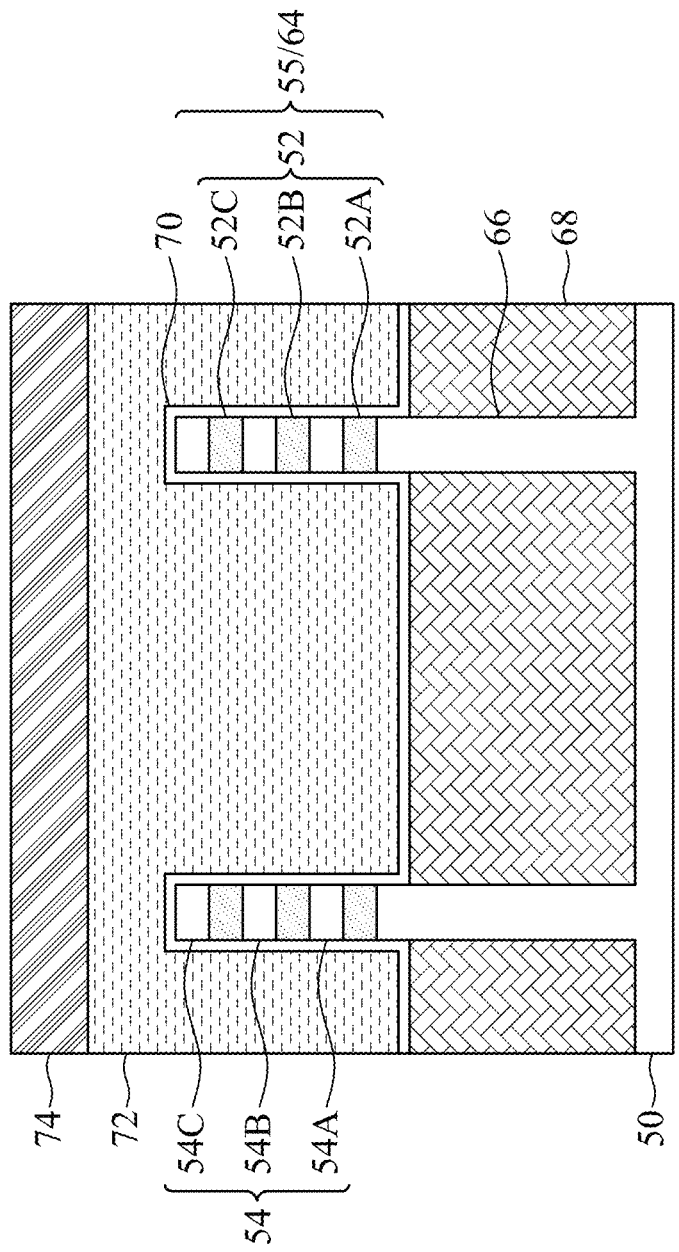
Figure 5C:
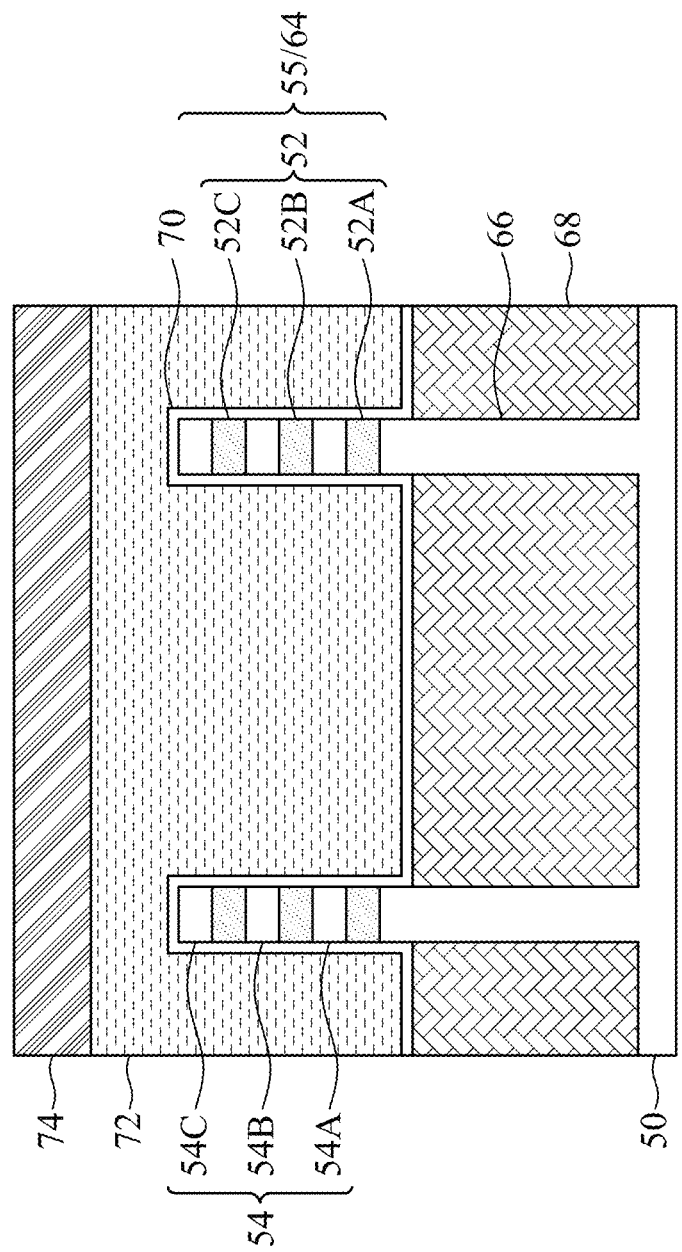
Figure 6A:
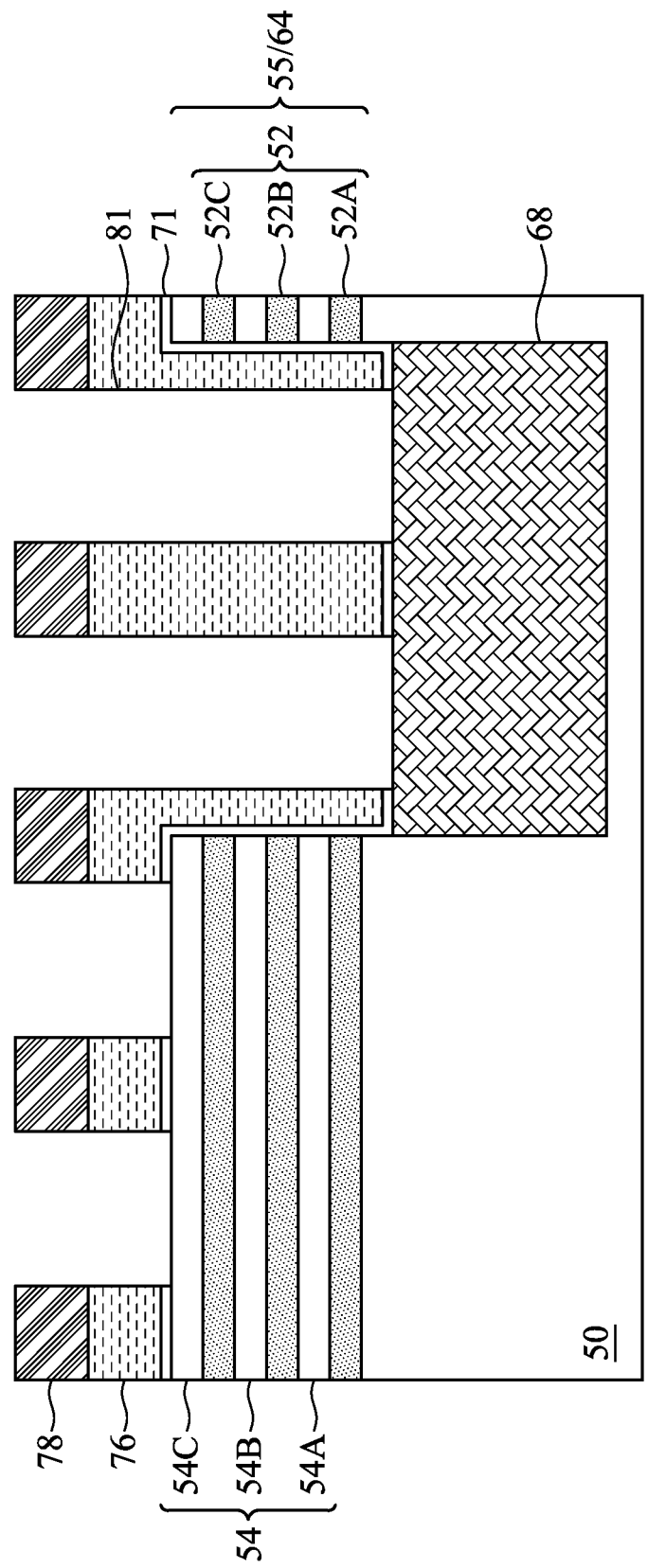
Figure 6B:
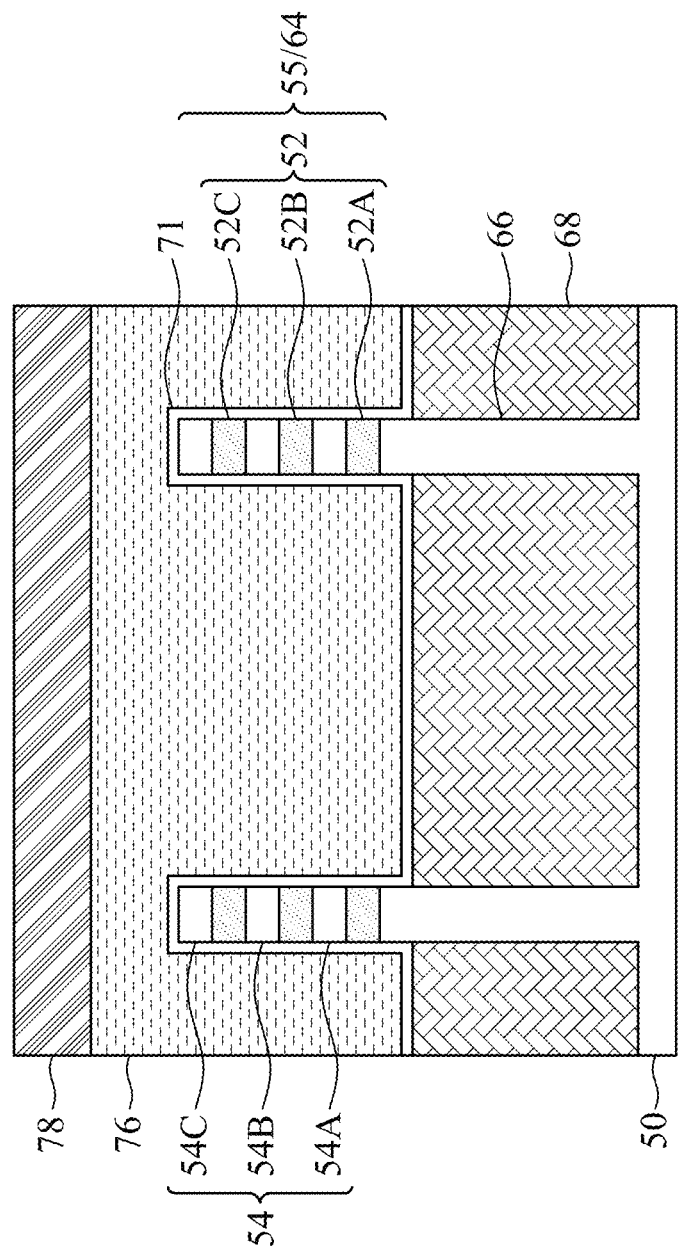
Figure 6C:
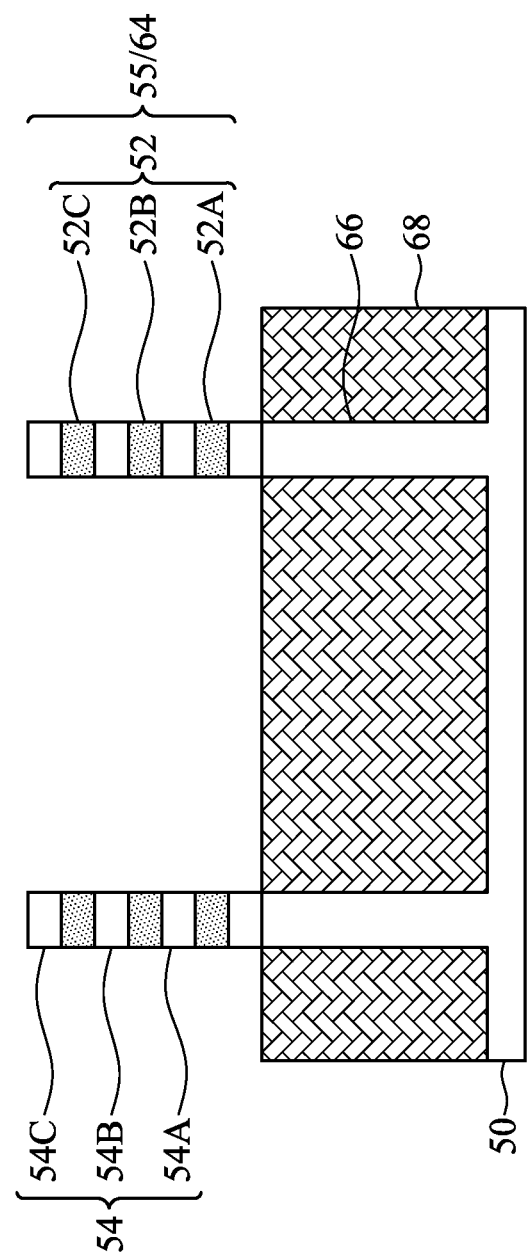
Figure 6D:
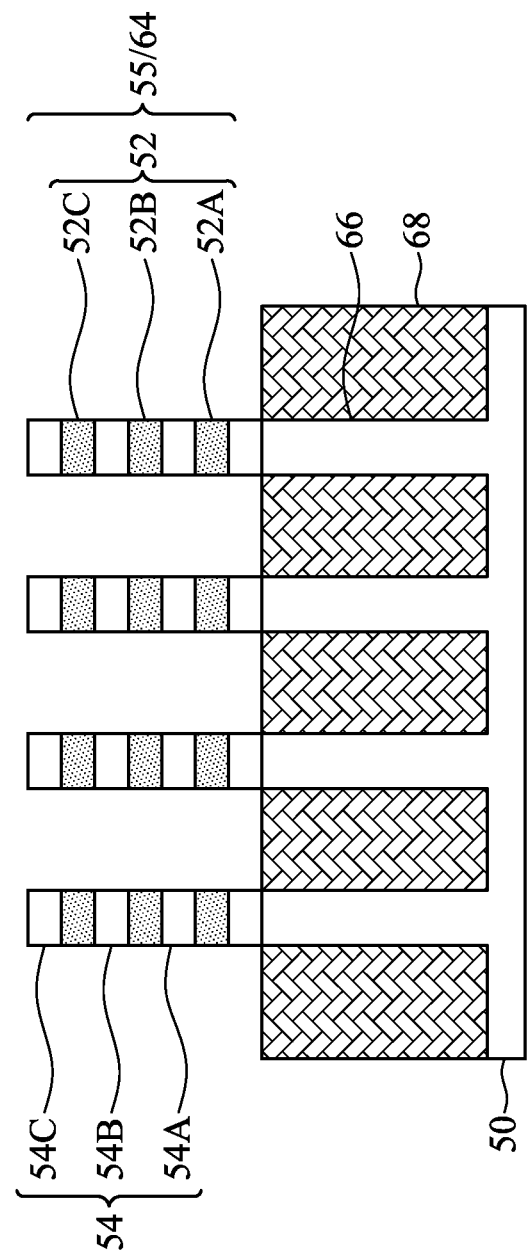
Figure 7A:
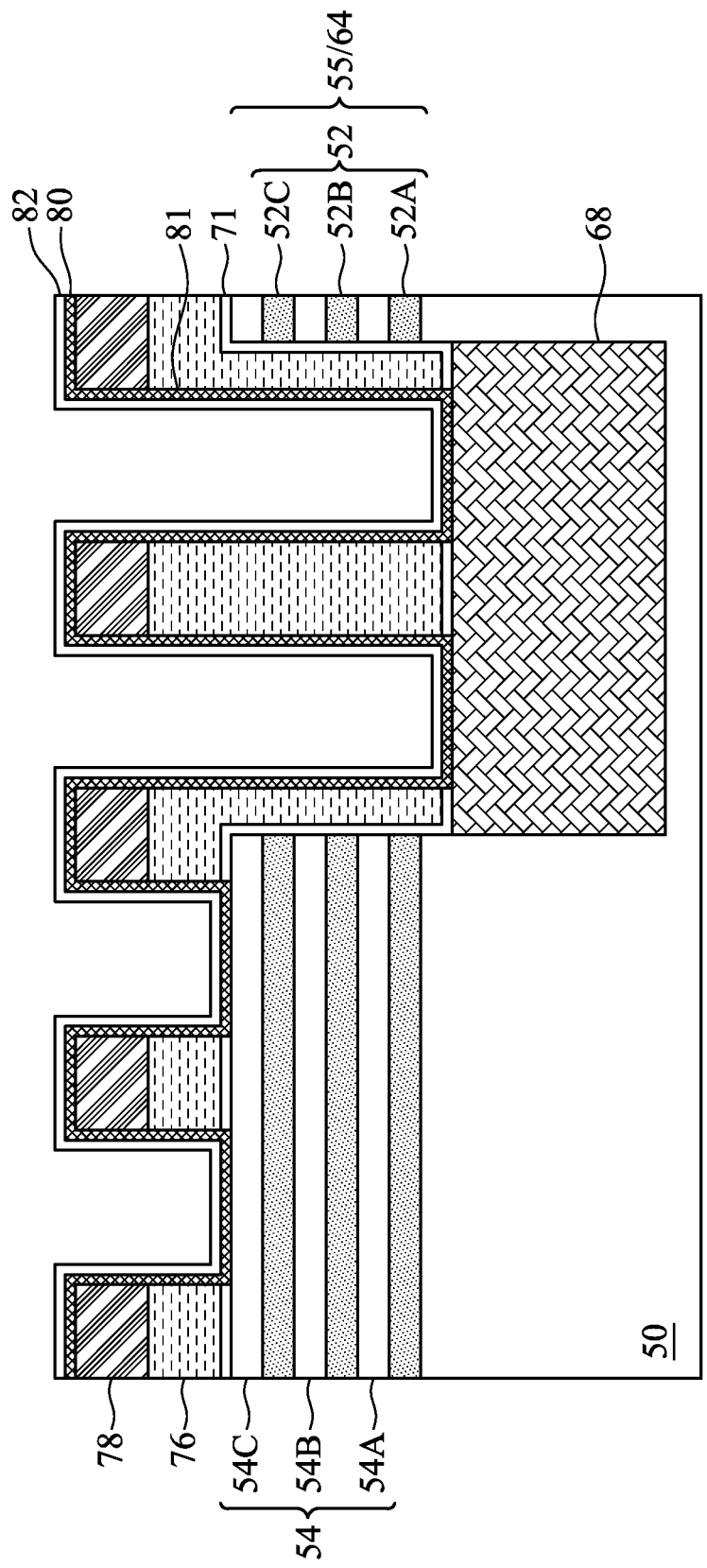
Figure 7B:
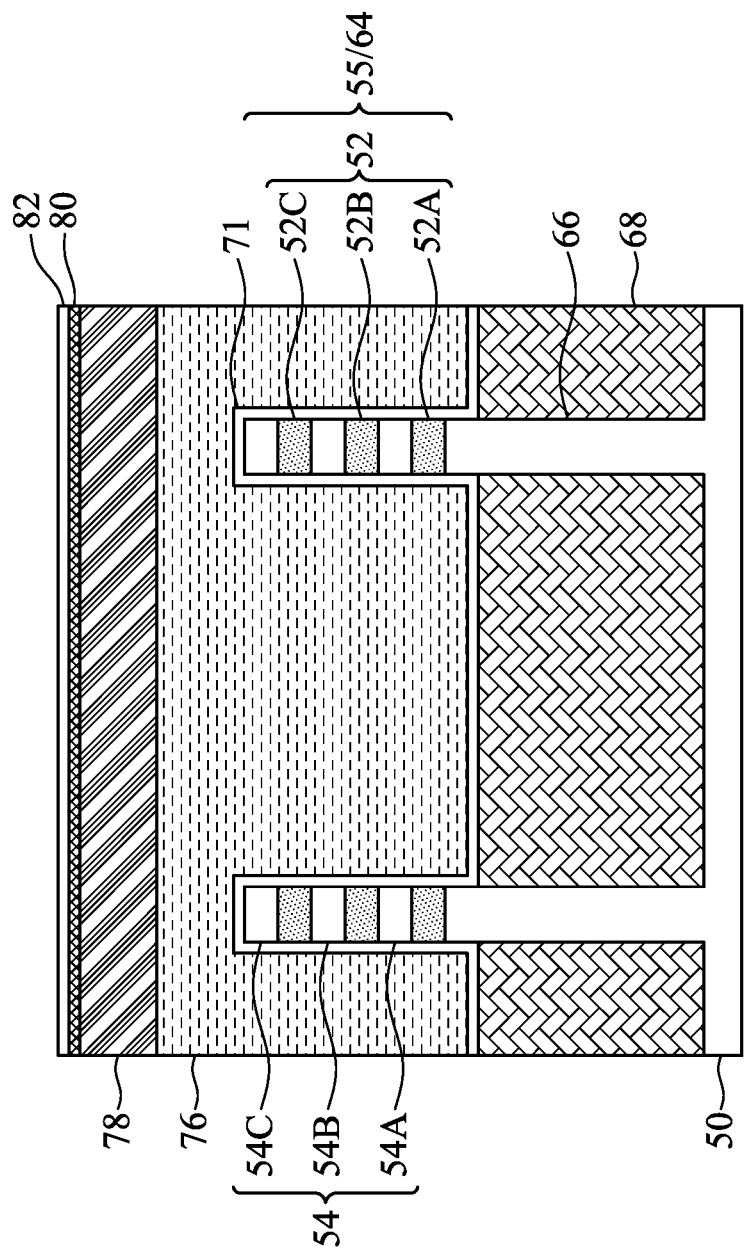
Figure 7C:
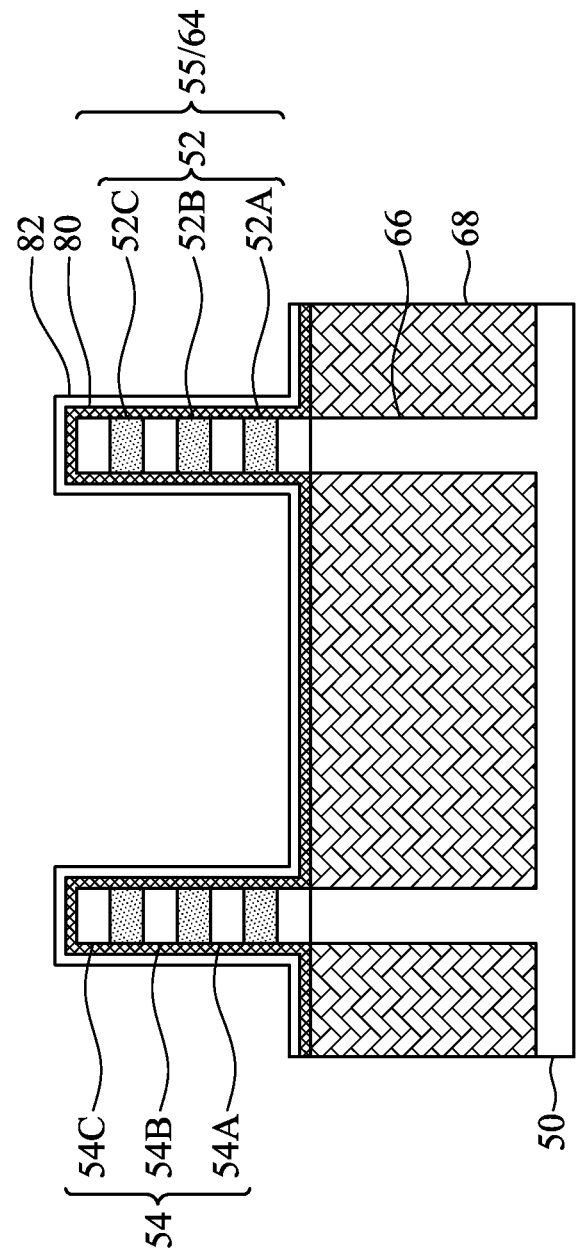
Figure 7D:
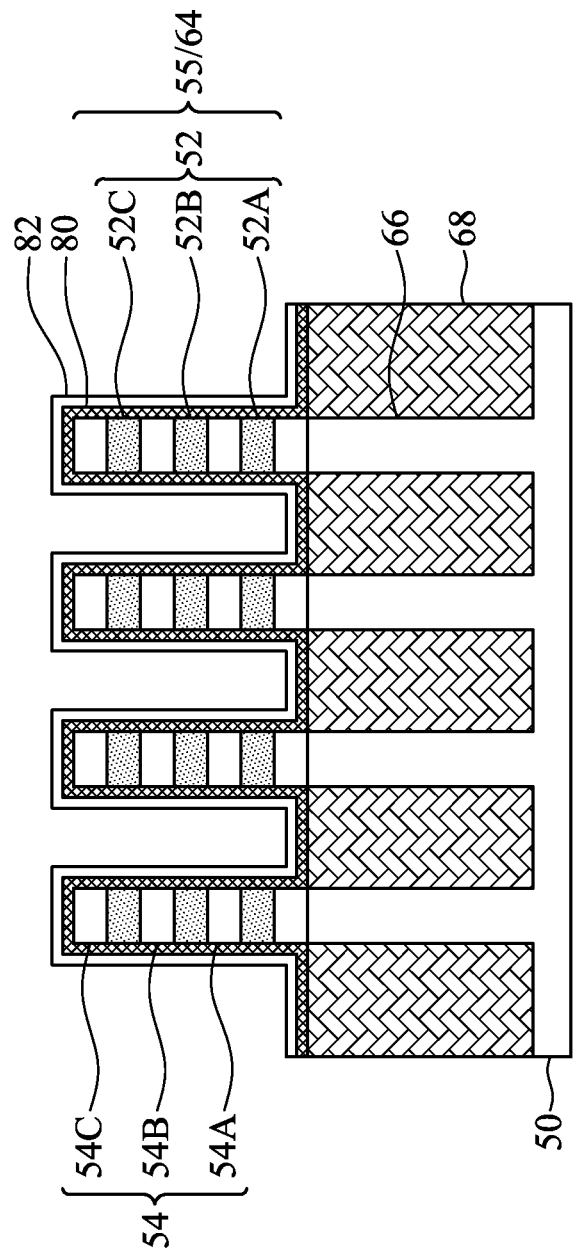

In FIGS. 5A through 5C, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed on the dummy dielectric layer 70, and a mask layer 74 is formed on the dummy gate layer 72. The dummy gate layer 72 may be deposited on the dummy dielectric layer 70 and then planarized, such as by a CMP. The mask layer 74 may be deposited on the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In some embodiments, a single dummy gate layer 72 and a single mask layer 74 may be formed across the n-type region and the p-type region. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

FIGS. 6A through 34 illustrate various additional steps in the manufacturing of embodiment devices and illustrate features in either the n-type region or the p-type region. In FIGS. 6A through 6D, the mask layer 74 (see FIG. 5) may be patterned using acceptable photolithography and etching techniques to form masks 78. The pattern of the masks 78 may be transferred to the dummy gate layer 72 and to the dummy dielectric layer 70 to form dummy gates 76 and dummy gate dielectrics 71, respectively. The dummy gates 76 cover respective channel regions of the nanostructures 55. The pattern of the masks 78 may be used to physically separate each of the dummy gates 76 from adjacent dummy gates 76. The dummy gates 76 may have lengthwise directions substantially perpendicular to lengthwise directions of the fins 66 and the nanostructures 55.

In FIGS. 7A through 7D, a first spacer layer 80 and a second spacer layer 82 are formed on the structures illustrated in FIGS. 6A through 6D. The first spacer layer 80 and the second spacer layer 82 will be subsequently patterned to act as spacers for forming self-aligned source/drain regions. In FIGS. 7A through 7D, the first spacer layer 80 is formed on top surfaces of the STI regions 68; top surfaces and side surfaces of the nanostructures 55 and the masks 78; and side surfaces of the dummy gates 76, the dummy gate dielectrics 71, and the fins 66. The second spacer layer 82 is deposited on the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIGS. 4A through 4C, a mask, such as a photoresist, may be formed over the n-type region, while exposing the p-type region, and appropriate type (e.g., p-type) impurities may be implanted into the exposed fins 66 and nanostructures 55 in the p-type region. The mask may then be removed. Subsequently, a mask, such as a photoresist, may be formed over the p-type region while exposing the n-type region, and appropriate type impurities (e.g., n-type) may be implanted into the exposed fins 66 and nanostructures 55 in the n-type region. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 8A:
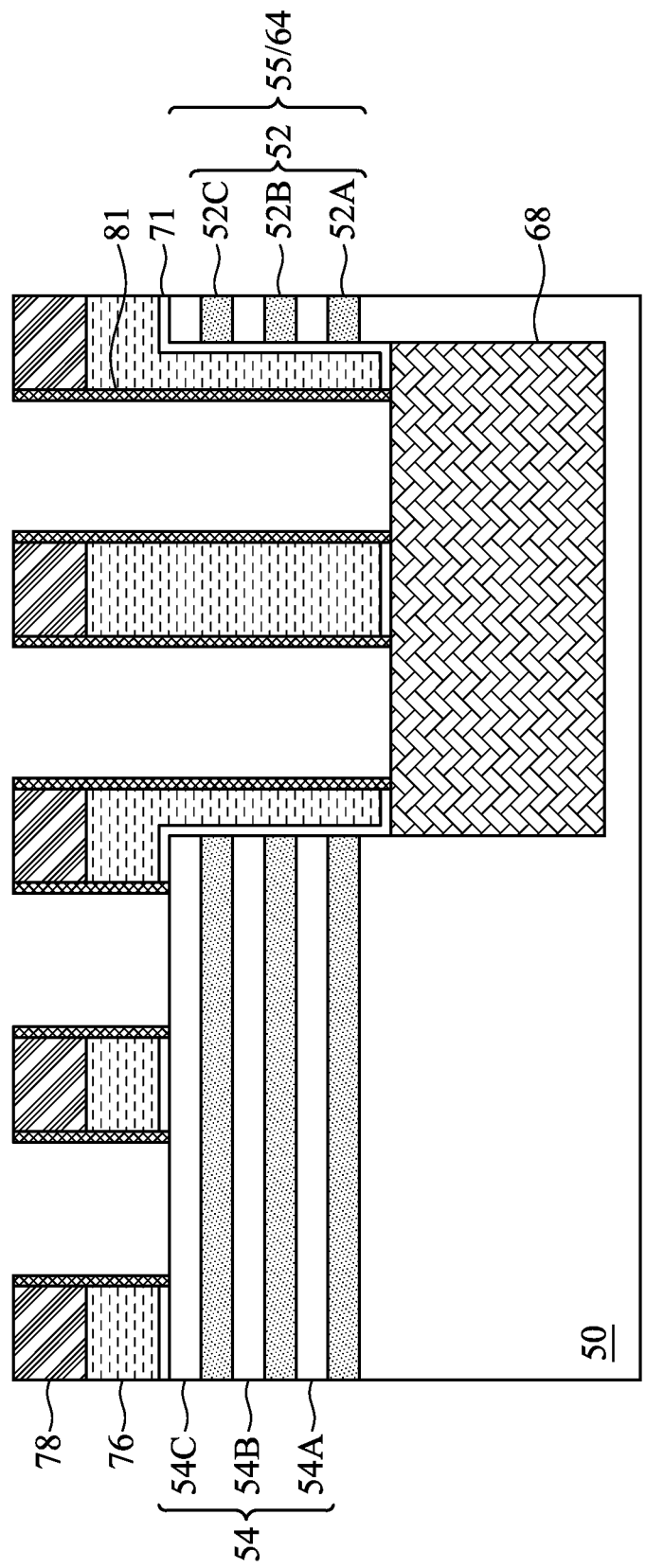
Figure 8B:
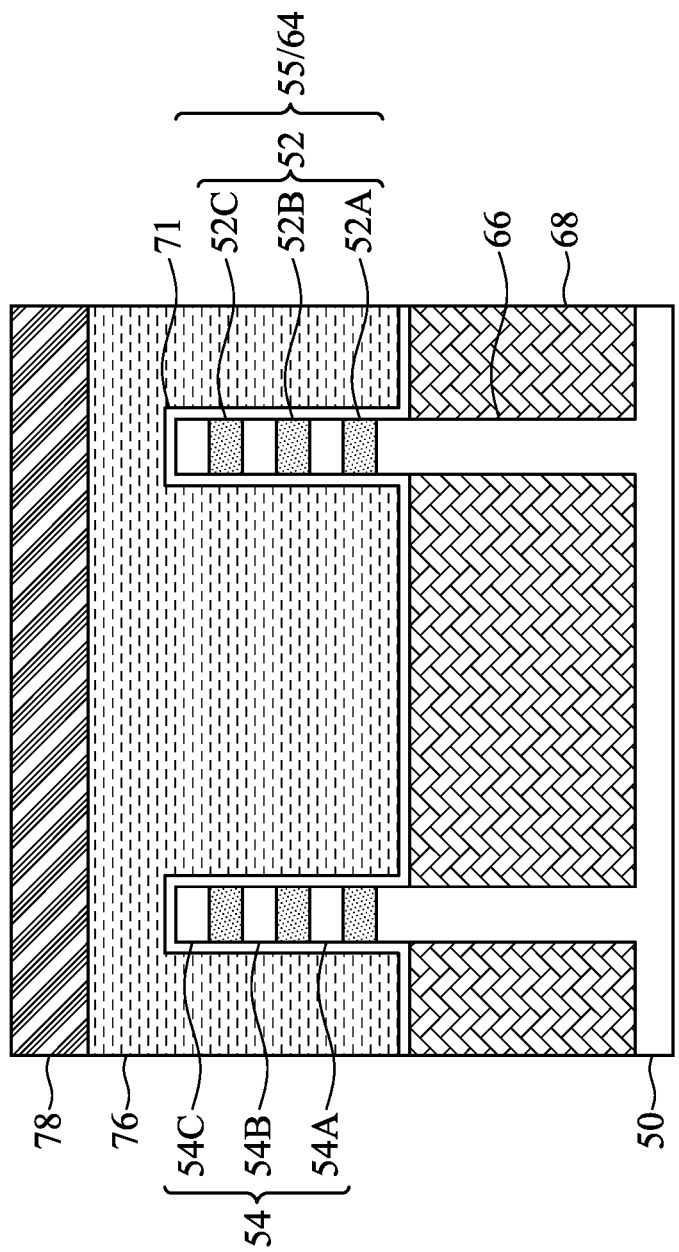
Figure 8C:
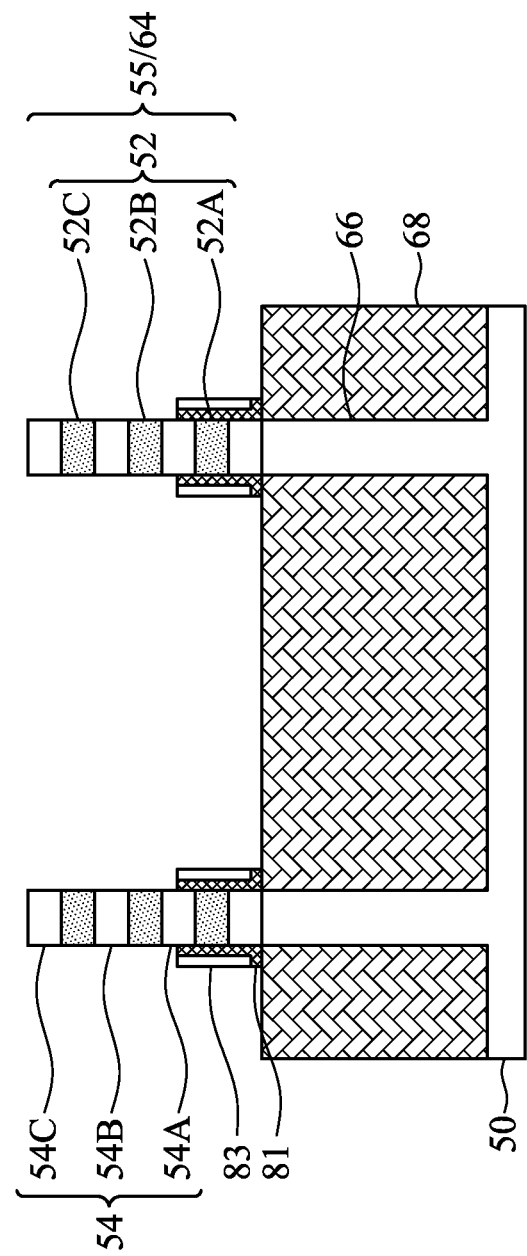
Figure 8D:
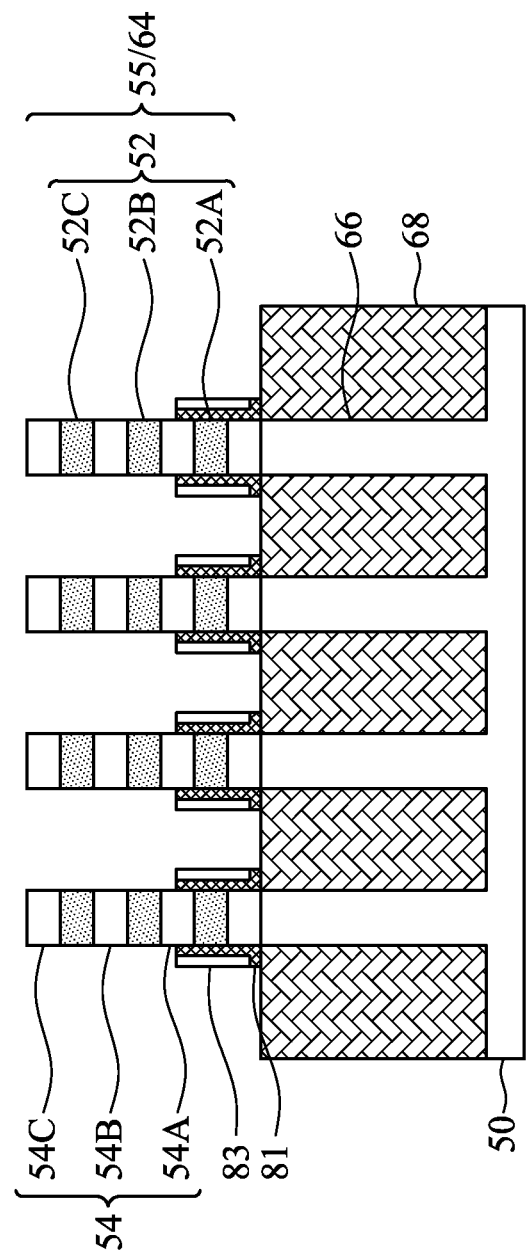

In FIGS. 8A through 8D, the first spacer layer 80 and the second spacer layer 82 are etched to form first spacers 81 and second spacers 83. As will be discussed in detail below, the first spacers 81 and the second spacers 83 act to self-aligned subsequently formed source drain regions, as well as to protect sidewalls of the fins 66 and/or the nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and the second spacer layer 82 may act as a mask when patterning the first spacer layer 80. The second spacer layer 82 may be etched using an anisotropic etch process with the first spacer layer 80 acting as an etch stop layer, and remaining portions of the second spacer layer 82 form second spacers 83 as illustrated in FIGS. 8C and 8D. Thereafter, the second spacers 83 act as a mask while etching exposed portions of the first spacer layer 80, thereby forming first spacers 81 as illustrated in FIGS. 8A, 8C, and 8D.

As illustrated in FIGS. 8C and 8D, the first spacers 81 and the second spacers 83 are disposed on sidewalls of the fins 66 and/or nanostructures 55. As illustrated in FIG. 8A, in some embodiments, the second spacer layer 82 may be removed from on the first spacer layer 80 adjacent the masks 78, the dummy gates 76, and the dummy gate dielectrics 71, and the first spacers 81 are disposed on side surfaces of the masks 78, the dummy gates 76, and the dummy gate dielectrics 71 in a cross-sectional view. In some embodiments, a portion of the second spacer layer 82 may remain on the first spacer layer 80 adjacent the masks 78, the dummy gates 76, and the dummy gate dielectrics 71 in the cross-sectional view illustrated in FIG. 8A.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9A:
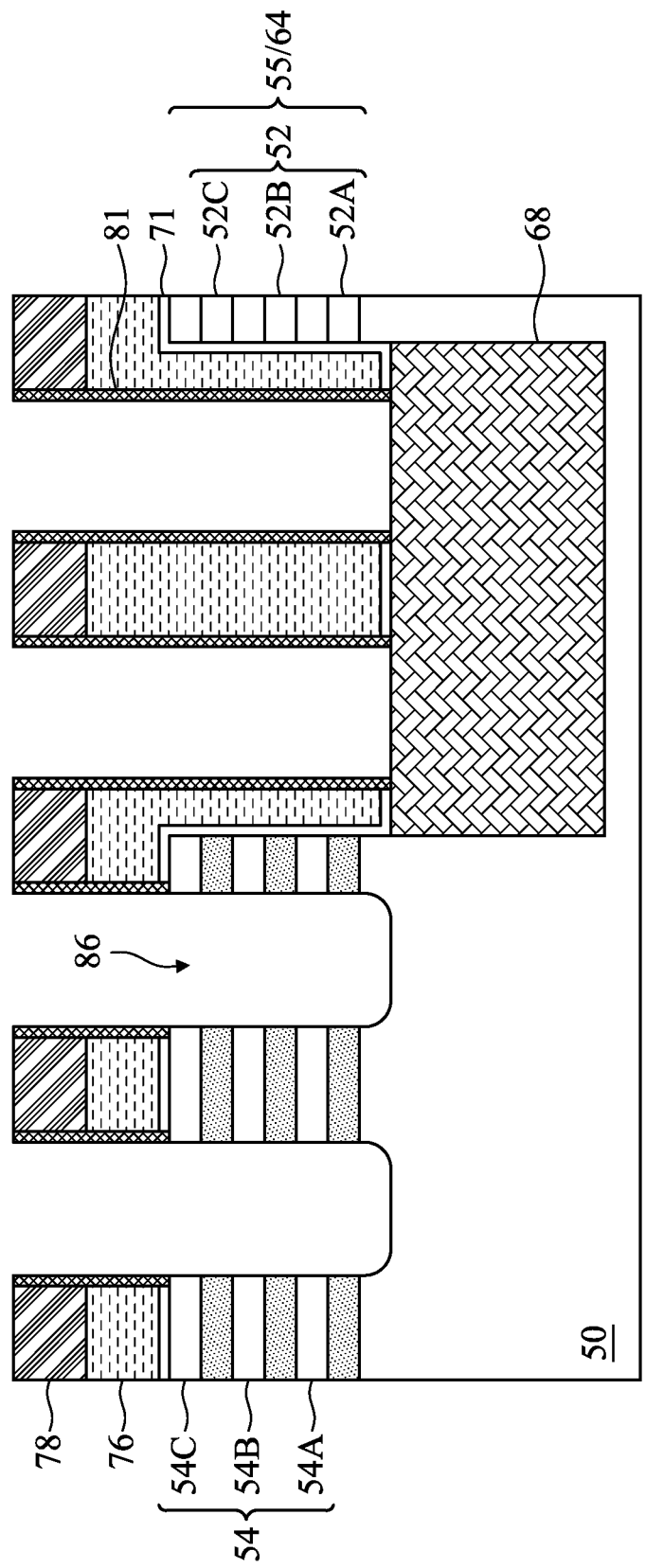
Figure 9B:
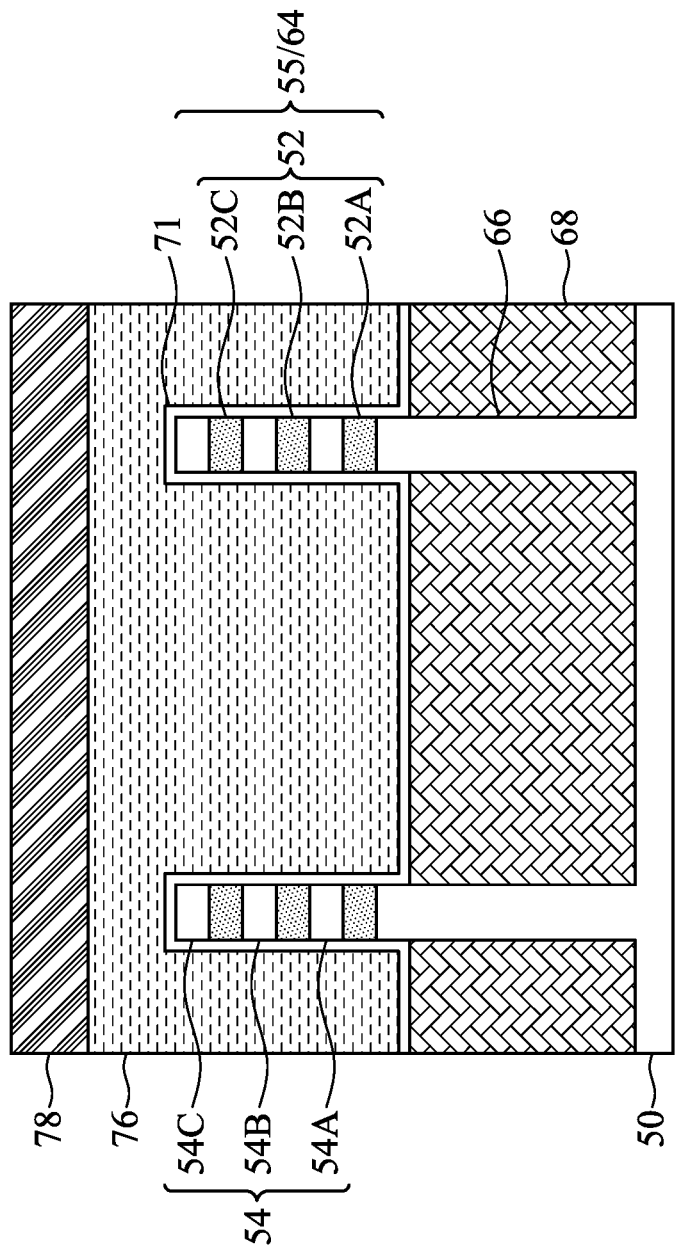
Figure 9C:
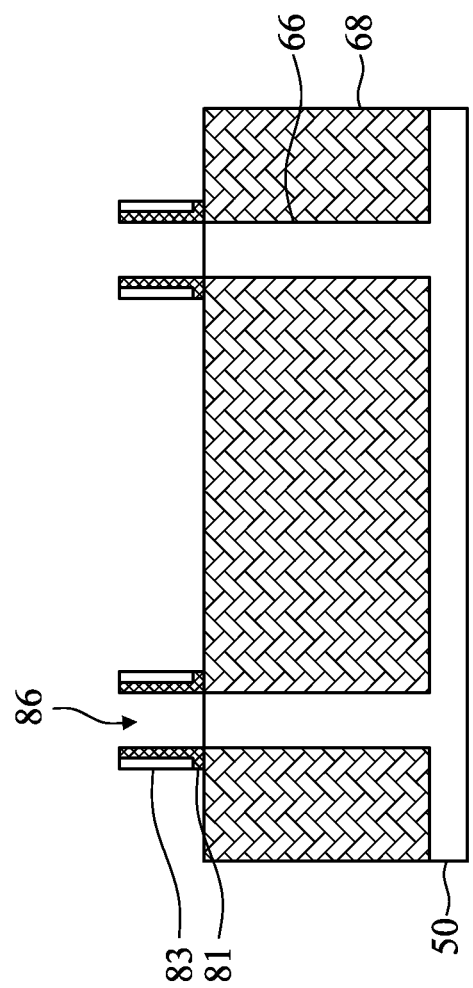
Figure 9D:
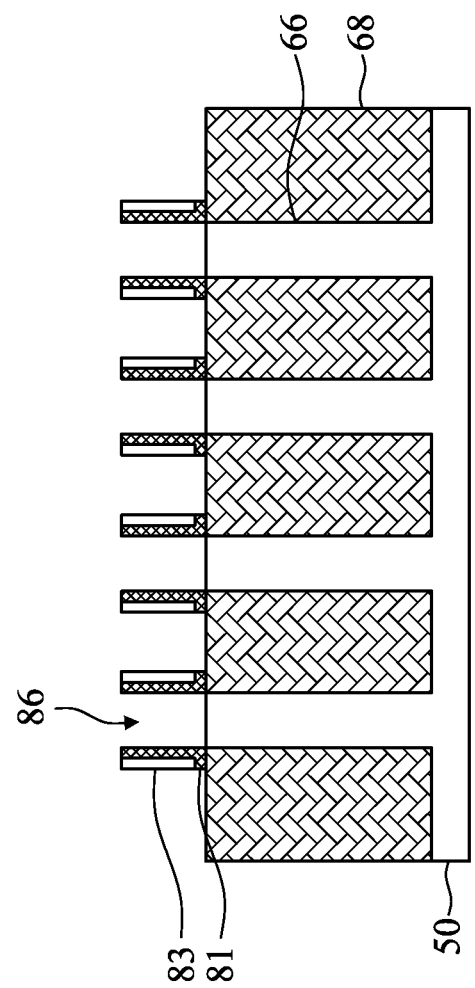
Figure 10A:
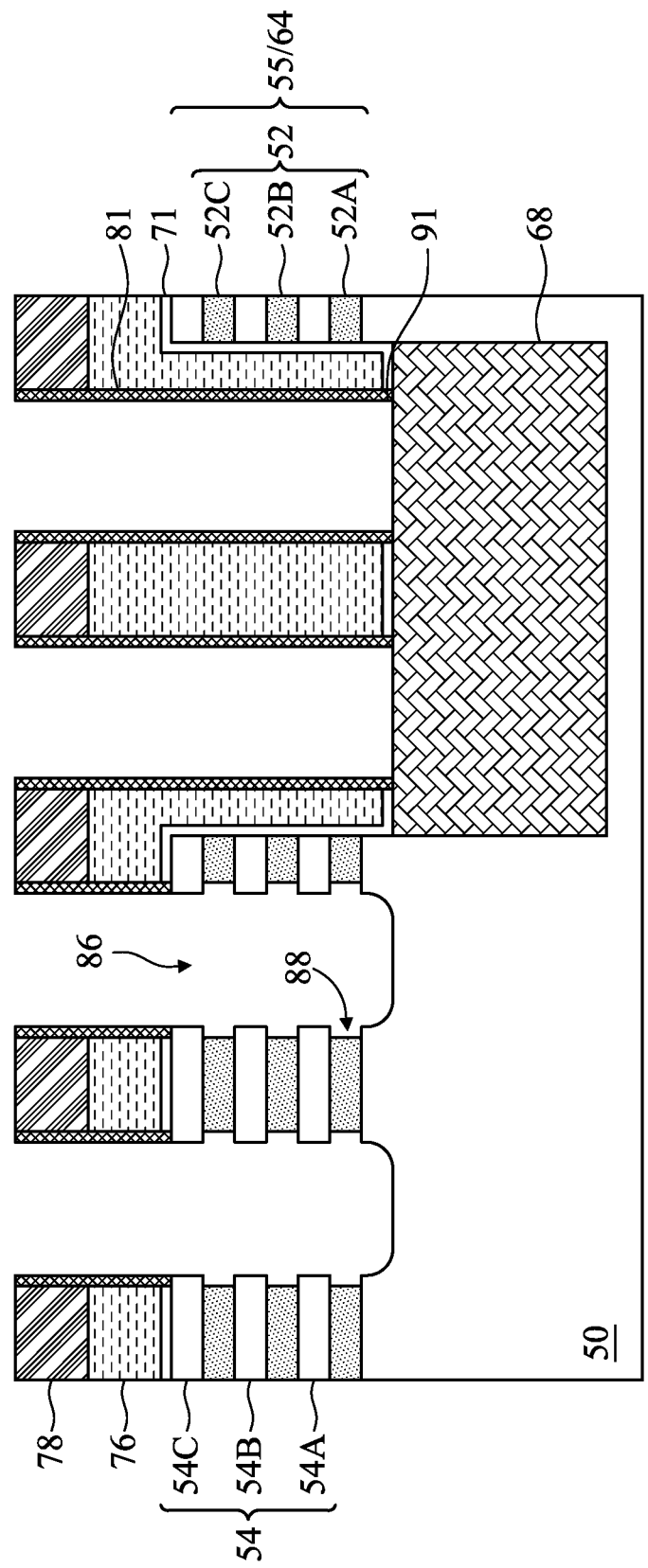
Figure 10B:
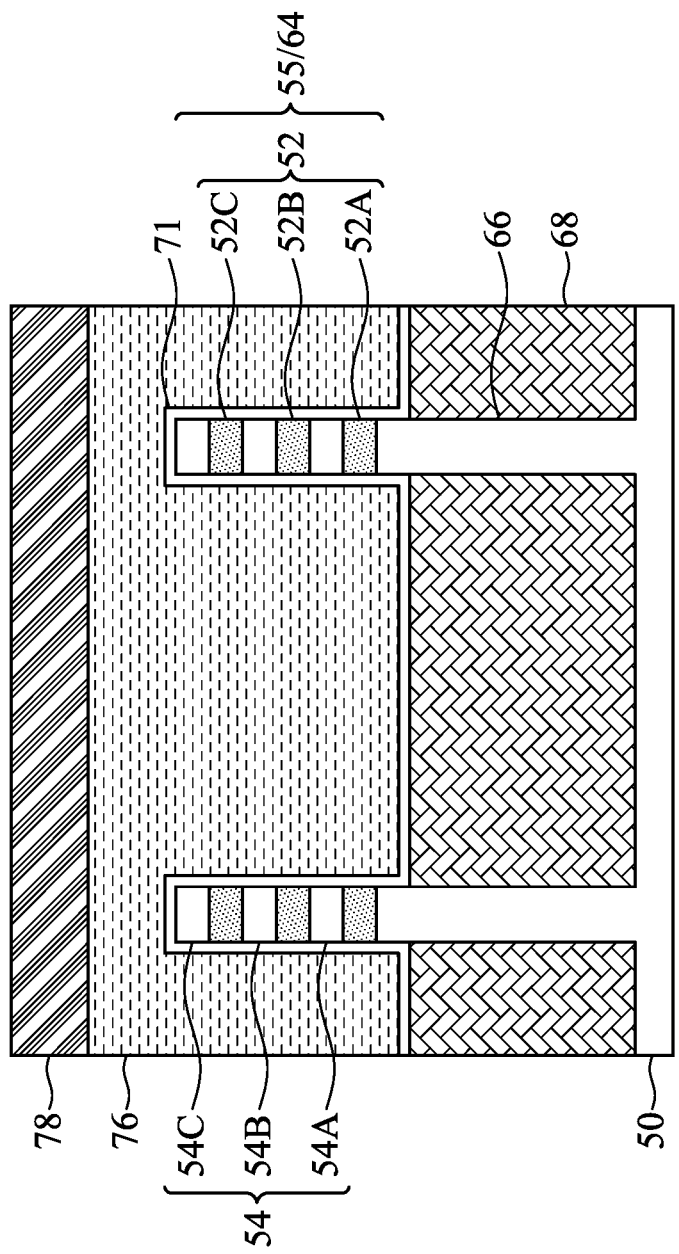
Figure 10C:
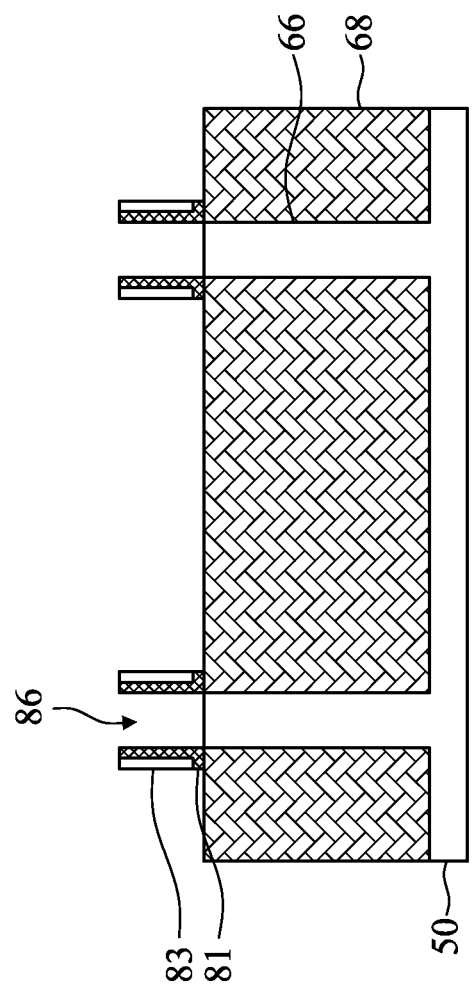
Figure 10D:
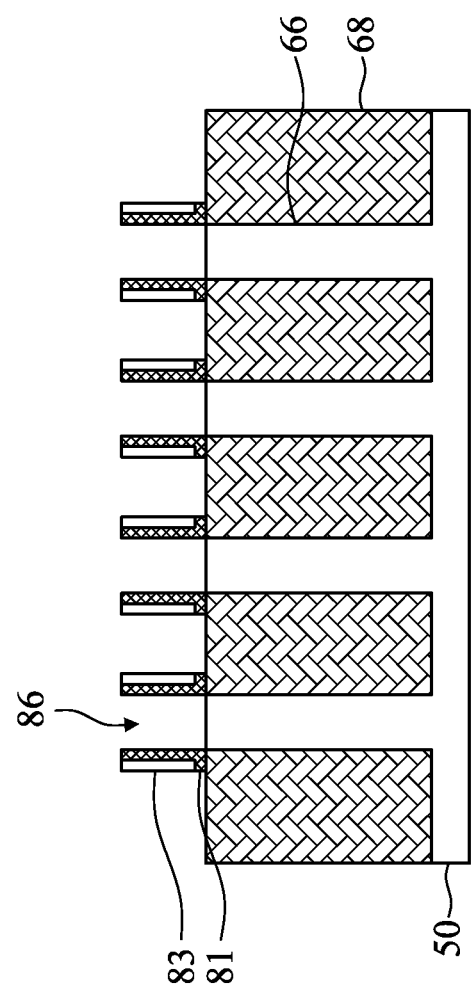

In FIGS. 9A through 9D, recesses 86 are formed in the nanostructures 55, the fins 66, and the substrate 50. Epitaxial source/drain regions will be subsequently formed in the recesses 86. The recesses 86 may extend through the first nanostructures 52 and the second nanostructures 54, and into the fins 66. As illustrated in FIGS. 9A, 9C, and 9D, top surfaces of the STI regions 68 may be level with portions of the fins 66 that form bottom surfaces of the recesses 86. In some embodiments, the fins 66 may be etched such that bottom surfaces of the recesses 86 are disposed above or below the top surfaces of the STI regions 68. The recesses 86 may be formed by etching the nanostructures 55, the fins 66, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the recesses 86. A single etch process or multiple etch processes may be used to etch each layer of the nanostructures 55 and/or the fins 66. Timed etch processes may be used to stop the etching of the recesses 86 after the recesses 86 reach a desired depth.

In FIGS. 10A through 10D, portions of side surfaces of the layers of the multi-layer stack 64 formed of the first semiconductor materials (e.g., the first nanostructures 52) exposed by the recesses 86 are etched to form sidewall recesses 88. Although side surfaces of the first nanostructures 52 adjacent the sidewall recesses 88 are illustrated as being straight in FIG. 10A the side surfaces may be concave or convex. The side surfaces may be etched using isotropic etching processes, such as wet etching or the like. In an embodiment in which the first nanostructures 52 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch side surfaces of the first nanostructures 52.

In FIGS. 11A through 11D, inner spacers 90 are formed in the sidewall recess 88. The inner spacers 90 may be formed by depositing an inner spacer layer (not separately illustrated) on the structures illustrated in FIGS. 10A through 10D. The inner spacers 90 act as isolation features between subsequently formed source/drain regions and a gate structure. As will be discussed in detail below, source/drain regions will be formed in the recesses 86, while the first nanostructures 52 will be replaced with gate structures. The inner spacers 90 may also help to control the growth of the source/drain regions in the recesses 86.

The inner spacer layer may be deposited by a conformal deposition process, such as CVD, ALD, or the like. The inner spacer layer may comprise a material such as silicon nitride (SiN), silicon oxide (SiO$_2$), silicon oxygen carbide (SiOC), silicon oxygen carbon nitride (SiOCN), silicon carbon nitride (SiCN), or silicon oxynitride, although any suitable material, such as low-dielectric constant (low-k) materials having a k-value less than about 3.5, may be utilized. The inner spacer layer may then be etched to form the inner spacers 90. The inner spacer layer may be etched by an anisotropic etching process, such as RIE, NBE, or the like; an isotropic etching process, such as a wet etching process or the like; combinations thereof; or the like. The inner spacer layers may have thicknesses in a range from about 1 nm to about 10 nm. Although outer side surfaces of the inner spacers 90 are illustrated as being flush with side surfaces of the second nanostructures 54, the outer side surfaces of the inner spacers 90 may extend beyond or be recessed from side surfaces of the second nanostructures 54.

Figure 11A:
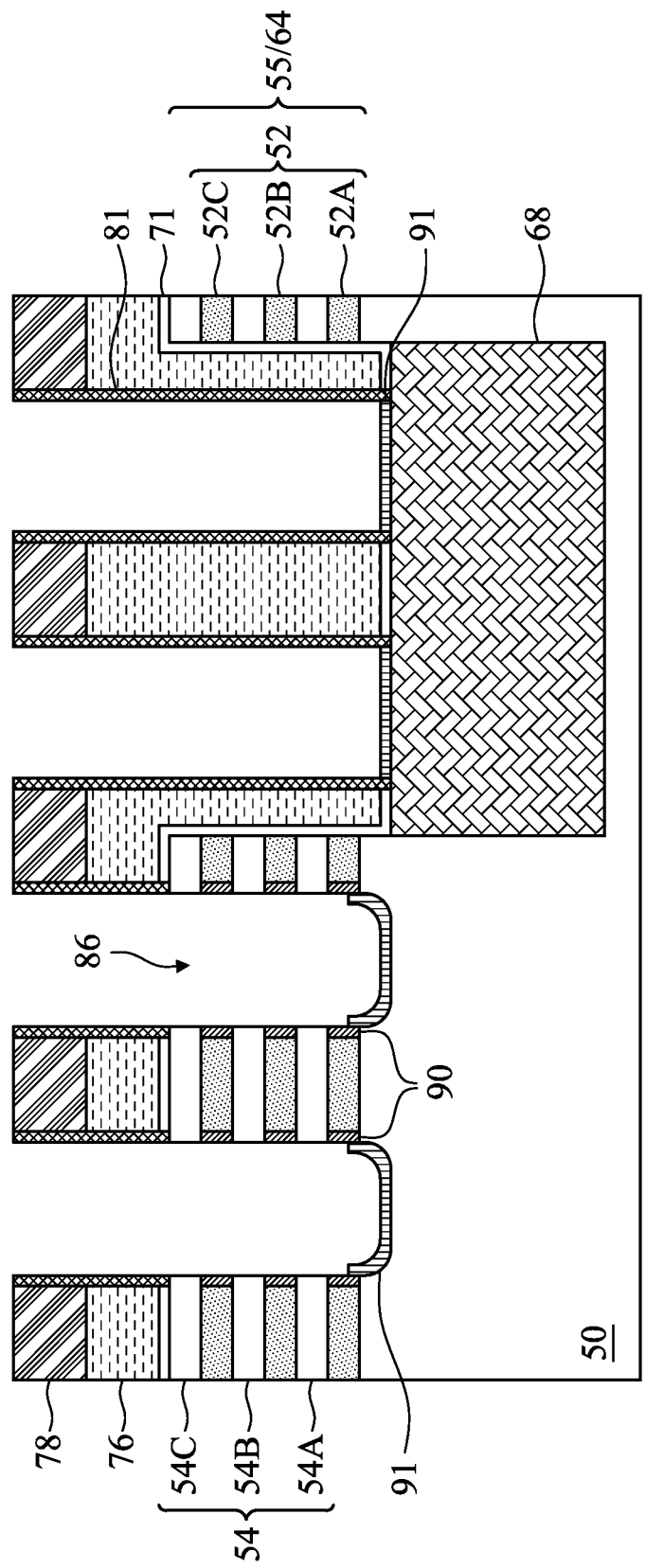
Figure 11B:
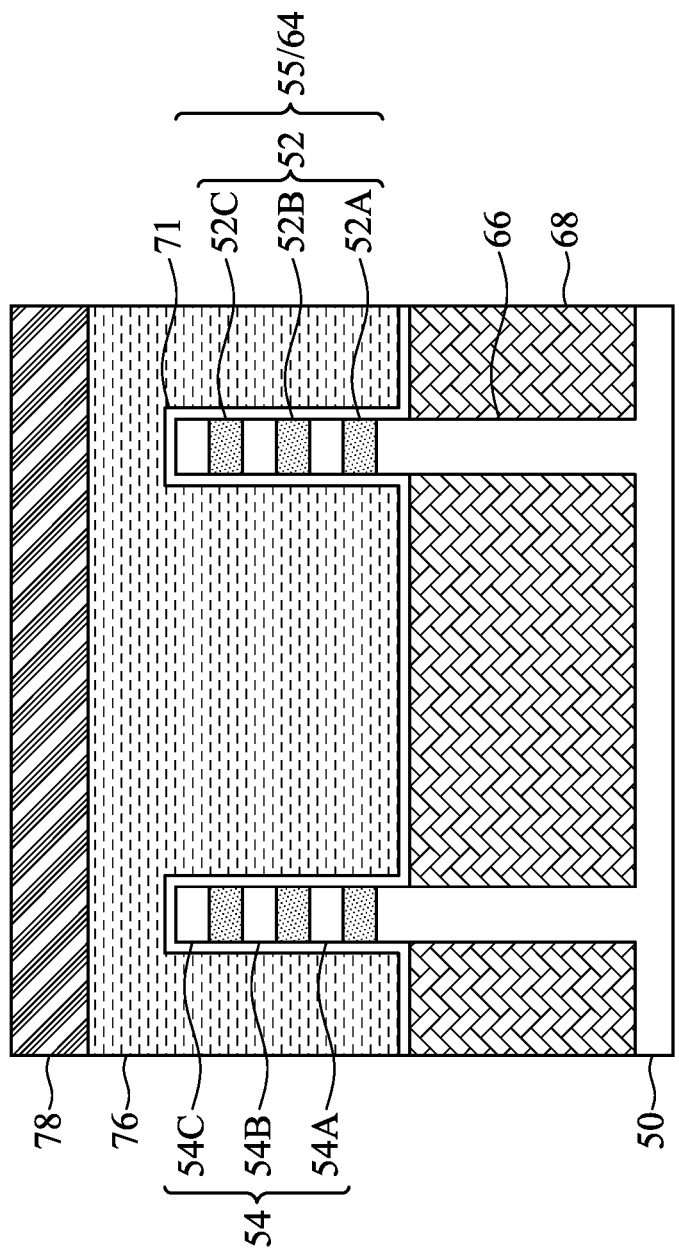
Figure 11C:
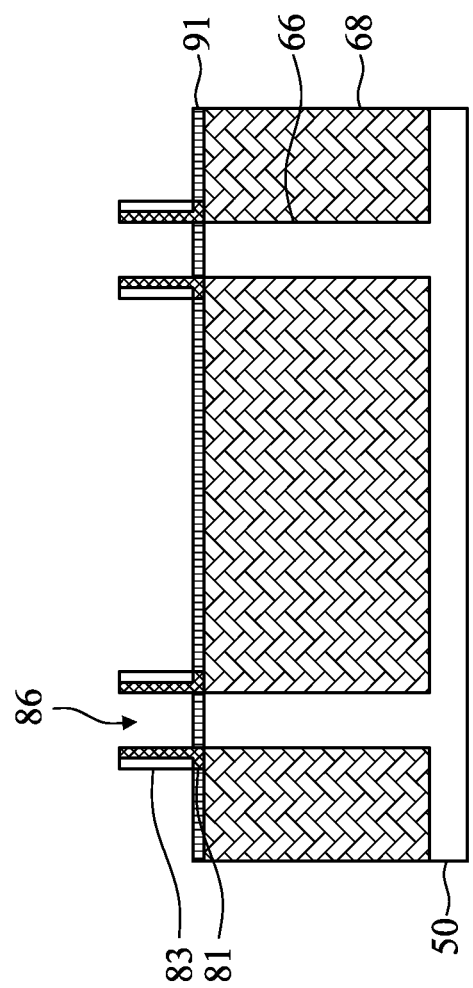
Figure 11D:
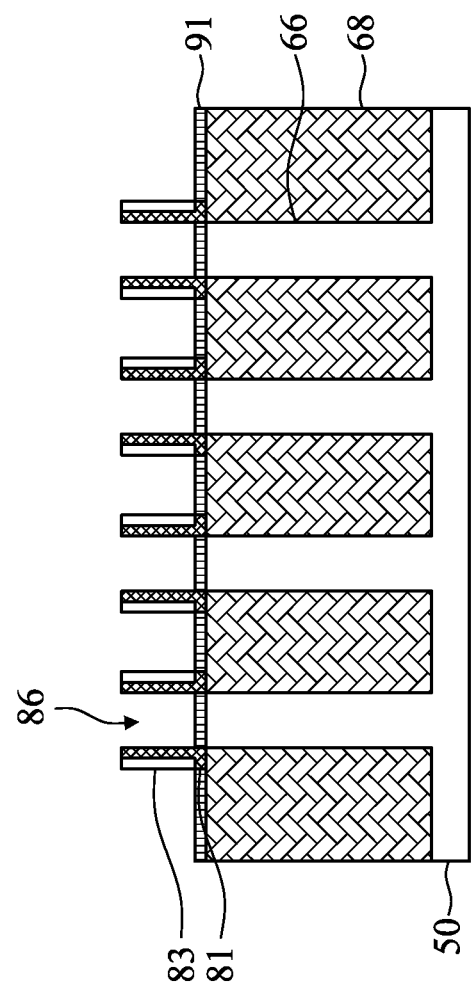

Although the outer side surfaces of the inner spacers 90 are illustrated as being straight in FIG. 11A, the outer side surfaces of the inner spacers 90 may be concave or convex. As an example, side surfaces of the first nanostructures may be concave, outer side surfaces of the inner spacers 90 may be concave, and the inner spacers 90 may be recessed from side surfaces of the second nanostructures 54. The inner spacer layer may be etched by an anisotropic etching process, such as RIE, NBE, or the like; an isotropic etching process, such as a wet etching process or the like; combinations thereof; or the like. The inner spacers 90 may be used to prevent damage to subsequently formed source/drain regions (such as epitaxial source/drain regions 92, discussed below with respect to FIGS. 12A through 12E) by subsequent etching processes, such as etching processes used to form gate structures, and may be used to control the growth of the source/drain regions.

Additionally, isolation layers 91 may be formed on top surfaces of the fins 66 and the substrate 50 in the recesses 86, and on top surfaces of the STI regions 68. The isolation layers 91 may be formed by conformally forming one or more dielectric material(s) and then subsequently etching the dielectric material(s). Acceptable dielectric materials may include silicon nitride, silicon oxynitride, silicon oxycarbonitride, silicon oxycarbide, silicon carbonitride, silicon oxide, or the like, which may be formed by a deposition process such as chemical vapor deposition (CVD), atomic layer deposition (ALD), or the like. Any acceptable etch process, such as a dry etch, a wet etch, the like, or a combination thereof, may be performed to pattern the dielectric material(s). The etching may be anisotropic. The etching removes the vertical portions of the dielectric material(s). The dielectric material(s), when etched, have horizontal portions left on the top surfaces of the STI regions 68 and/or the fins 66 and the substrate 50 in the recesses 86 (thus forming the isolation layers 91). In some embodiments, isolation layers 91 may also be formed on other horizontal surfaces, such as on top surfaces of the masks 78, the first spacers 81, and the second spacers 83.

In FIGS. 12A through 12E, epitaxial source/drain regions 92 are formed in the recesses 86. Source/drain regions may refer to a source or a drain, individually or collectively, dependent upon the context. The epitaxial source/drain regions 92 may be epitaxially grown in the recesses 86 using a process such as chemical vapor deposition (CVD), atomic layer deposition (ALD), vapor phase epitaxy (VPE), molecular beam epitaxy (MBE), or the like. In some embodiments, the epitaxial source/drain regions 92 may exert stress on the second nanostructures 54, thereby improving performance. In the cross-section illustrated in FIG. 12A, the epitaxial source/drain regions 92 may be formed in the recesses 86 such that each dummy gate 76 is disposed between neighboring pairs of the epitaxial source/drain regions 92. In some embodiments, the first spacers 81 are used to separate the epitaxial source/drain regions 92 from the dummy gates 76 and the inner spacers 90 are used to separate the epitaxial source/drain regions 92 from the nanostructures 55 by an appropriate lateral distance so that the epitaxial source/drain regions 92 do not short out with subsequently formed gates of the resulting nanostructure FETs.

In some embodiments, the epitaxial source/drain regions 92 in the n-type region, e.g., the NMOS region, may be formed by masking the p-type region, e.g., the PMOS region. Then, the epitaxial source/drain regions 92 are epitaxially grown in the recesses 86 in the n-type region. The epitaxial source/drain regions 92 may include any acceptable material appropriate for forming source/drain regions in n-type nanostructure FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from upper surfaces of the nanostructures 55 and may have facets.

The epitaxial source/drain regions 92 in the p-type region, e.g., the PMOS region, may be formed by masking the n-type region, e.g., the NMOS region. Then, the epitaxial source/drain regions 92 are epitaxially grown in the recesses 86 in the p-type region. The epitaxial source/drain regions 92 may include any acceptable material appropriate for forming source/drain regions in p-type nanostructure FETs. For example, if the second nanostructures 54 are silicon, the epitaxial source/drain regions 92 may comprise materials exerting a compressive strain on the second nanostructures 54, such as silicon-germanium, boron doped silicon-germanium, germanium, germanium tin, or the like. The epitaxial source/drain regions 92 may also have surfaces raised from upper surfaces of the nanostructures 55 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

Figure 12A:
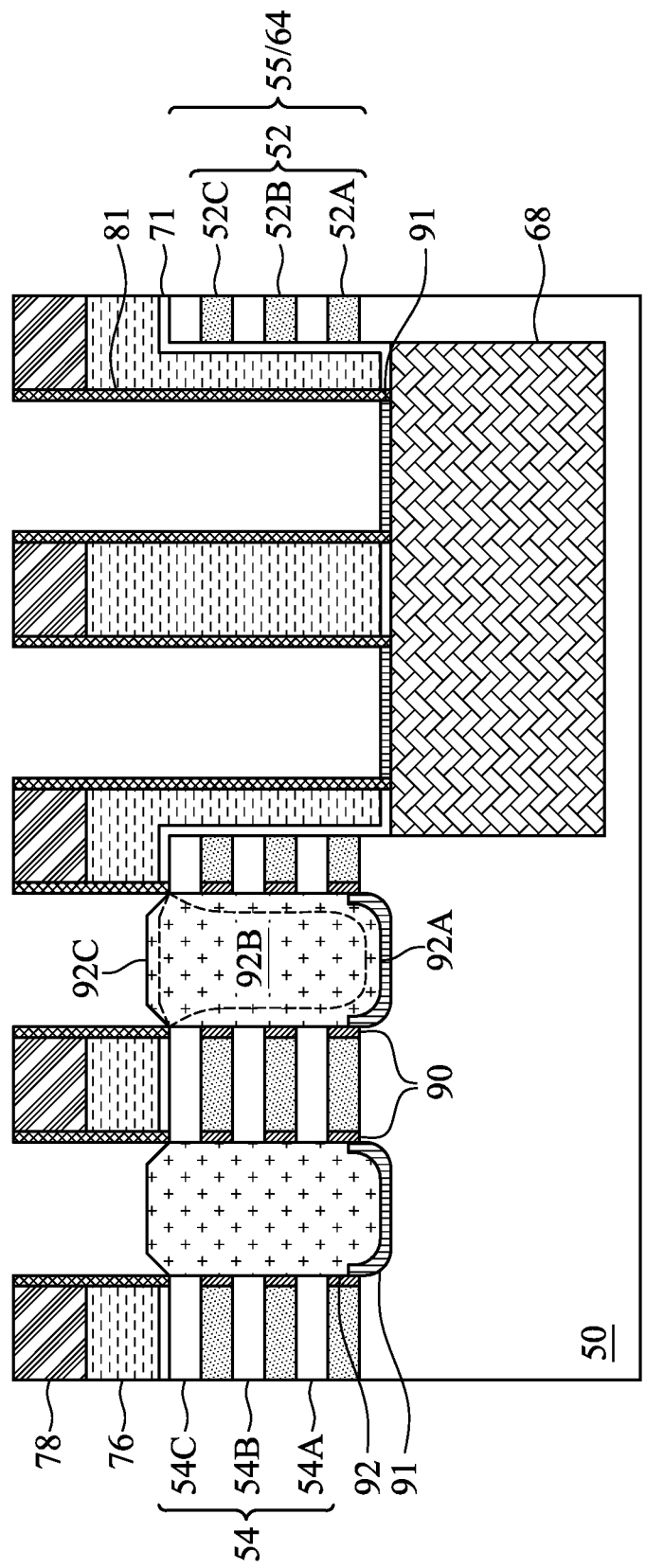
Figure 12B:
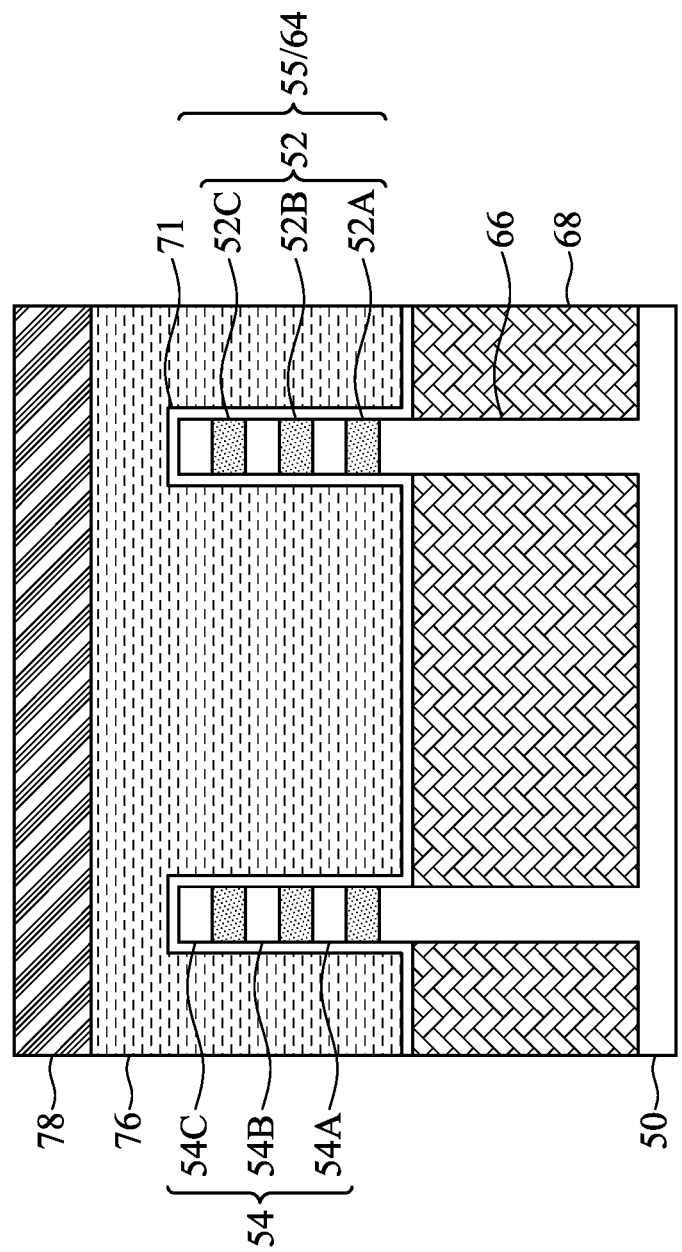
Figure 12C:
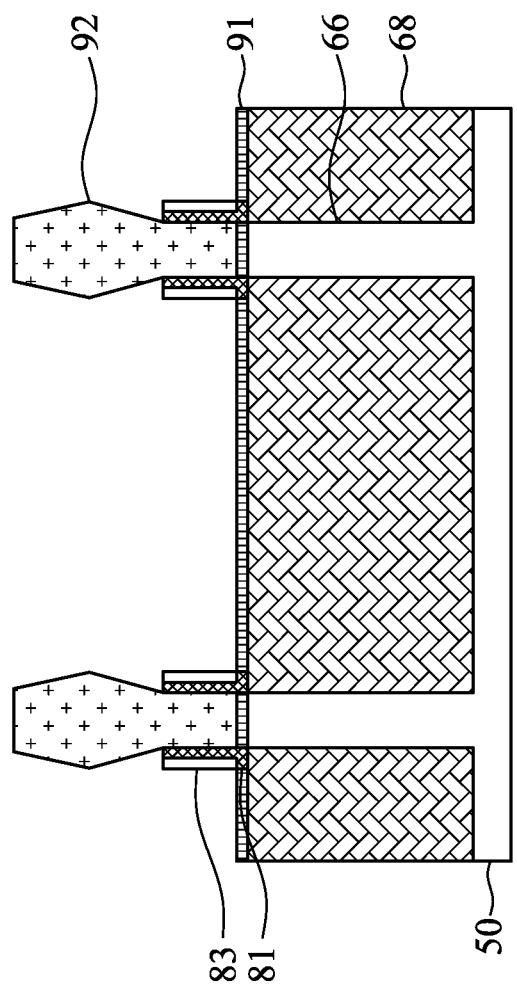
Figure 12D:
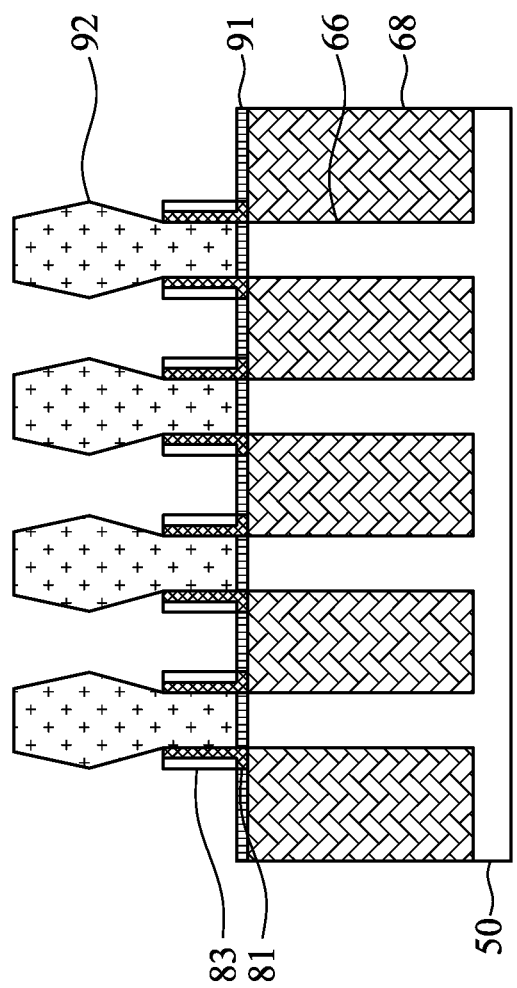
Figure 12E:
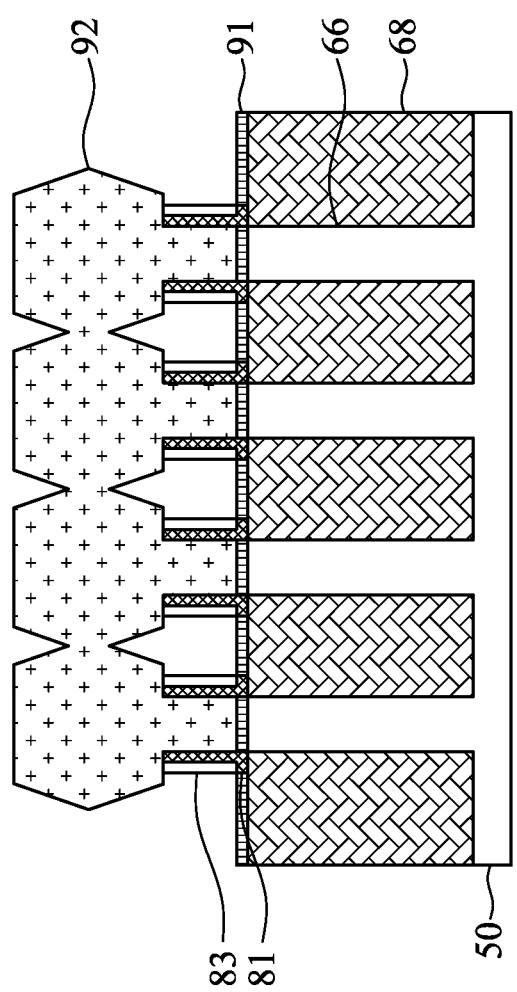
Figure 13A:
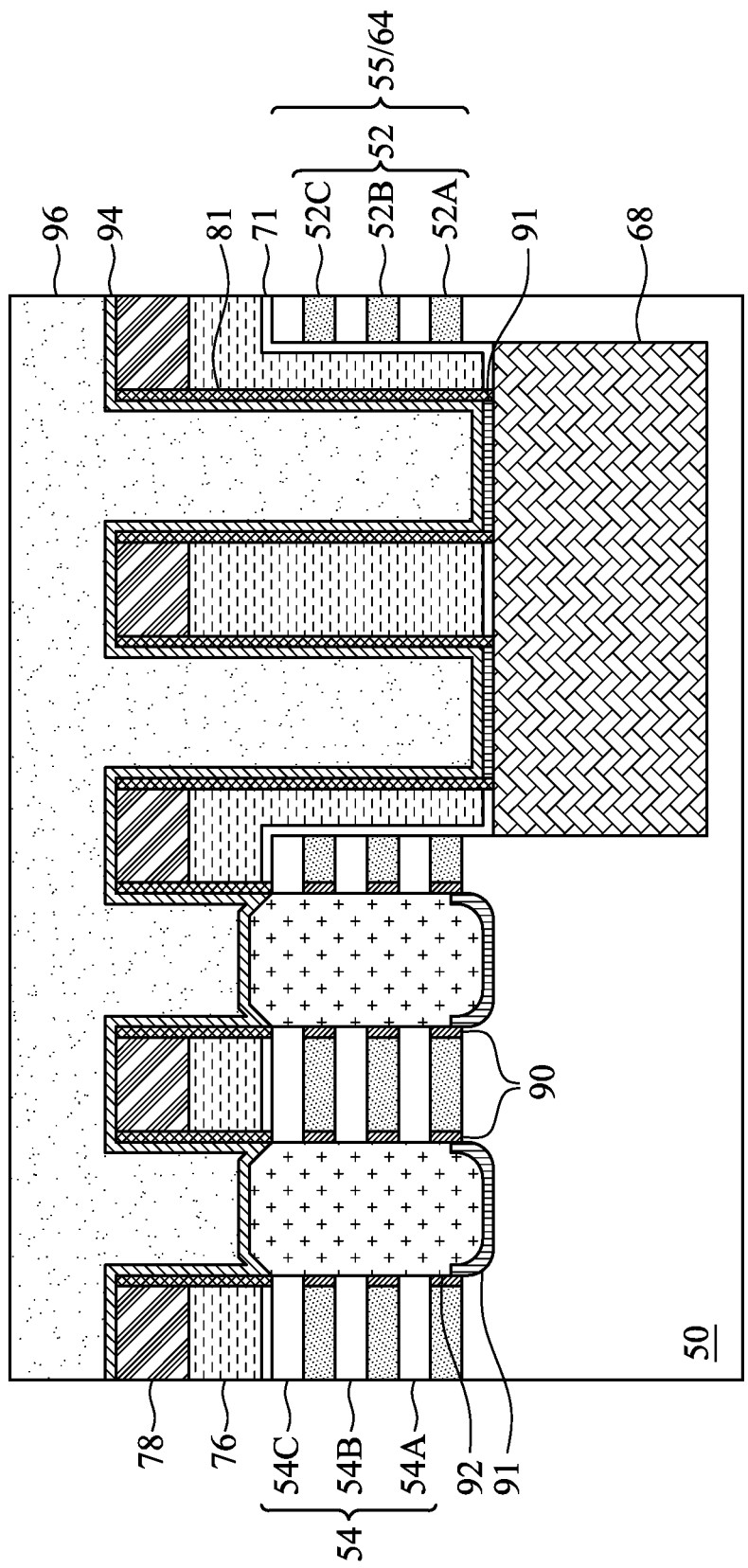
Figure 13B:
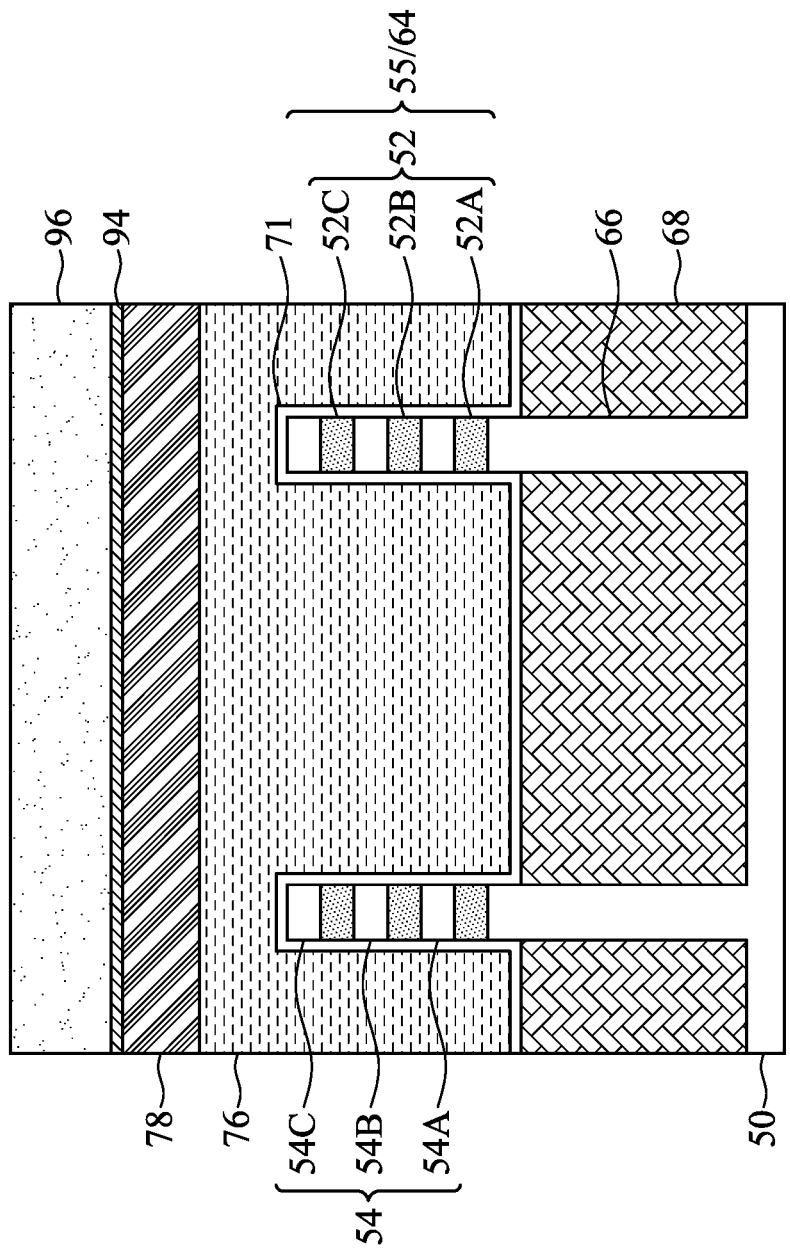
Figure 13C:
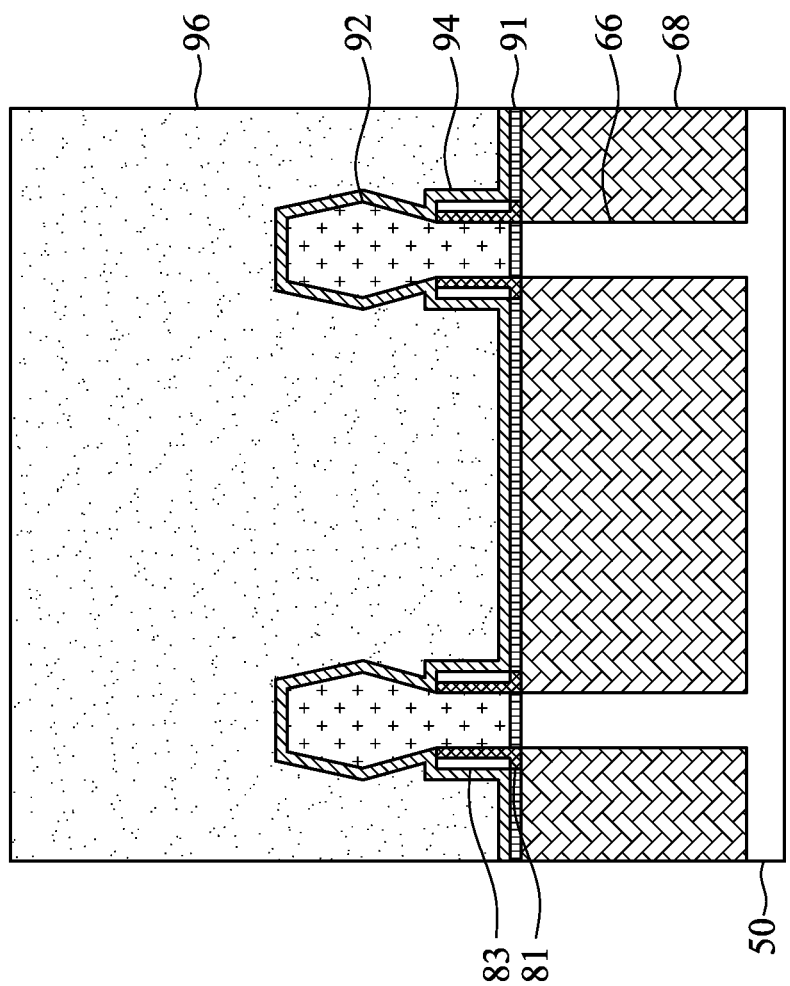
Figure 13D:
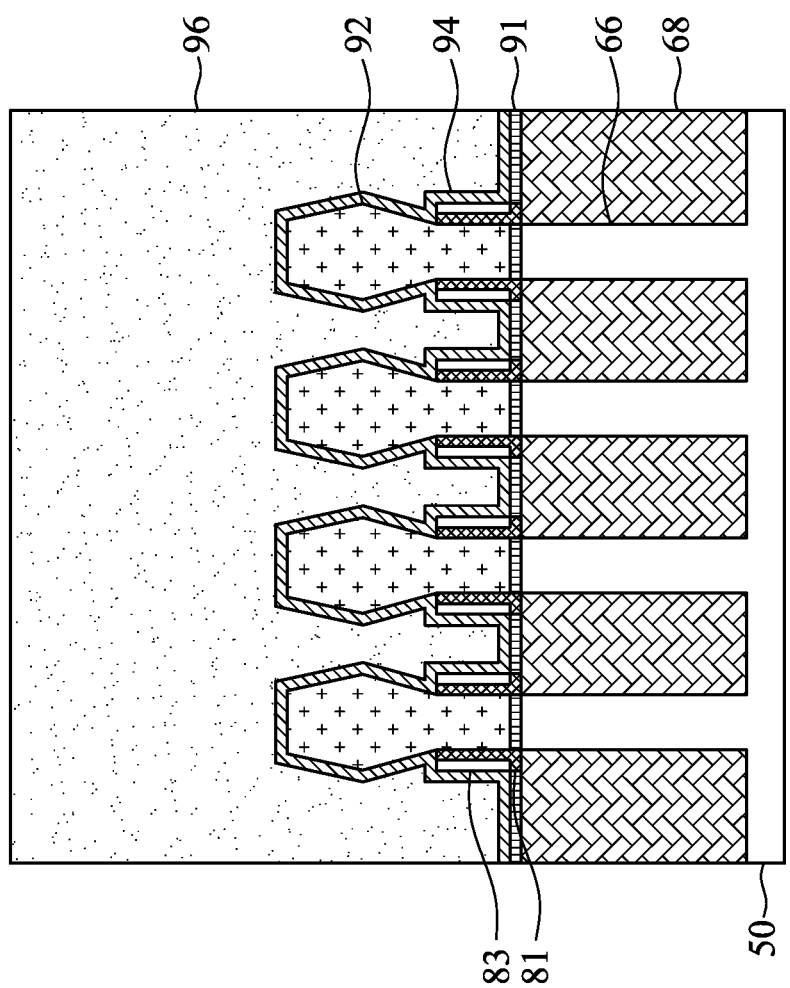
Figure 14A:
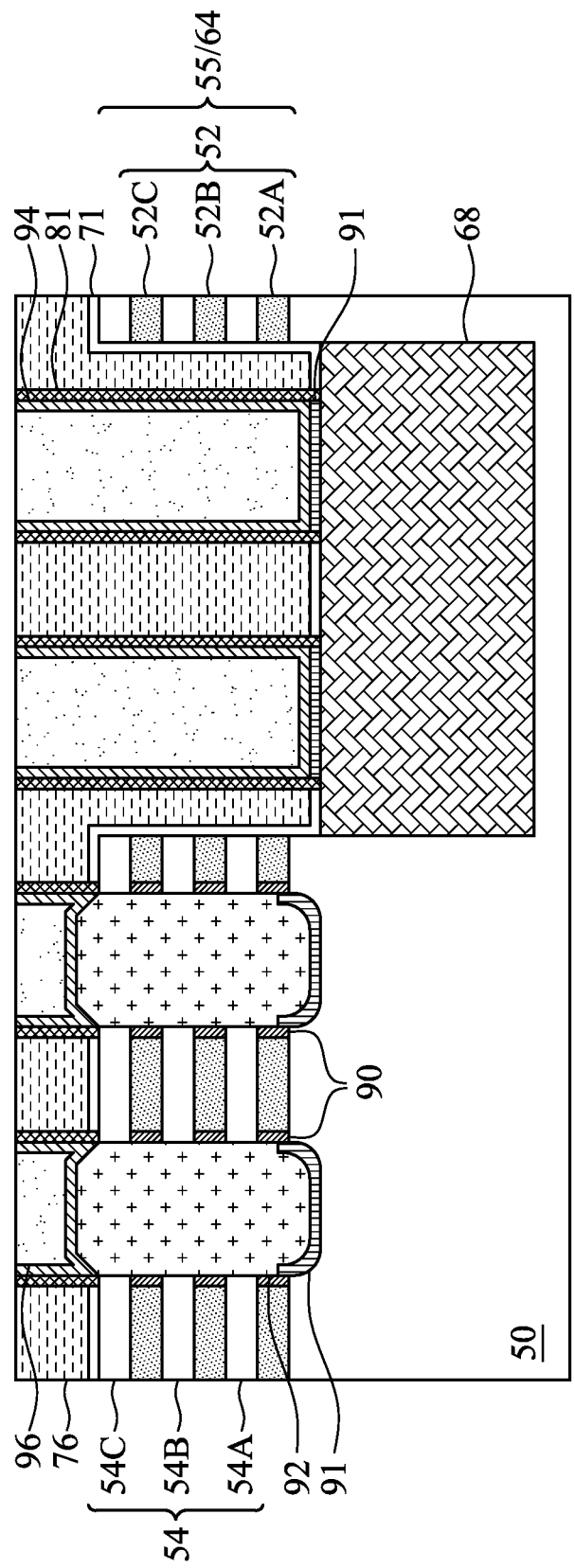
Figure 14B:
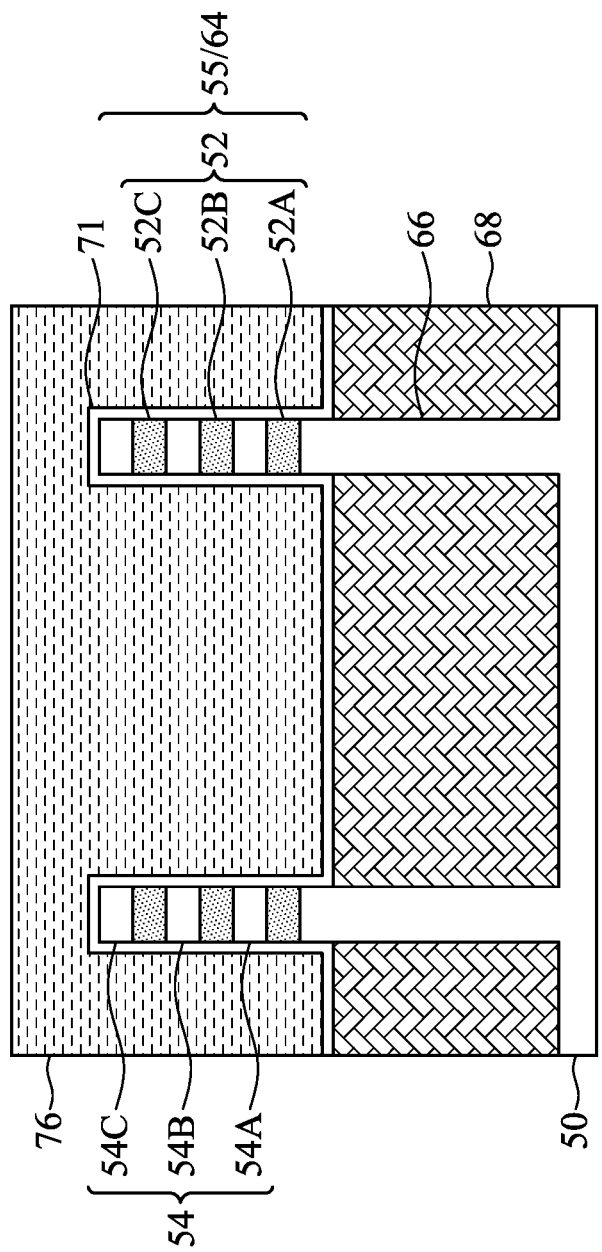
Figure 14C:
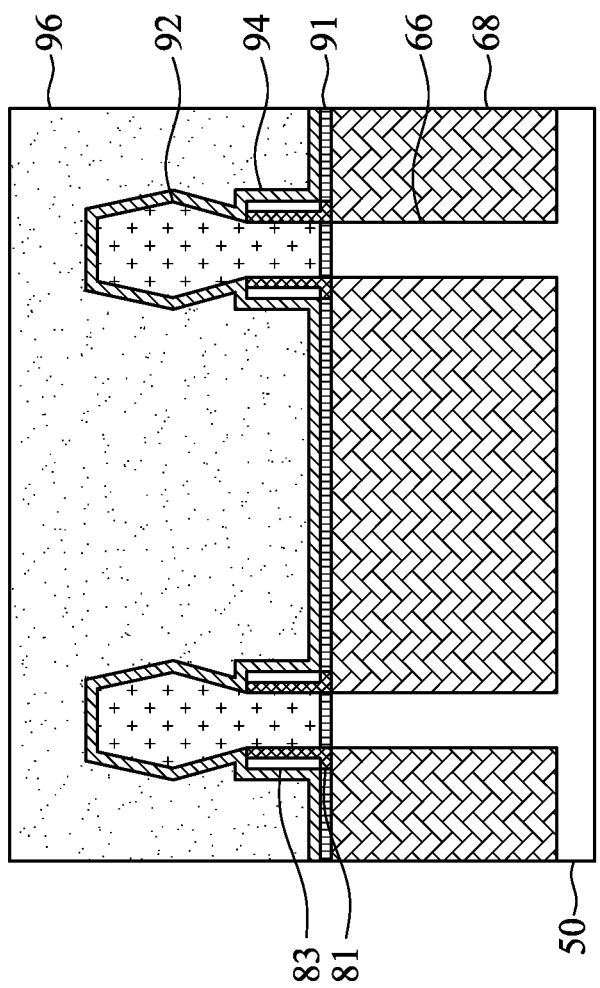
Figure 14D:
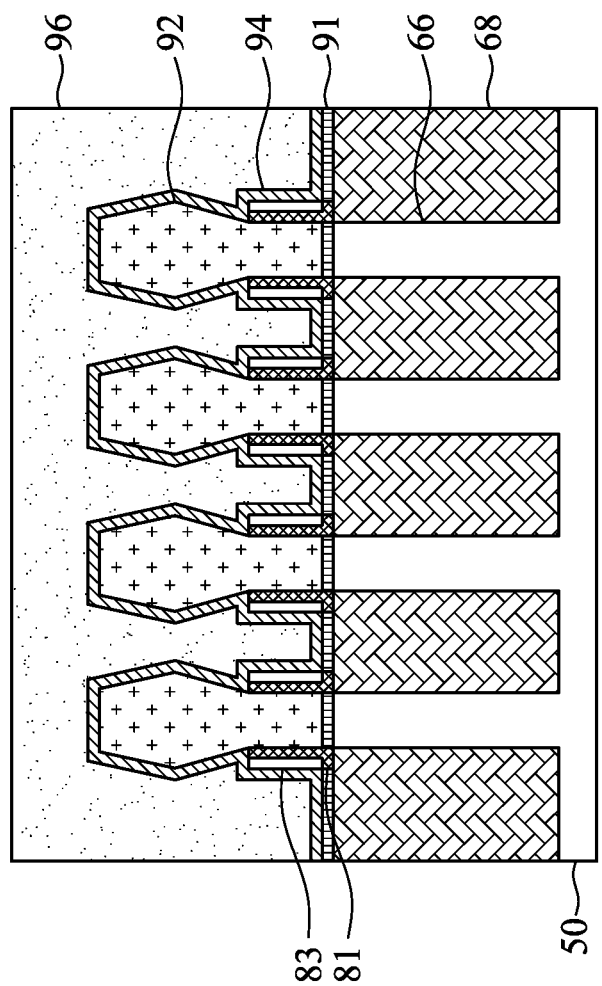
Figure 15A:
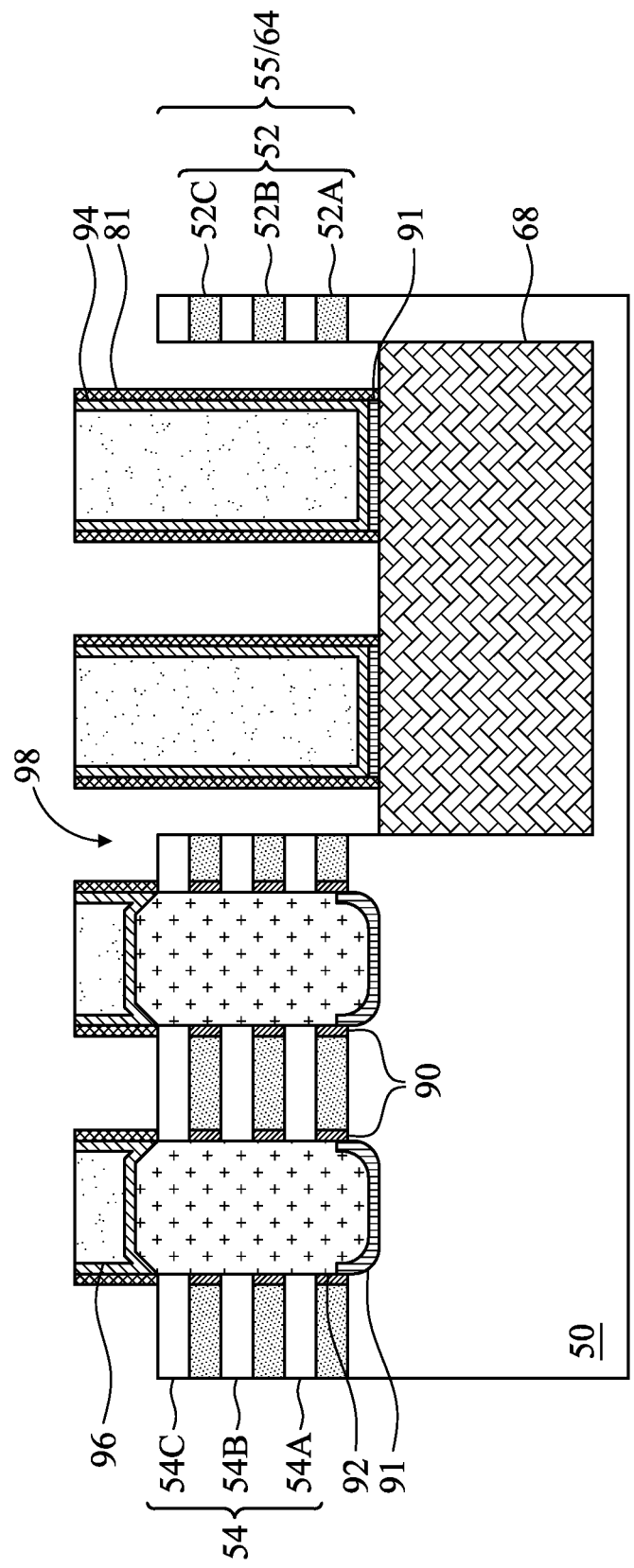
Figure 15B:
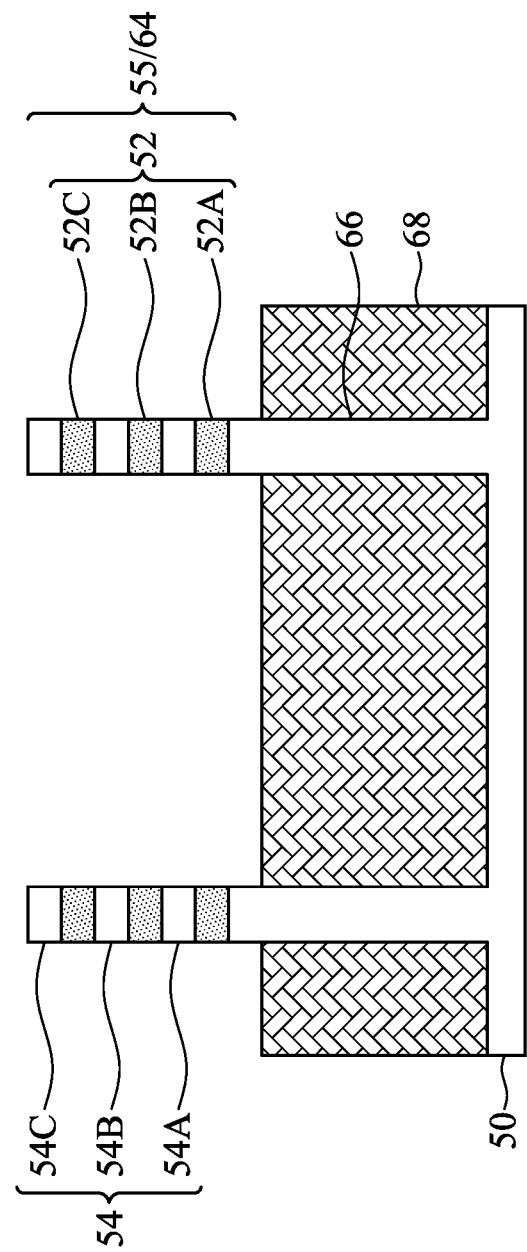
Figure 15C:
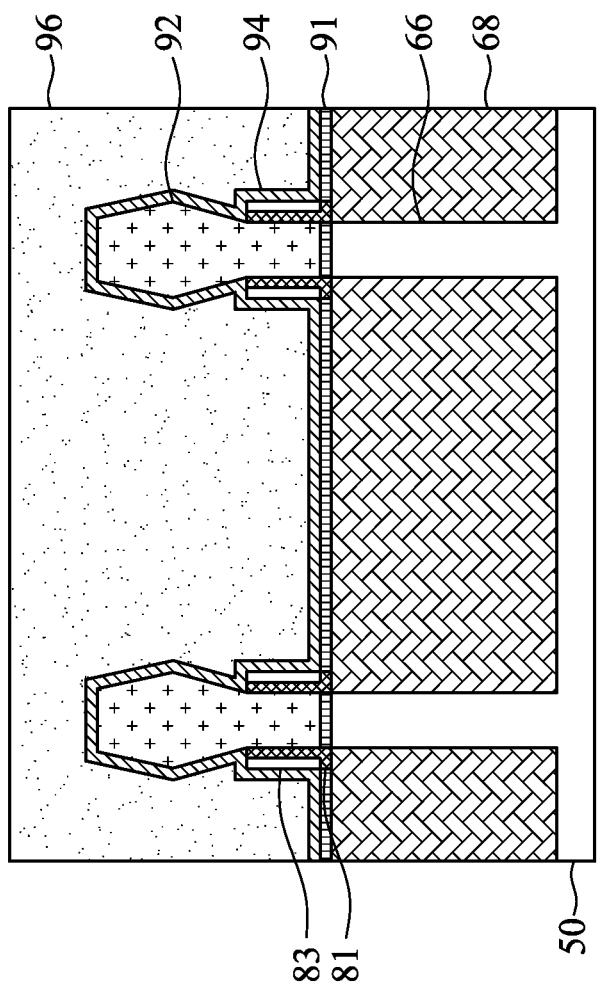
Figure 15D:
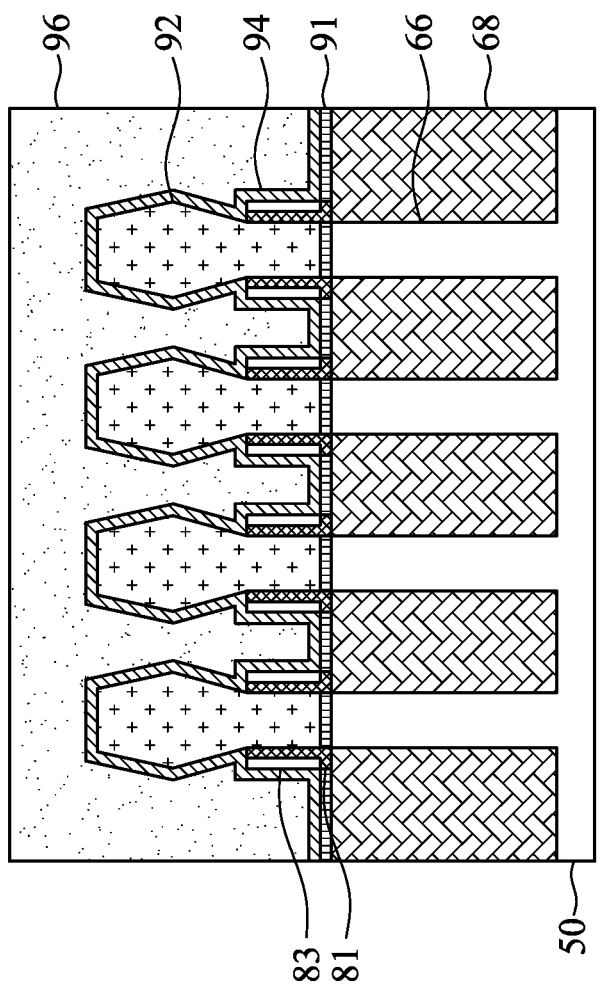
Figure 16A:
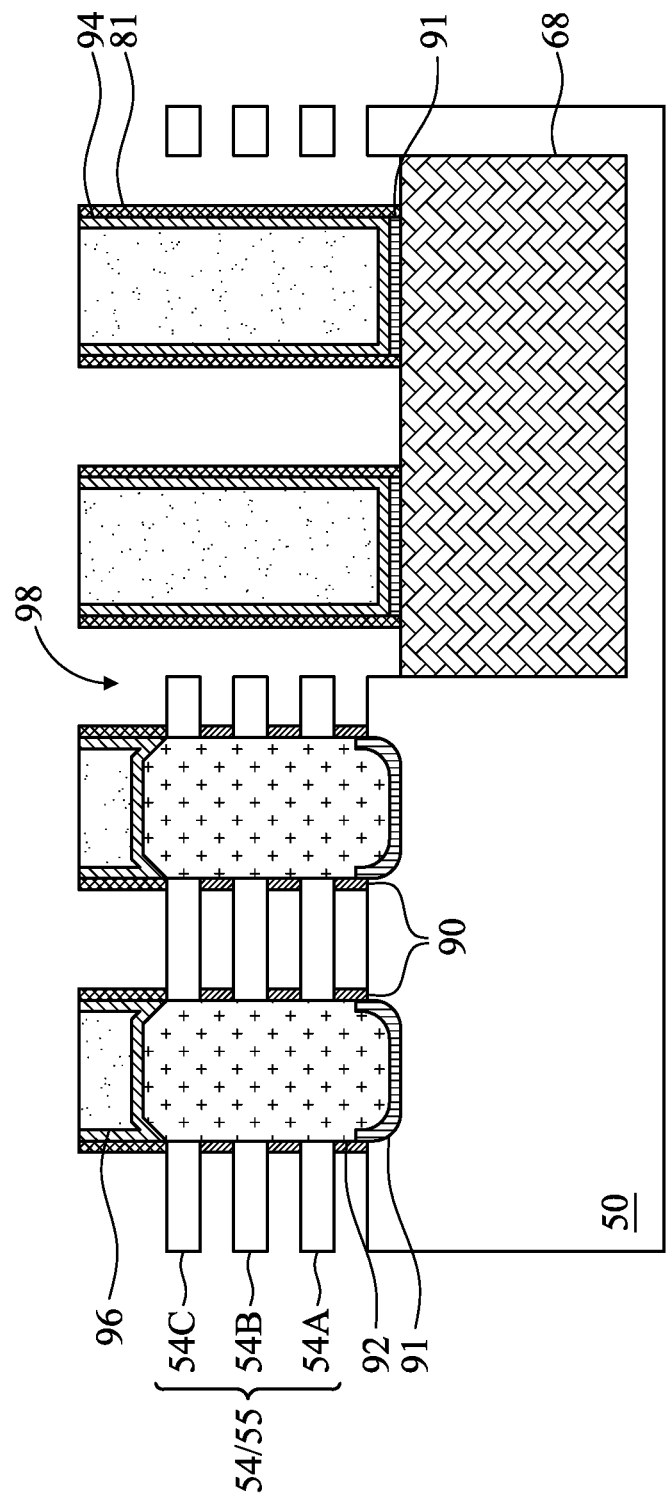
Figure 16B:
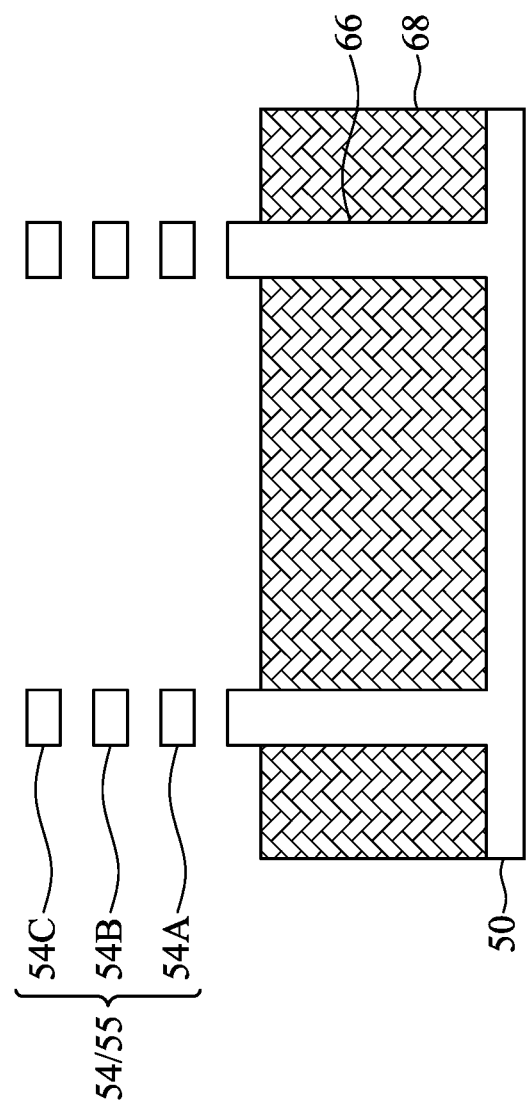
Figure 16C:
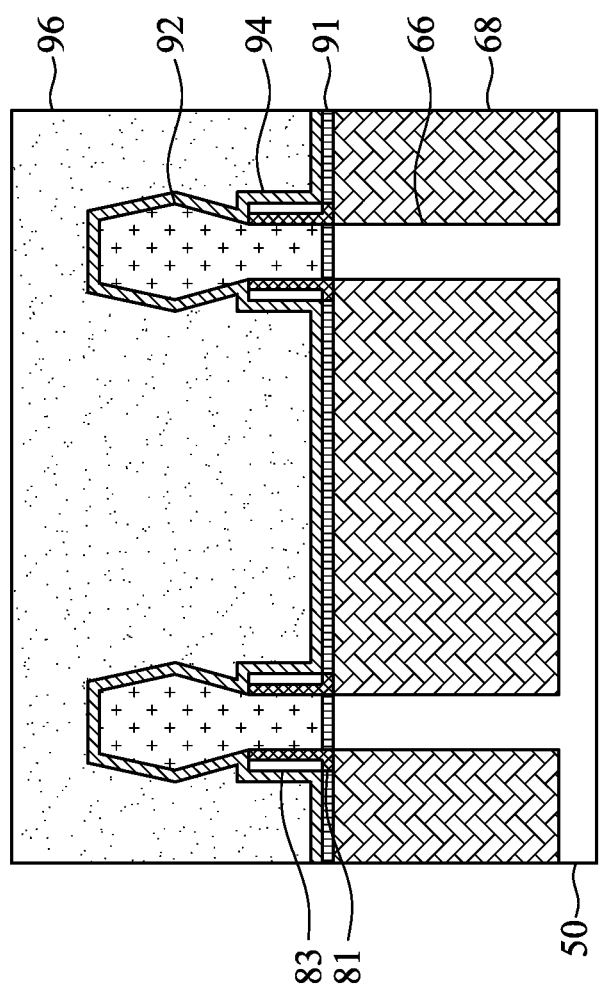
Figure 16D:
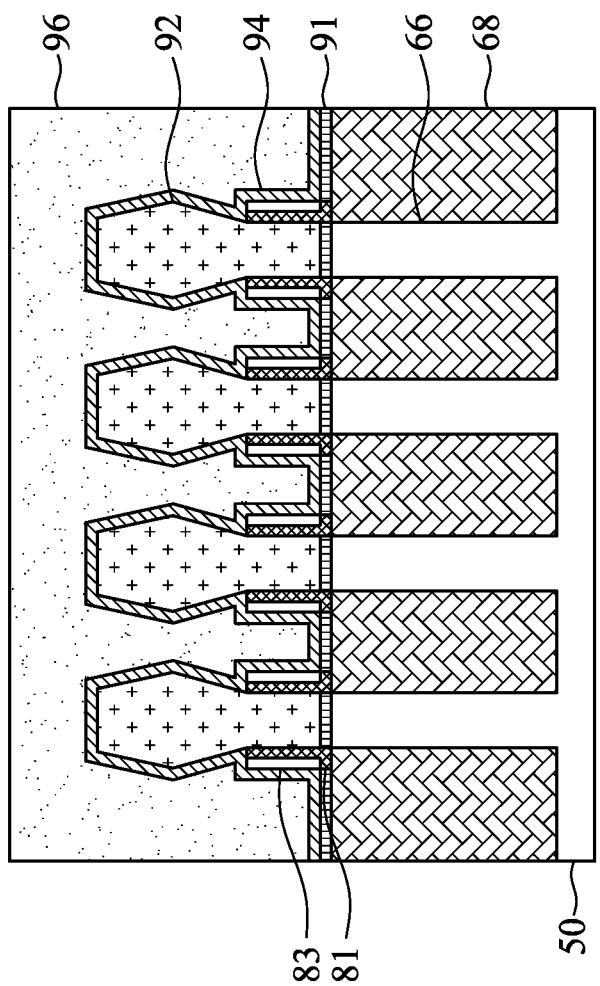

As a result of the epitaxy processes used to form the epitaxial source/drain regions 92 in the n-type region and the p-type region, upper surfaces of the epitaxial source/drain regions 92 have facets which expand laterally outward beyond sidewalls of the nanostructures 55. In some embodiments, these facets cause adjacent epitaxial source/drain regions 92 of a same nanostructure FET to merge as illustrated by FIG. 12E. In some embodiments, adjacent epitaxial source/drain regions 92 remain separated after the epitaxy process is completed as illustrated by FIG. 12D. In the embodiment illustrated in FIG. 12A, the isolation layers 91 may be formed along top surfaces of the fins 66 and the substrate 50 thereby blocking the epitaxial growth. Further, the first spacers 81 and the second spacers 83 may be formed to top surfaces of the STI regions 68 further thereby blocking the epitaxial growth. In some embodiments, the first spacers 81 and/or the second spacers 83 may cover portions of side surfaces of the nanostructures 55 further blocking the epitaxial growth. In some embodiments, the spacer etch used to form the first spacers 81 and/or the second spacers 83 may be adjusted to remove the spacer material to allow the epitaxially grown region to extend to top surfaces of the STI regions 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited on the first semiconductor material layer 92A, and the third semiconductor material layer 92C may be deposited on the second semiconductor material layer 92B.

In FIGS. 13A through 13D, a first interlayer dielectric (ILD) 96 is deposited on the structure illustrated in FIGS. 12A through 12D. The first ILD 96 may be formed of a dielectric material, and may be deposited by any suitable method, such as CVD, plasma-enhanced CVD (PECVD), or FCVD. Dielectric materials may include phosphosilicate glass (PSG), borosilicate glass (BSG), boron-doped phosphosilicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, the first spacers 81, the second spacers 83, and the isolation layers 91. The CESL 94 may comprise a dielectric material, such as, silicon nitride, silicon oxide, silicon oxynitride, or the like, having a different etch rate than the material of the overlying first ILD 96.

In FIGS. 14A through 14D, a planarization process, such as a CMP, is performed to level top surfaces of the first ILD 96 and the CESL 94 with top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, the first ILD 96, and the CESL 94 are level within process variations. Accordingly, the top surfaces of the dummy gates 76 are exposed through the first ILD 96 and the CESL 94. In some embodiments, the masks 78 may remain, in which case the planarization process levels top surfaces of the first ILD 96 and the CESL 94 with top surfaces of the masks 78 and the first spacers 81.

In FIGS. 15A through 15D, the dummy gates 76, and the masks 78 if present, are removed in one or more etching steps to form recesses 98. Portions of the dummy gate dielectrics 71 in the recesses 98 may also be removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 96, the CESL 94, or the first spacers 81. Some of the recesses 98 expose and/or overly portions of nanostructures 55, which act as channel regions in subsequently completed nanostructure FETs. Some of the recesses 98 expose and/or overly portions of the STI regions 68. Dummy gate structures may subsequently be formed in at least some of the recesses 98. Portions of the nanostructures 55 which act as the channel regions may be disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

In FIGS. 16A through 16D, the first nanostructures 52 are removed extending the recesses 98. The first nanostructures 52 may be removed by performing an isotropic etching process such as wet etching or the like using etchants which are selective to the materials of the first nanostructures 52, while the second nanostructures 54, the first spacers 81, the first ILD 96, the CESL 94, the substrate 50, the inner spacers 90, and the STI regions 68 remain relatively unetched as compared to the first nanostructures 52. In embodiments in which the first nanostructures 52 include, e.g., SiGe, and the second nanostructures 54 include, e.g., Si or SiC, tetramethylammonium hydroxide (TMAH), ammonium hydroxide ($NH_4OH$), or the like may be used to remove the first nanostructures 52.

In FIGS. 17A through 17D, gate dielectric layers 100 and gate electrodes 102 are formed for replacement gates. The gate dielectric layers 100 are deposited conformally in the recesses 98. The gate dielectric layers 100 may be formed on top surfaces and side surfaces of the fins 66 and the substrate 50; and on top surfaces, side surfaces, and bottom surfaces of the second nanostructures 54. The gate dielectric layers 100 may also be deposited on top surfaces of the first ILD 96, the CESL 94, and the STI regions 68; and on top surfaces and side surfaces of the first spacers 81.

In some embodiments, the gate dielectric layers 100 comprise one or more dielectric layers, such as an oxide, a metal oxide, the like, or combinations thereof. For example, in some embodiments, the gate dielectric layers 100 may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region and the p-type region. The formation methods of the gate dielectric layers 100 may include molecular-beam deposition (MBD), ALD, PECVD, and the like.

Figure 17A:
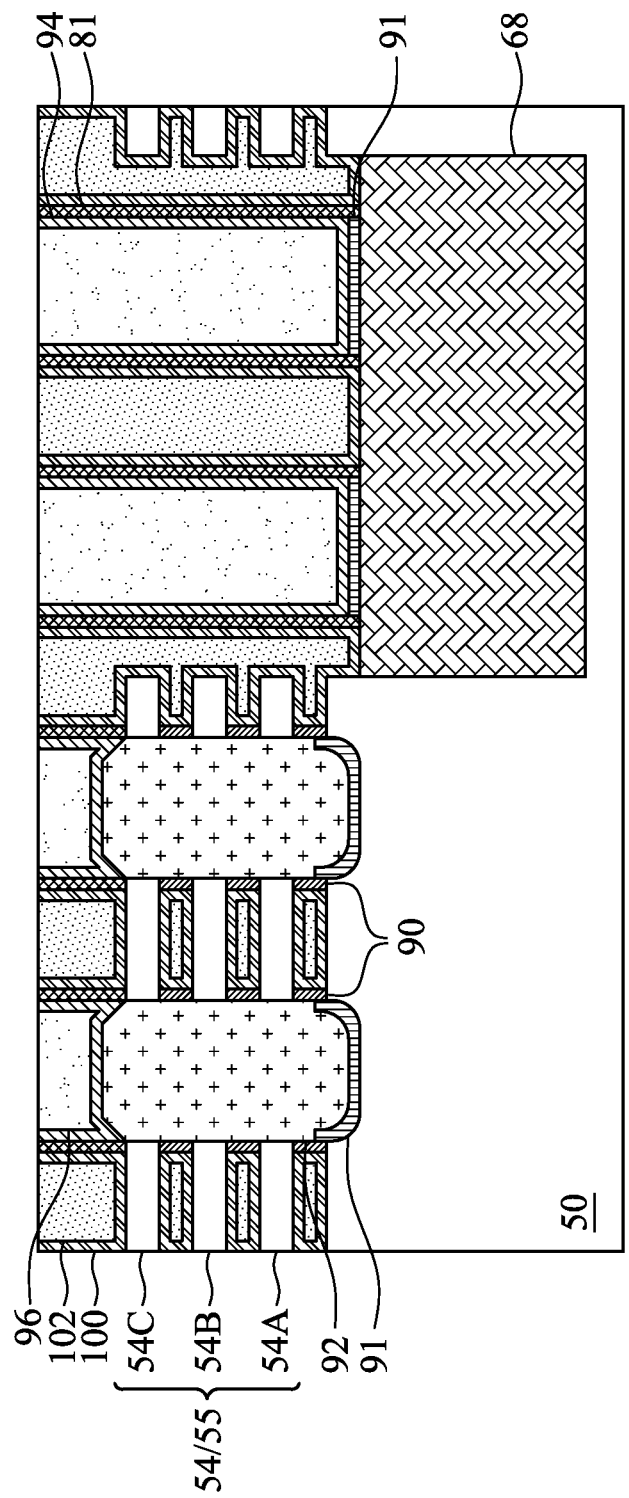
Figure 17B:
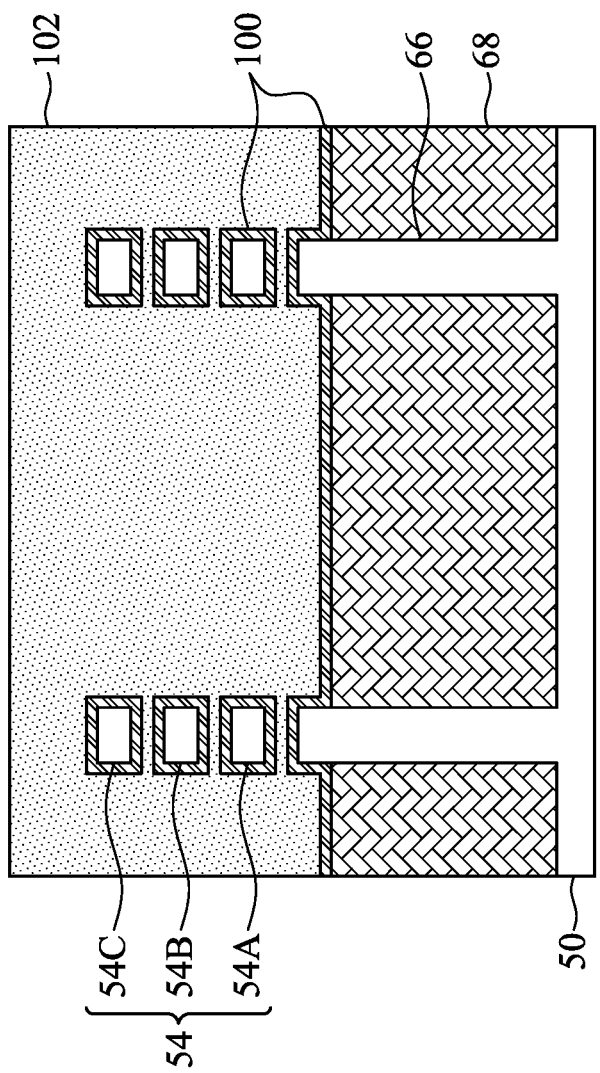
Figure 17C:
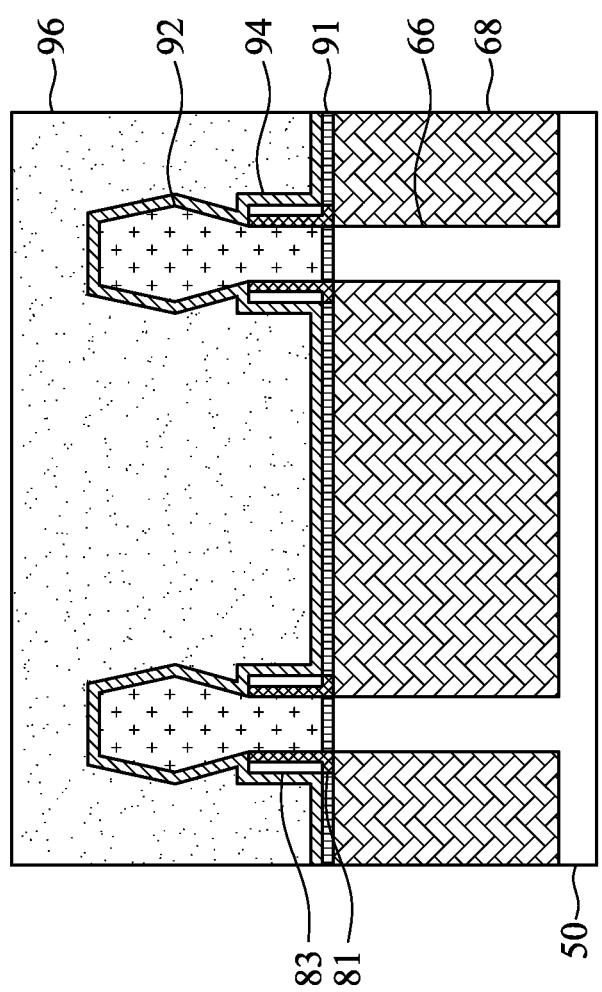
Figure 17D:
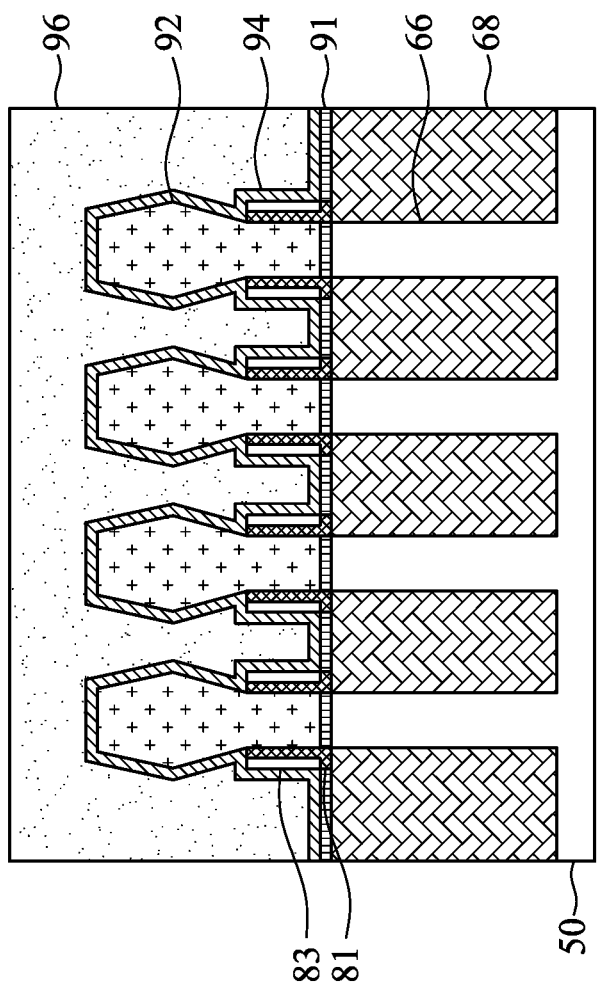

The gate electrodes 102 are deposited on the gate dielectric layers 100 and fill remaining portions of the recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. Although single-layer gate electrodes 102 are illustrated in FIGS. 17A and 17B, the gate electrodes 102 may comprise any number of liner layers, any number of work function tuning layers, and a fill material. Any combination of the layers which make up the gate electrodes 102 may be deposited between adjacent ones of the second nanostructures 54 and between the second nanostructure 54A and the substrate 50.

The formation of the gate dielectric layers 100 in the n-type region and the p-type region may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the recesses 98, a planarization process, such as a CMP, may be performed to remove the excess portions of the gate dielectric layers 100 and the gate electrodes 102, which excess portions are over top surfaces of the first ILD 96, the first spacers 81, and the CESL 94. The remaining portions of the gate electrodes 102 and the gate dielectric layers 100 thus form replacement gate structures of the resulting nanostructure FETs. The gate electrodes 102 and the gate dielectric layers 100 may be collectively referred to as "gate structures" or "gate stacks."

Figure 18A:
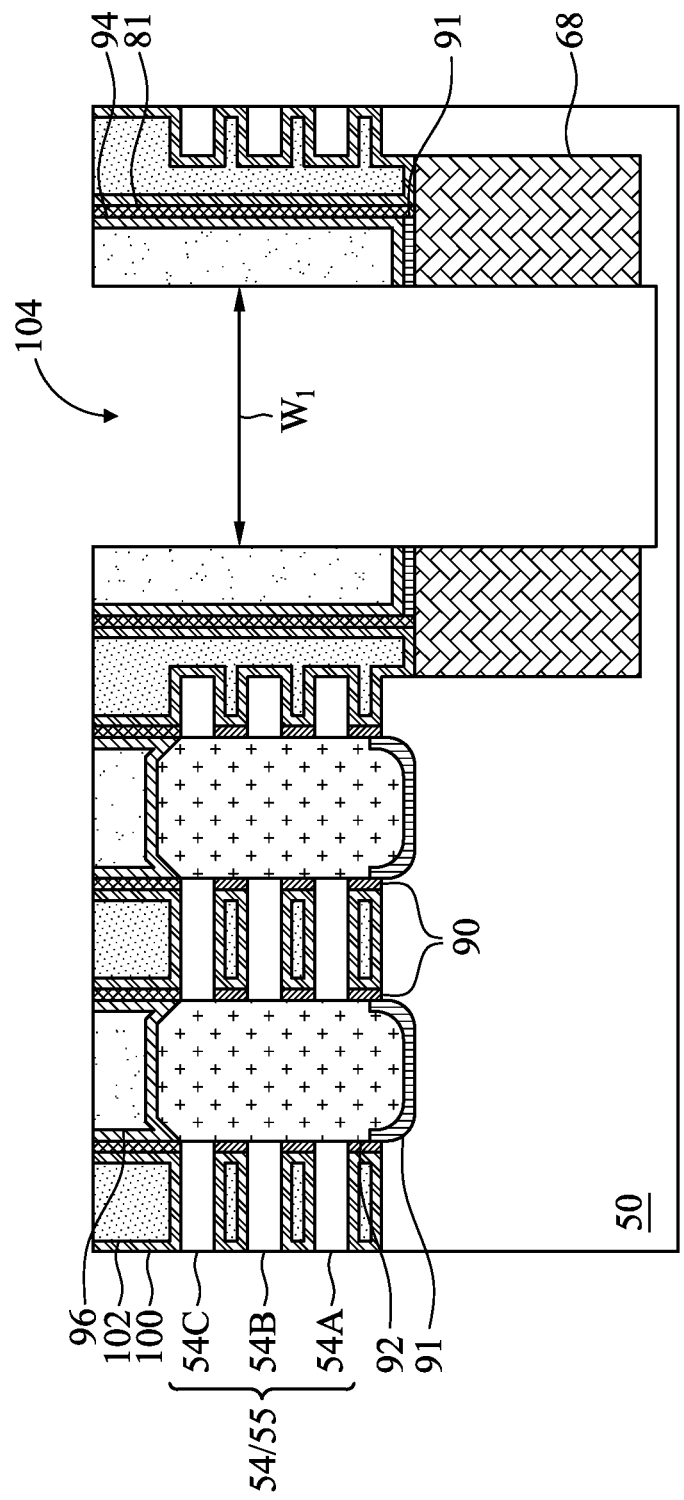
Figure 18B:
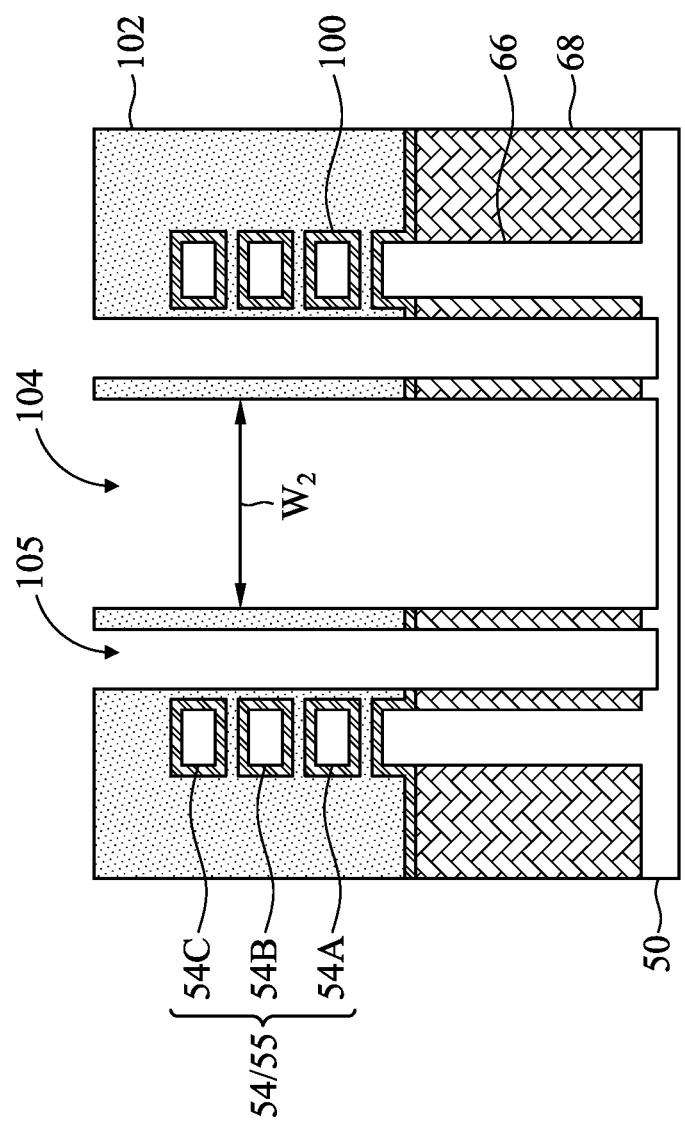
Figure 18C:
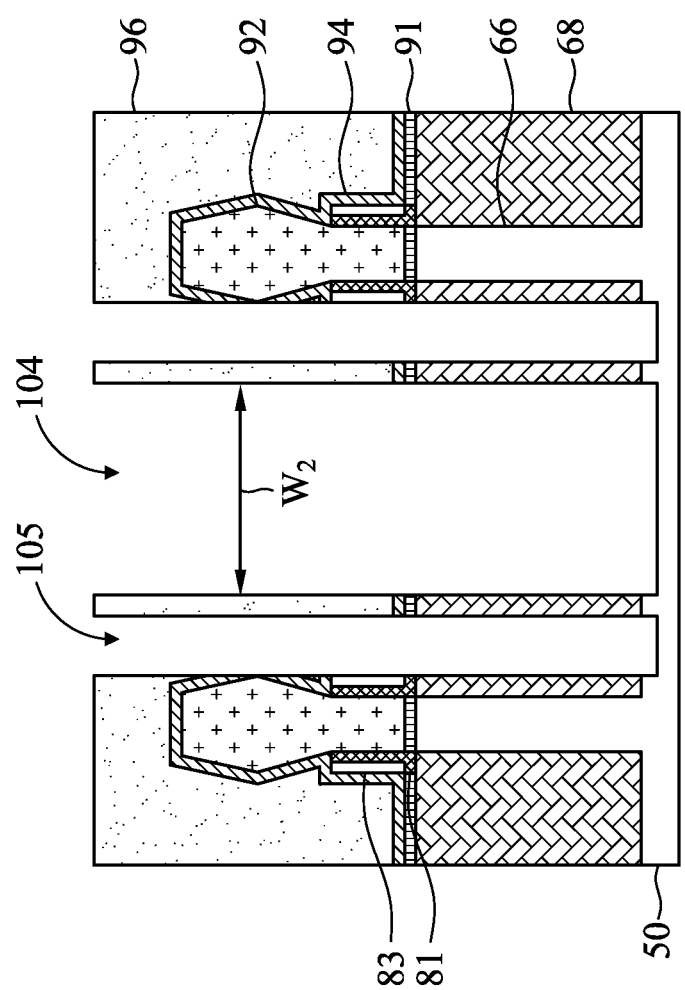
Figure 18D:
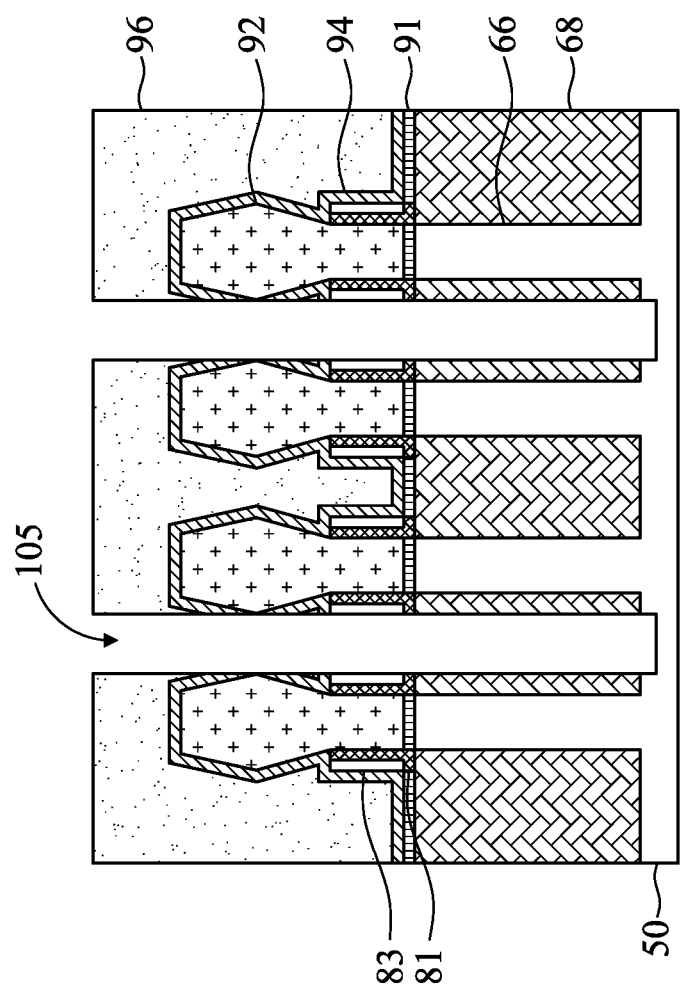
Figure 19A:
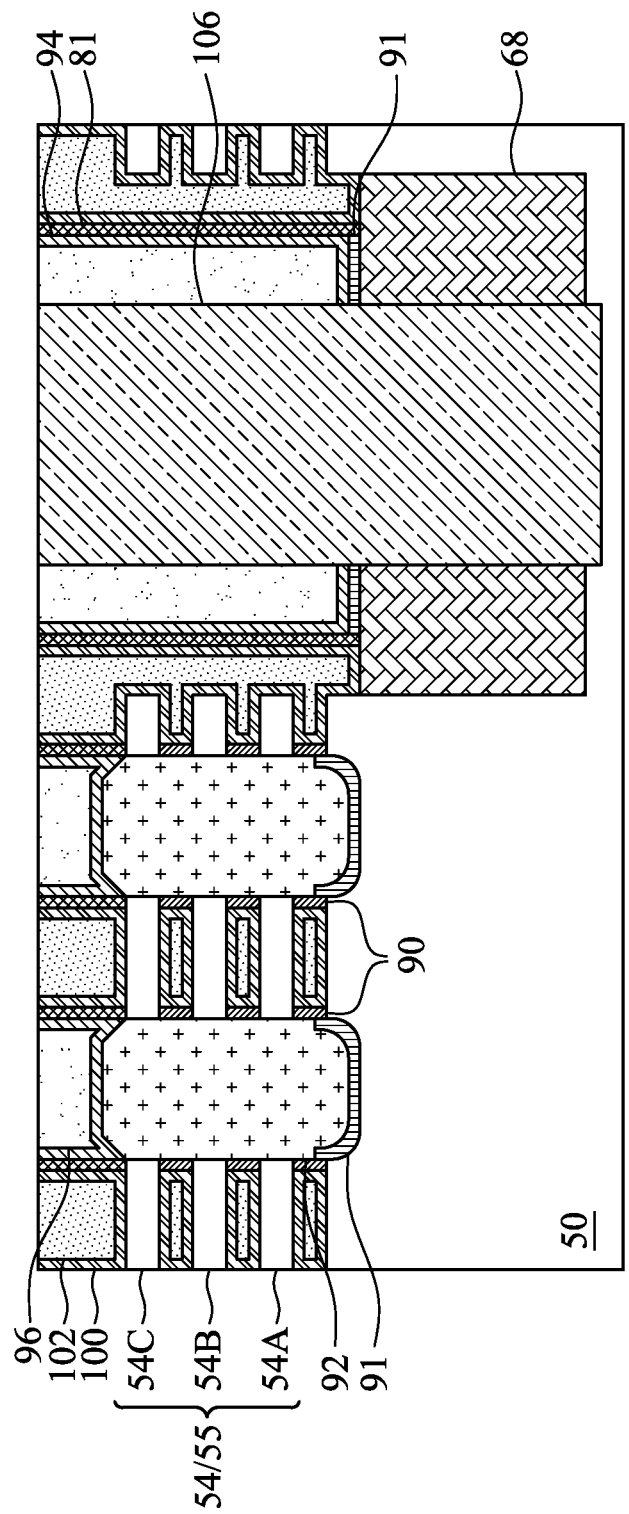
Figure 19B:
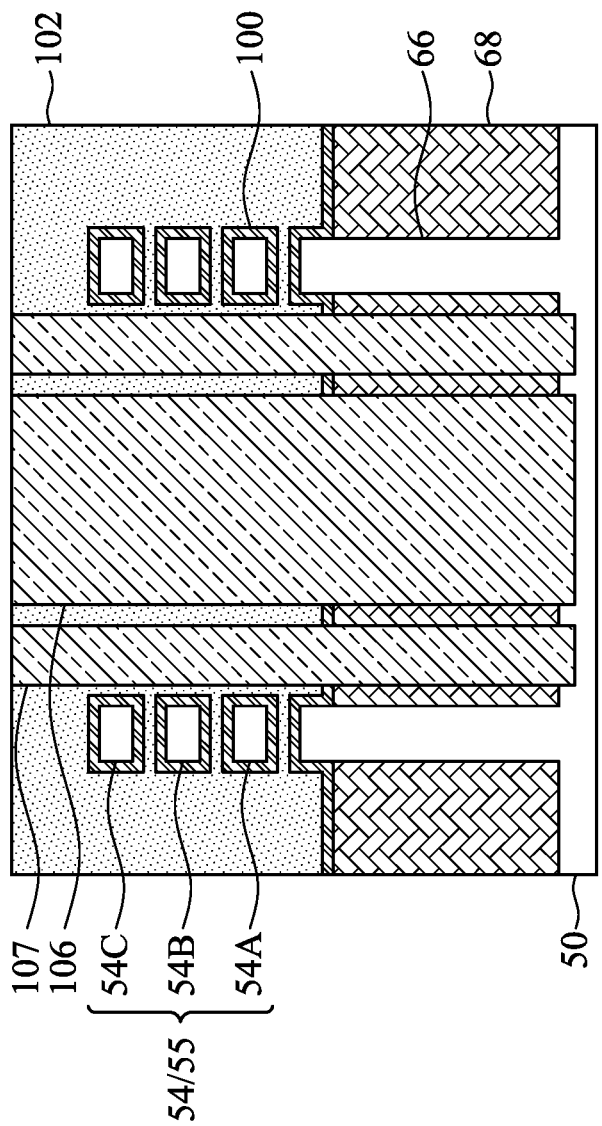
Figure 19C:
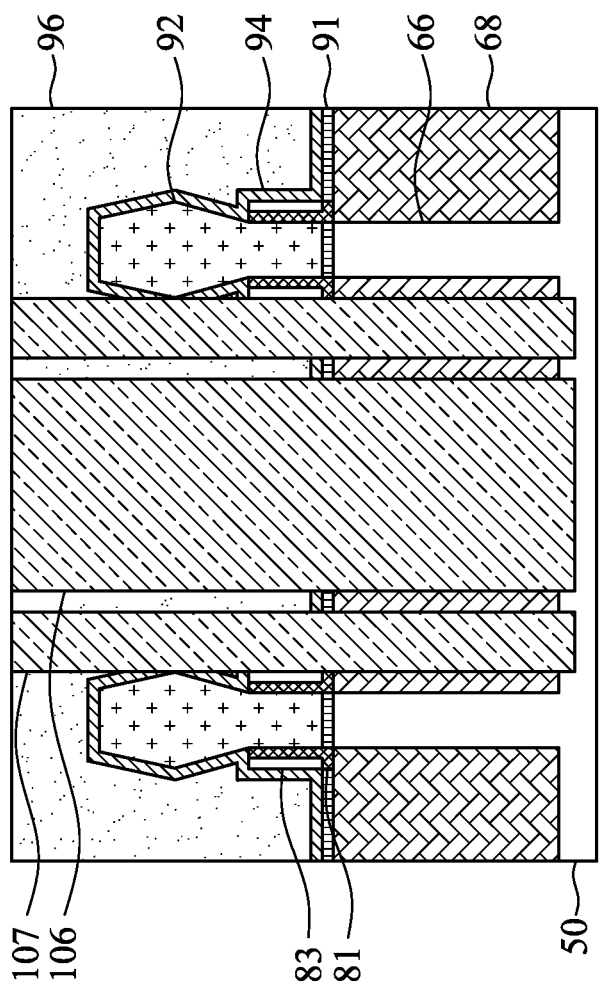
Figure 19D:
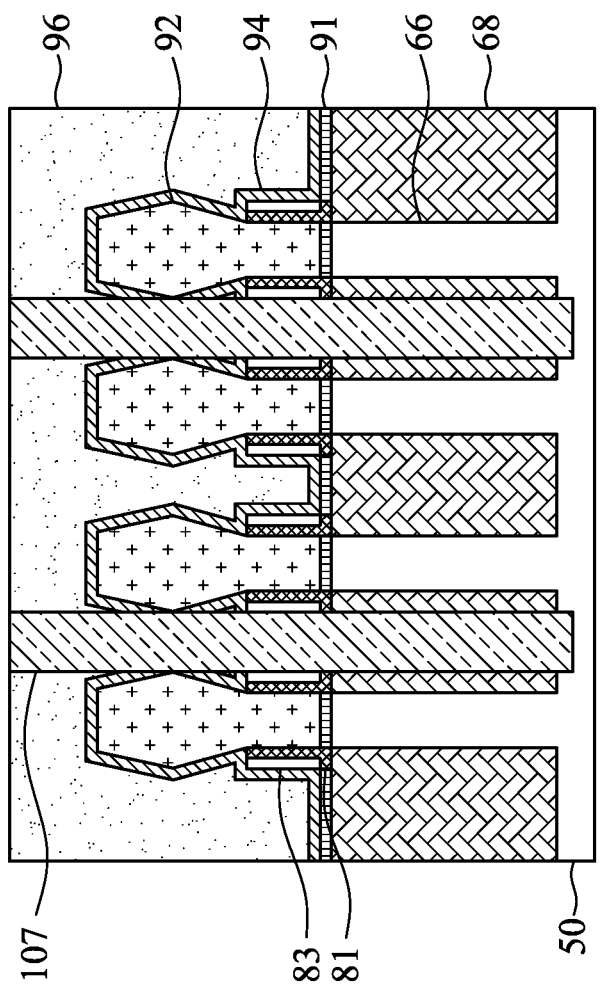
Figure 20A:
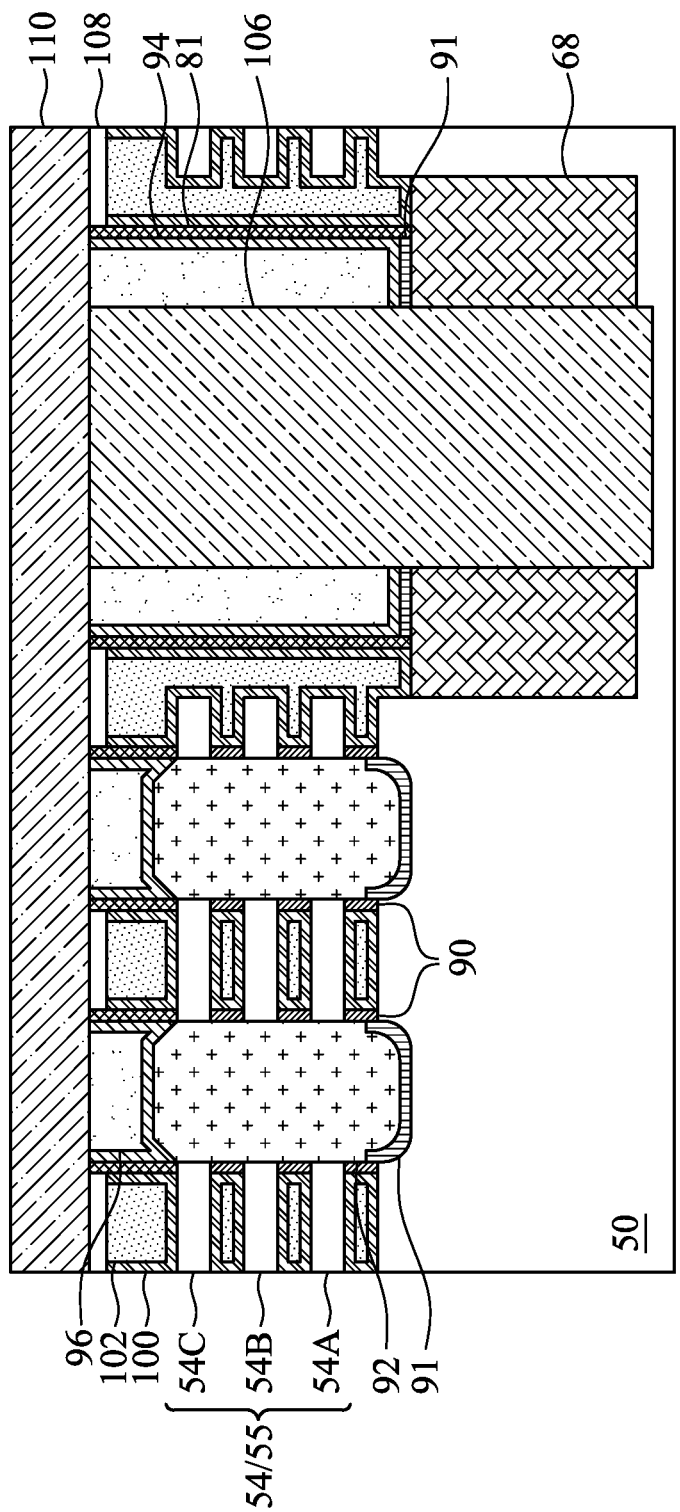
Figure 20B:
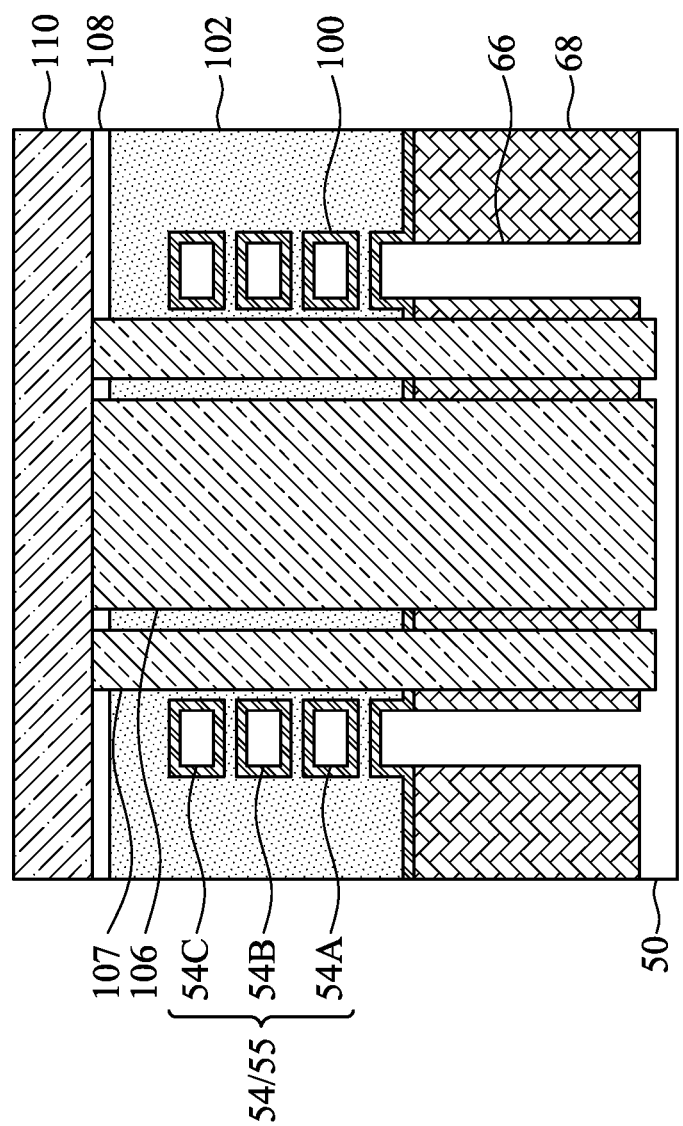
Figure 20C:
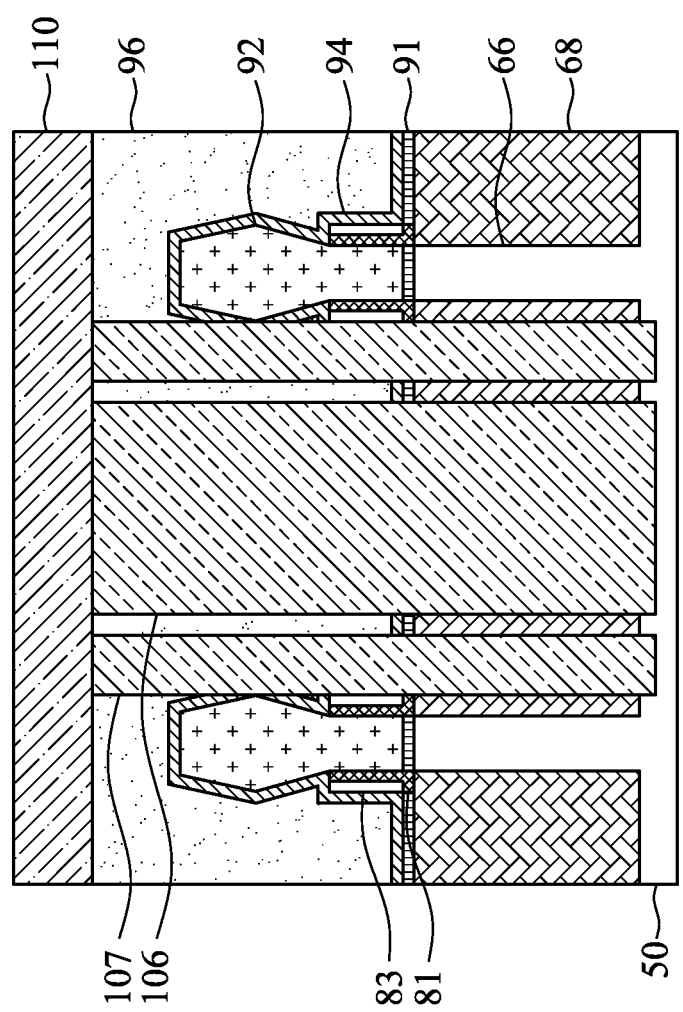
Figure 20D:
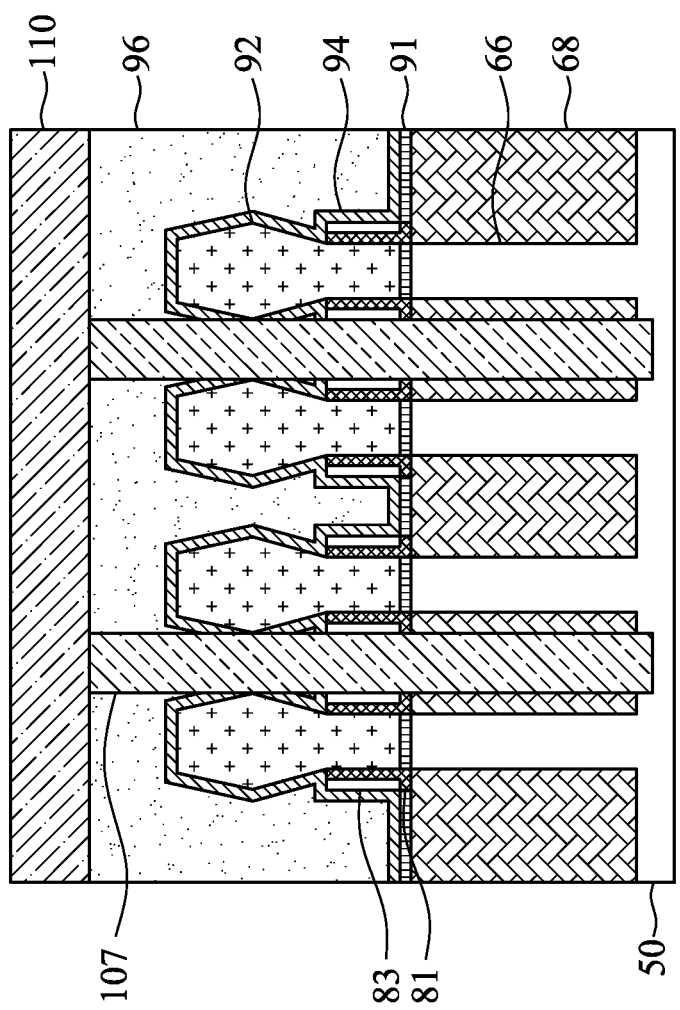
Figure 21A:
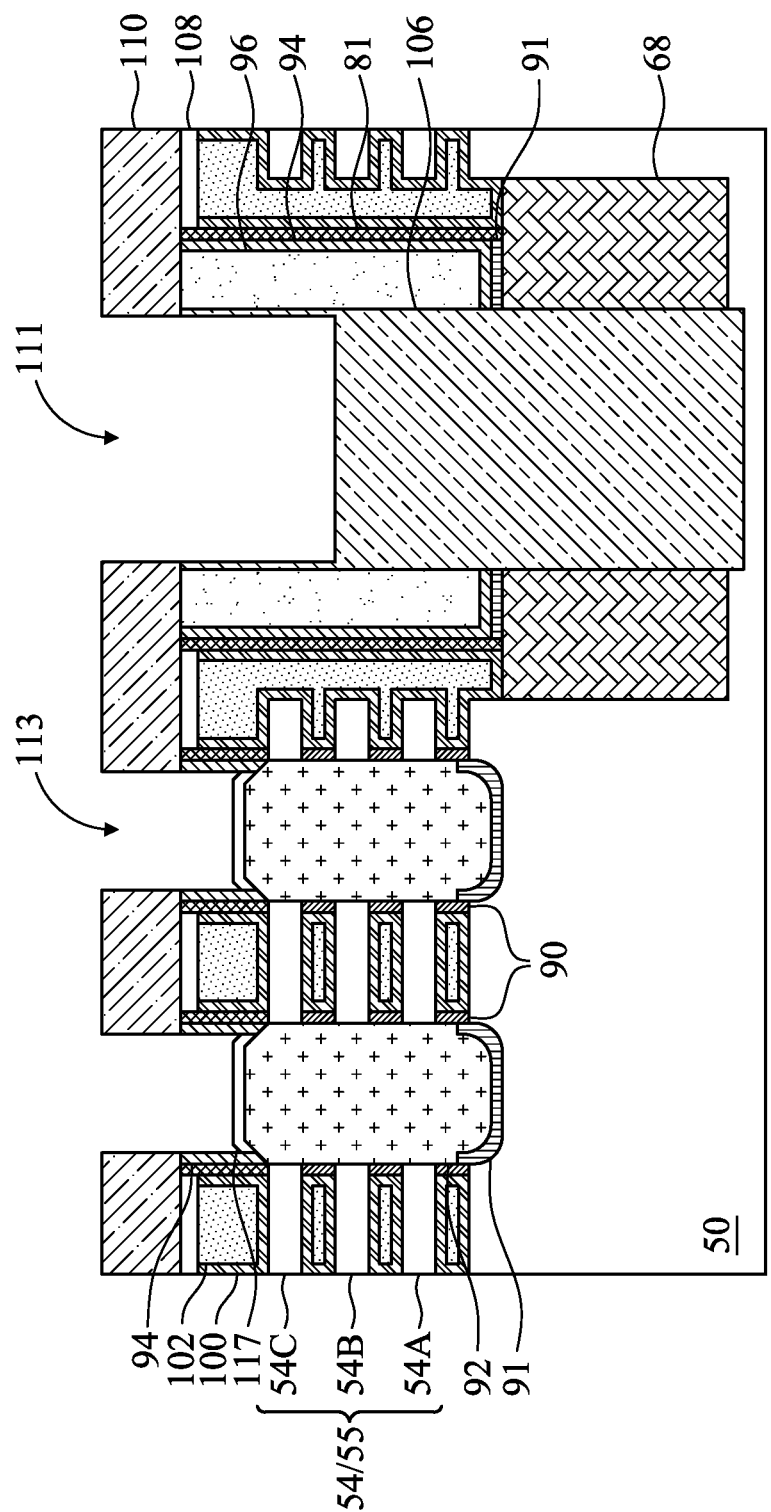
Figure 21B:
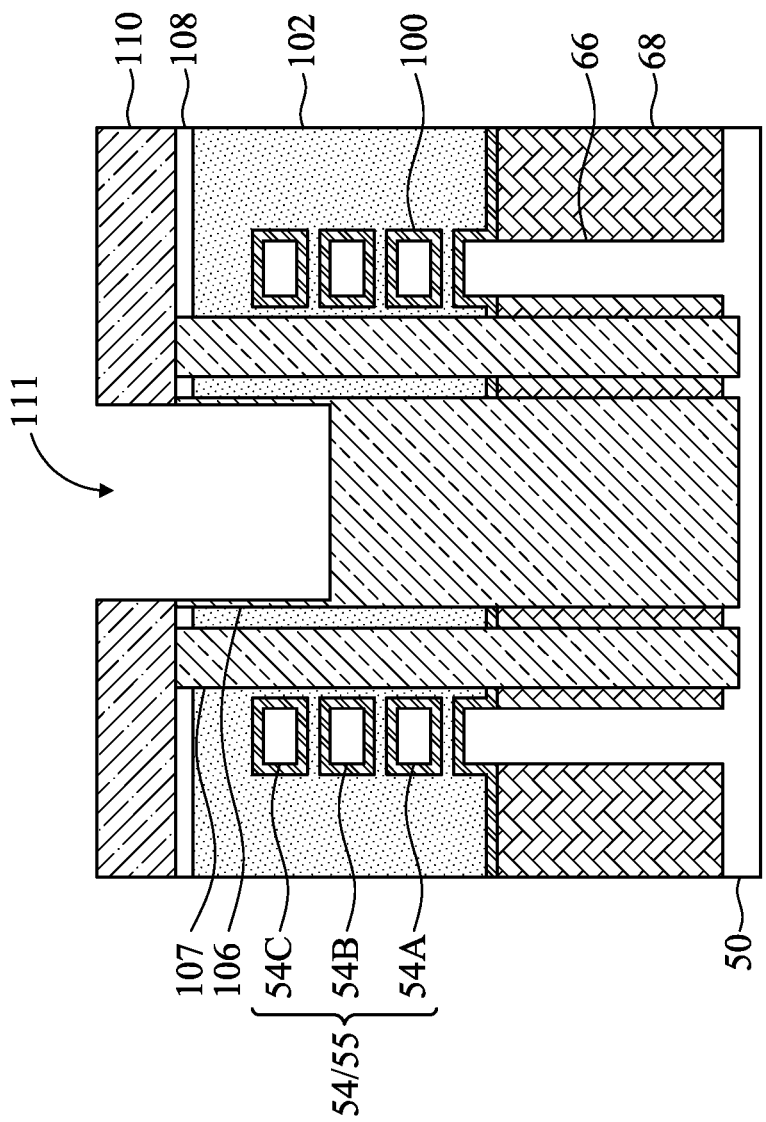
Figure 21C:
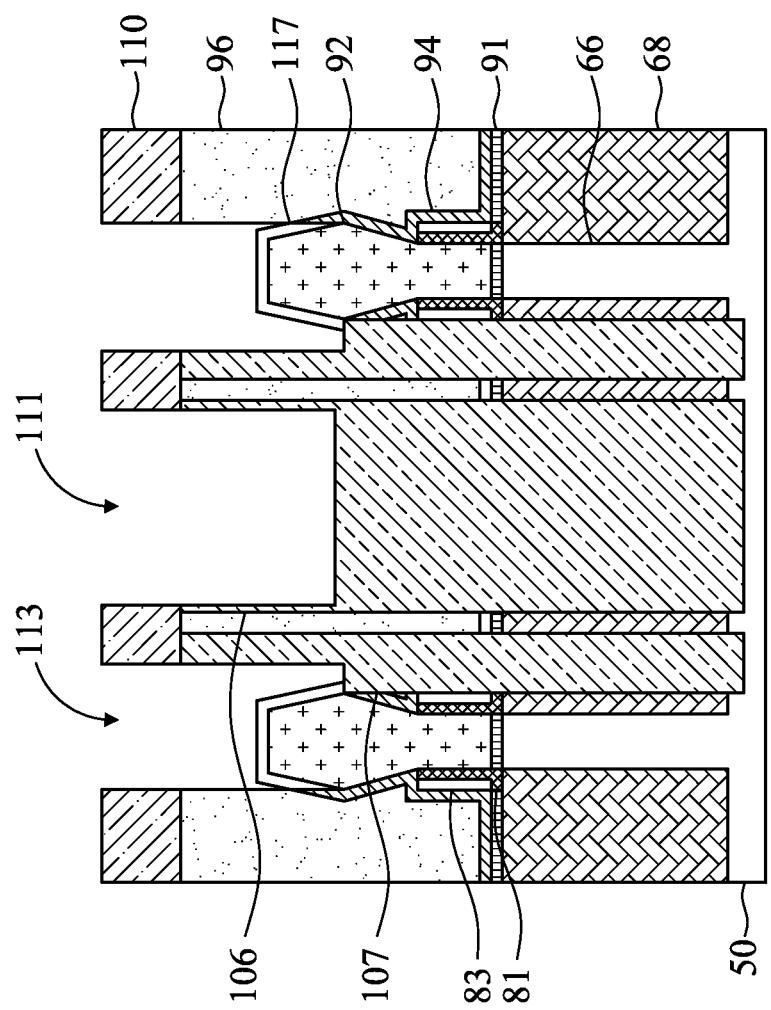
Figure 21D:
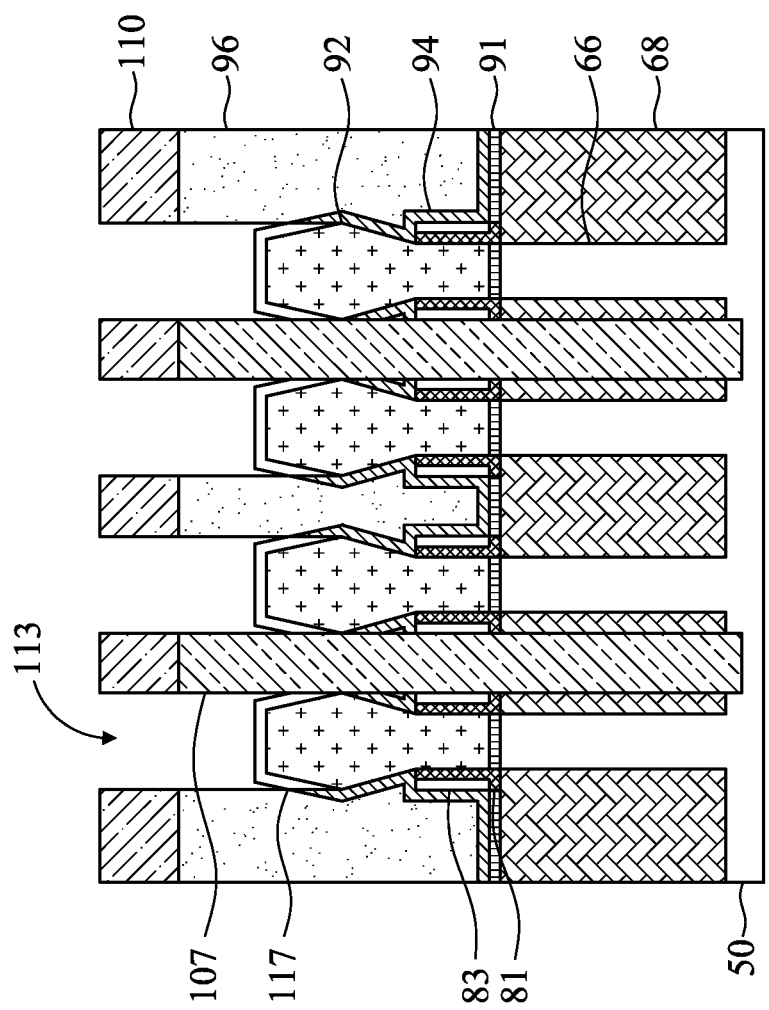

In FIGS. 18A through 18D, feedthrough trenches 104 and gate isolation trenches 105 are formed extending through the first ILD 96, the CESL 94, the isolation layers 91, the STI regions 68, the gate electrodes 102, and the gate dielectric layers 100 and into the substrate 50. The feedthrough trenches 104 may be used in self-aligned processes to form feedthrough structures. The feedthrough structures provide electrical coupling between a front-side and a backside of the substrate 50. The gate isolation trenches 105 may be used to separate the gate structures (including the gate electrodes 102 and the gate dielectric layers 100) into separate and electrically isolated gate structures. Although a gate structure is illustrated as being separated into three gate structures, the gate structures may be separated into any number of gate structures. As illustrated in FIGS. 18C and 18D, the gate isolation trenches 105 may extend through the first ILD 96 and the CESL 94 adjacent the epitaxial source/drain regions 92. In some embodiments, the gate isolation trenches 105 may be separated from the epitaxial source/drain regions 92 by the CESL 94 and/or the first ILD 96. In some embodiments, the gate isolation trenches 105 may extend at least partially through the epitaxial source/drain regions 92.

The feedthrough trenches 104 and the gate isolation trenches 105 may be formed by suitable photolithography and etching processes. For example, a patterned mask (not separately illustrated), such as a patterned photoresist, may be formed on the gate structures, the first spacers 81, the CESL 94, and the first ILD 96. The patterned mask may be formed by depositing one or more mask layers using spin-on coating, CVD, PVD, or the like. The mask layers may be patterned by exposing a photoresist layer to a patterned energy source (e.g., a patterned light source) and developing the photoresist layer to remove an exposed or unexposed portion of the photoresist layer, thereby forming a patterned photoresist. Suitable etch processes, such as an anisotropic etch processes (e.g., a dry etch process) or the like, may be used to pattern the mask layers and form the patterned mask, and may be used to pattern the feedthrough trenches 104 and the gate isolation trenches 105. The etching may include multiple cycles using various etchants effective for the removal of the various materials of the first ILD 96, the CESL 94, the isolation layers 91, the STI regions 68, the gate electrodes 102, the gate dielectric layers 100, and the substrate 50. In some embodiments, bottom surfaces of the feedthrough trenches 104 and the gate isolation trenches 105 may be in the STI regions 68 or on surfaces of the substrate 50 and may not penetrate the substrate 50. The patterned mask may be removed after patterning the feedthrough trenches 104 and the gate isolation trenches 105.

In some embodiments, the feedthrough trenches 104 and the gate isolation trenches 105 may extend into the substrate a depth ranging from about 10 nm to about 50 nm. The feedthrough trenches 104 may have widths W1 in the cross-section illustrated in FIG. 18A in a range from about 20 nm to about 60 nm and the feedthrough trenches 104 may have widths W2 in the cross-section illustrated in FIG. 18C in a range from about 35 nm to about 130 nm or in a range from about 20 nm to about 100 nm. Horizontal distances between the feedthrough trenches 104 and the gate structures, the fins 66, and the nanostructures 55 may be greater than about 15 nm. Providing the feedthrough trenches 104 with the above-described dimensions provides isolation between subsequently formed feedthrough vias and the gate structures, the fins 66, and the nanostructures 55, reduces reliability issues caused by time-dependent dielectric breakdown (TDDB) and the like, and prevents shorting between the feedthrough vias and the gate structures, the fins 66, and the nanostructures 55.

In FIGS. 19A through 19D, feedthrough isolation structures 106 are formed in the feedthrough trenches 104 and gate isolation structures 107 are formed in the gate isolation trenches 105. The feedthrough isolation structures 106 and the gate isolation structures 107 may be deposited by CVD, FCVD, ALD, or the like. The feedthrough isolation structures 106 and the gate isolation structures 107 may be formed of materials including silicon oxide, silicon oxygen carbide, aluminum oxide, aluminum oxygen nitride, zirconium oxide, hafnium oxide, titanium oxide, zirconium aluminum oxide, zinc oxide, silicon oxygen carbon nitride, silicon carbon nitride, combinations or multiple layers thereof, or the like, and may be deposited to a thickness in a range from about 20 nm to about 50 nm. A planarization process, such as a CMP, may be performed to remove excess material of the feedthrough isolation structures 106 and the gate isolation structures 107 from surfaces of the first ILD 96, the CESL 94, the gate electrodes 102, the gate dielectric layers 100, and the first spacers 81.

In FIGS. 20A through 20D, the gate structures (including the gate dielectric layers 100 and the gate electrodes 102) are recessed, so that recesses are formed directly over the gate structures and between opposing portions of first spacers 81. Gate caps 108 comprising one or more layers of dielectric material, such as silicon nitride, silicon oxynitride, or the like, are filled in the recesses, followed by a planarization process to remove excess portions of the dielectric material extending on the first ILD 96, the CESL 94, the gate electrodes 102, the gate dielectric layers 100, and the first spacers 81. Subsequently formed gate contacts (such as the gate contacts 116, discussed below with respect to FIGS. 22A through 22D) penetrate through the gate caps 108 to contact top surfaces of the recessed gate electrodes 102.

Further in FIGS. 20A through 20D, a second ILD 110 is deposited on the first ILD 96, the CESL 94, the first spacers 81, the gate dielectric layers 100, the gate electrodes 102, and the gate caps 108. In some embodiments, the second ILD 110 is a flowable film formed by FCVD. In some embodiments, the second ILD 110 is formed of a dielectric material such as PSG, BSG, BPSG, USG, or the like, and may be deposited by any suitable method, such as CVD, PECVD, or the like.

In FIGS. 21A through 21D, the second ILD 110, the first ILD 96, the CESL 94, the gate caps 108, the feedthrough isolation structures 106, and the gate isolation structures 107 are etched. The second ILD 110 and the feedthrough isolation structures 106 are etched to form front-side via recesses 111 extending partially through the feedthrough isolation structures 106. The second ILD 110, the first ILD 96, the CESL 94, and the gate isolation structures 107 are etched to form source/drain recesses 113 exposing surfaces of the epitaxial source/drain regions 92. The front-side via recesses 111 and the source/drain recesses 113 may be formed by etching using an anisotropic etching process, such as RIE, NBE, or the like. In some embodiments, the front-side via recesses 111 and the source/drain recesses 113 may be etched through the second ILD 110 and the first ILD 96 using a first etching process; may be etched through the gate caps 108 using a second etching process; and may be etched through the CESL 94 using a third etching process. A mask, such as a photoresist, may be formed and patterned over the second ILD 110 to mask portions of the second ILD 110 from the first etching process and the second etching process. In some embodiments, the etching process may over-etch such that the source/drain recesses 113 extend into the epitaxial source/drain regions 92. Bottom surfaces of the source/drain recesses 113 may be level with (e.g., at a same level, or having a same distance from the substrate 50), or lower than (e.g., closer to the substrate 50) the epitaxial source/drain regions 92 and/or the gate structure.

The front-side via recesses 111 and the source/drain recesses 113 may be formed in the same cross-section, or in different cross-sections. Forming the front-side via recesses 111 and the source/drain recesses 113 in different cross-sections may reduce the risk of shorting subsequently formed contacts. After the source/drain recesses 113 are formed, silicide regions 117 are formed on the epitaxial source/drain regions 92. In some embodiments, the silicide regions 117 are formed by first depositing a metal (not separately illustrated) capable of reacting with the semiconductor materials of the underlying epitaxial source/drain regions 92 (e.g., silicon, silicon germanium, germanium, or the like) to form silicide or germanide regions, such as nickel, cobalt, titanium, tantalum, platinum, tungsten, other noble metals, other refractory metals, rare earth metals or their alloys, on the exposed portions of the epitaxial source/drain regions 92. A thermal anneal process is performed to form the silicide regions 117. Unreacted portions of the deposited metal are removed, e.g., by an etching process. Although the silicide regions 117 are referred to as silicide regions, the silicide regions 117 may also be germanide regions, or silicon germanide regions (e.g., regions comprising silicide and germanide). In some embodiments, the silicide regions 117 comprise TiSi, and have thicknesses in a range from about 1 nm to about 10 nm. In some embodiments, the silicide regions 117 may comprise TiSi, CrSi, TaSi, MoSi, ZrSi, HfSi, ScSi, Ysi, HoSi, TbSi, GdSi, LuSi, DySi, ErSi, YbSi, NiSi, CoSi, MnSi, WSi, FeSi, RhSi, PdSi, RuSi, PtSi, IrSi, OsSi, combinations thereof, or the like.

In FIGS. 22A through 22E, front-side vias 112 and source/drain contacts 114 (each of which may be referred to as contact plugs) including liner layers 119 are formed in the front-side via recesses 111 and the source/drain recesses 113, respectively. FIG. 22E illustrates a top-down view in which only the front-side vias 112, the source/drain contacts 114, the liner layers 119, the gate structures, the gate isolation structures 107, the fins 66, the epitaxial source/drain regions 92, and the feedthrough isolation structures 106 are shown. The front-side vias 112 and the source/drain contacts 114 may each comprise one or more layers, such as barrier layers, diffusion layers, and fill materials. For example, in some embodiments, the front-side vias 112 and the source/drain contacts 114 each include a liner layer 119 and a conductive material. The conductive material of the source/drain contacts 114 is electrically coupled to the underlying conductive features (e.g., the epitaxial source/drain regions 92 through the silicide regions 117 in the illustrated embodiment). The source/drain contacts 114 are electrically coupled to the epitaxial source/drain regions 92 through the silicide regions 117. The front-side vias 112 may be subsequently electrically coupled to backside vias to form feedthrough vias, which provide connections between the front-side of the substrate 50 and the backside of the substrate 50. The liner layers 119 may include titanium, titanium nitride, tantalum, tantalum nitride, or the like. The liner layers 119 may extend along and contact side surfaces of the second ILD 110, the CESL 94, the first ILD 96, the feedthrough isolation structures 106, and the gate isolation structures 107. The conductive material may be copper, a copper alloy, silver, gold, tungsten, cobalt, aluminum, nickel, or the like.

A planarization process, such as a CMP, may be performed to remove excess material of the front-side vias 112 and the source/drain contacts 114 from surfaces of the second ILD 110. In some embodiments, a source/drain contact 114 partially overlaps an adjacent gate isolation structure 107, as shown in FIG. 22C. In some embodiments, a source/drain contact 114 does not overlap an adjacent gate isolation structure 107, as shown in FIG. 22D.

Additionally, gate contacts 116 are formed to the gate electrodes 102 of the gate structures. The gate contacts 116 are formed through the second ILD 110 and the gate caps 108 in accordance with some embodiments. Openings for the gate contacts 116 are formed through the second ILD 110 and the gate caps 108. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 110. The remaining liner and conductive material form the gate contacts 116 in the openings. The gate contacts 116 are physically and electrically coupled to the gate electrodes 102. The source/drain contacts 114 and the gate contacts 116 may be formed in different processes, or may be formed in the same process. Although shown as being formed in the same cross-sections, it should be appreciated that each of the source/drain contacts 114 and gate contacts 116 may be formed in different cross-sections, which may avoid shorting of the contacts.

The front-side via recesses 111 and the front-side vias 112 may be formed with widths smaller than the widths W1 and W2 of the feedthrough isolation structures 106. For example, the front-side vias 112 may have widths W3 between the liner layers 119 in the cross-section illustrated in FIG. 22A in a range from about 5 nm to about 30 nm and the front-side vias 112 may have widths W4 between the liner layers 119 in the cross-section illustrated in FIG. 22C in a range from about 5 nm to about 30 nm. This ensures that the front-side via recesses 111 and the front-side vias 112 are formed within the feedthrough isolation structures 106, even in the cases of misalignments of the front-side via recesses 111 and the front-side vias 112. For example, distances between outer edges of the front-side via recesses 111 and the front-side vias 112 and outer edges of the feedthrough isolation structures 106 may be in a range from about 5 nm to about 15 nm. This prevents the front-side via recesses 111 and the front-side vias 112 from being formed outside of the feedthrough isolation structures 106. This allows for the feedthrough isolation structures 106 to provide isolation between the front-side vias 112 and the gate structures, the fins 66, and the nanostructures 55, reduces reliability issues caused by time-dependent dielectric breakdown (TDDB) and the like, and prevents shorting between the front-side vias 112 and the gate structures, the fins 66, and the nanostructures 55.

In FIGS. 23A through 23D, a front-side interconnect structure 120 is formed on the second ILD 110, the front-side vias 112, the source/drain contacts 114, and the gate contacts 116. The front-side interconnect structure 120 may be referred to as a front-side interconnect structure because it is formed on a front-side of the substrate 50 (e.g., a side of the substrate 50 on which active devices are formed).

The front-side interconnect structure 120 may comprise one or more layers of conductive features 124 formed in one or more stacked dielectric layers 122. Each of the stacked dielectric layers 122 may comprise a dielectric material, such as a low-k dielectric material, an extra low-k (ELK) dielectric material, or the like. The dielectric layers 122 may be deposited using an appropriate process, such as, CVD, ALD, PVD, PECVD, or the like.

The conductive features 124 may comprise conductive lines and conductive vias interconnecting the layers of conductive lines. The conductive vias may extend through respective ones of the dielectric layers 122 to provide vertical connections between layers of the conductive lines. The conductive features 124 may be formed through any acceptable process, such as, a damascene process, a dual damascene process, or the like.

In some embodiments, the conductive features 124 may be formed using a damascene process in which a respective dielectric layer 122 is patterned utilizing a combination of photolithography and etching techniques to form trenches corresponding to the desired pattern of the conductive features 124. An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the conductive features 124 may be formed by depositing a seed layer of copper or a copper alloy, and filling the trenches by electroplating. A chemical mechanical planarization (CMP) process or the like may be used to remove excess conductive material from a surface of the respective dielectric layer 122 and to planarize surfaces of the dielectric layer 122 and the conductive features 124 for subsequent processing.

FIGS. 23A through 23D illustrate four layers of the conductive features 124 and the dielectric layers 122 in the front-side interconnect structure 120. However, it should be appreciated that the front-side interconnect structure 120 may comprise any number of conductive features 124 disposed in any number of dielectric layers 122. The front-side interconnect structure 120 may be electrically coupled to the front-side vias 112, the source/drain contacts 114, and the gate contacts 116 to form functional circuits. In some embodiments, the functional circuits formed by the front-side interconnect structure 120 may comprise logic circuits, memory circuits, image sensor circuits, or the like.

In FIGS. 24A through 24D, a carrier substrate 150 is bonded to a top surface of the front-side interconnect structure 120 by a first bonding layer 152A and a second bonding layer 152B (collectively referred to as a bonding layer 152). The carrier substrate 150 may be a glass carrier substrate, a ceramic carrier substrate, a wafer (e.g., a silicon wafer), or the like. The carrier substrate 150 may provide structural support during subsequent processing steps and in the completed device.

In various embodiments, the carrier substrate 150 may be bonded to the front-side interconnect structure 120 using a suitable technique, such as dielectric-to-dielectric bonding, or the like. The dielectric-to-dielectric bonding may comprise depositing the first bonding layer 152A on the front-side interconnect structure 120. In some embodiments, the first bonding layer 152A comprises silicon oxide (e.g., a high density plasma (HDP) oxide, or the like) that is deposited by CVD, ALD, PVD, or the like. The second bonding layer 152B may likewise be an oxide layer that is formed on a surface of the carrier substrate 150 prior to bonding using, for example, CVD, ALD, PVD, thermal oxidation, or the like. Other suitable materials may be used for the first bonding layer 152A and the second bonding layer 152B.

The dielectric-to-dielectric bonding process may further include applying a surface treatment to one or more of the first bonding layer 152A and the second bonding layer 152B. The surface treatment may include a plasma treatment. The plasma treatment may be performed in a vacuum environment. After the plasma treatment, the surface treatment may further include a cleaning process (e.g., a rinse with deionized water or the like) that may be applied to one or more of the bonding layers 152. The carrier substrate 150 is then aligned with the front-side interconnect structure 120 and the two are pressed against each other to initiate a pre-bonding of the carrier substrate 150 to the front-side interconnect structure 120. The pre-bonding may be performed at room temperature (e.g., between about 21° C. and about 25° C.). After the pre-bonding, an annealing process may be applied by, for example, heating the front-side interconnect structure 120 and the carrier substrate 150 to a temperature of about 170° C.

Further in FIGS. 24A through 24D, after the carrier substrate 150 is bonded to the front-side interconnect structure 120, the device may be flipped such that a backside of the substrate 50 faces upwards. The backside of the substrate 50 may refer to a side opposite to the front-side of the substrate 50 on which the active devices are formed.

In FIGS. 25A through 25D, a thinning process is applied to the backside of the substrate 50. The thinning process may comprise a planarization process (e.g., a mechanical grinding, a CMP, or the like), an etch-back process, a combination thereof, or the like. The thinning process may remove portions of the substrate 50, the STI regions 68, the fins 66, and/or the feedthrough isolation structures 106, and may expose surfaces of the substrate 50, the STI regions 68, the fins 66, and the feedthrough isolation structures 106 opposite the front-side interconnect structure 120. As illustrated in FIGS. 25A through 25D, backside surfaces of the substrate 50, the STI regions 68, the fins 66, and the feedthrough isolation structures 106 may be level with one another following the thinning process. The thinning process may be applied such that the STI regions 68 have heights H1 in a range from about 30 nm to about 70 nm. The feedthrough isolation structures 106 may have heights H2 in a range from about 80 nm to about 200 nm. Thinning the STI regions 68 to heights less than the prescribed range may cause subsequently formed backside vias to be too close to the gate electrodes 102, which can lead to device defects. Thinning the STI regions 68 to heights greater than the prescribed range may cause the subsequently formed backside vias and feedthrough vias to have too great of lengths and be difficult to form due to high aspect ratios, which increases resistance, decreases device performance, and increases device defects.

In FIGS. 26A through 26D, a dielectric layer 130 is formed on the substrate 50, the STI regions 68, the fins 66, and the feedthrough isolation structures 106. The dielectric layer 130 may be deposited using an appropriate process, such as, CVD, ALD, PVD, PECVD, or the like. The dielectric layer 130 may comprise a dielectric material, silicon oxide, hafnium silicide, silicon oxygen carbide, aluminum oxide, zirconium silicide, aluminum oxygen nitride, zirconium oxide, hafnium oxide, titanium oxide, zirconium aluminum oxide, zinc oxide, tantalum oxide, lanthanum oxide, yttrium oxide, tantalum carbon nitride, silicon nitride, silicon oxygen carbon nitride, silicon, zirconium nitride, silicon carbon nitride, combinations or multiple layers thereof, or the like. In some embodiments, the dielectric layer 130 may be deposited to a thickness in a range from about 5 nm to about 40 nm.

Further in FIGS. 26A through 26D, the dielectric layer 130, the feedthrough isolation structures 106, the substrate 50, the fins 66, and the isolation layers 91 are etched. The dielectric layer 130 and the feedthrough isolation structures 106 are etched to form backside via recesses 132 extending through the feedthrough isolation structures 106, partially through the feedthrough isolation structures 106, and exposing the front-side vias 112. The dielectric layer 130, the substrate 50, the fins 66, and the isolation layers 91 are etched to form backside via recesses 134 extending through the dielectric layer 130, the substrate 50, the fins 66, and the isolation layers 91 and exposing the epitaxial source/drain regions 92.

The backside via recesses 132 and the backside via recesses 134 may be formed by etching using an anisotropic etching process, such as RIE, NBE, or the like. In some embodiments, the backside via recesses 132 and the backside via recesses 134 may be etched through the dielectric layer 130 and the feedthrough isolation structures 106 using a first etching process; the backside via recesses 134 may be etched through the substrate 50 and the fins 66 using a second etching process; and the backside via recesses 134 may be etched through the isolation layers 91 using a third etching process. A mask, such as a photoresist, may be formed and patterned on the dielectric layer 130 to mask portions of the dielectric layer 130 from any of the first etching process, the second etching process, and the third etching process. In some embodiments, the etching process may over-etch such that top surfaces of the feedthrough isolation structures 106 are below top surfaces of the front-side vias 112 (in the orientation illustrated in FIGS. 26A through 26D) and the backside via recesses 134 extend into the epitaxial source/drain regions 92. Bottom surfaces of the backside via recesses 132 and the backside via recesses 134 may be level with (e.g., at a same level, or having a same distance from the substrate 50), or lower than (e.g., closer to the substrate 50) the front-side vias 112 and the epitaxial source/drain regions 92. In the embodiment illustrated in FIGS. 26A through 26D, the backside via recesses 132 and the backside via recesses 134 may be etched by processes that are selective to materials of the liner layers 119, such that the liner layers 119 remain relatively un-etched.

The backside via recesses 132 and the backside via recesses 134 may be formed in the same cross-section, or in different cross-sections. Forming the backside via recesses 132 and the backside via recesses 134 in different cross-sections may reduce the risk of shorting subsequently formed contacts. After the backside via recesses 134 are formed, silicide regions 135 are formed on the epitaxial source/drain regions 92. In some embodiments, the silicide regions 135 are formed by first depositing a metal (not separately illustrated) capable of reacting with the semiconductor materials of the underlying epitaxial source/drain regions 92 (e.g., silicon, silicon germanium, germanium, or the like) to form silicide or germanide regions, such as nickel, cobalt, titanium, tantalum, platinum, tungsten, other noble metals, other refractory metals, rare earth metals or their alloys, on the exposed portions of the epitaxial source/drain regions 92. A thermal anneal process is performed to form the silicide regions 135. Unreacted portions of the deposited metal are removed, e.g., by an etching process. Although the silicide regions 135 are referred to as silicide regions, the silicide regions 135 may also be germanide regions, or silicon germanide regions (e.g., regions comprising silicide and germanide). In some embodiments, the silicide regions 135 comprise TiSi, and have thicknesses in a range from about 1 nm to about 10 nm. In some embodiments, the silicide regions 135 may comprise TiSi, CrSi, TaSi, MoSi, ZrSi, HfSi, ScSi, Ysi, HoSi, TbSi, GdSi, LuSi, DySi, ErSi, YbSi, NiSi, CoSi, MnSi, WSi, FeSi, RhSi, PdSi, RuSi, PtSi, IrSi, OsSi, combinations thereof, or the like. The silicide regions 135 may comprise the same or different materials from the silicide regions 117.

In FIGS. 27A through 27E, liner layers 137 are formed in the backside via recesses 132 and the backside via recesses 134, backside vias 136 are formed on the liner layers 137 in the backside via recesses 132, and backside vias 138 are formed on the liner layers 137 in the backside via recesses 134. FIG. 27E illustrates a top-down view in which only the backside vias 136, the backside vias 138, the liner layers 137, the liner layers 119, the front-side vias 112, the gate structures, the gate isolation structures 107, the fins 66, the epitaxial source/drain regions 92, and the feedthrough isolation structures 106 are shown. The liner layers 137 in the backside via recesses 132 extend along surfaces of the STI regions 68, the isolation layers 91, the CESL 94, the first ILD 96, the feedthrough isolation structures 106, and the front-side vias 112. The liner layers 137 in the backside via recesses 134 extend along surfaces of the substrate 50, the fins 66, the isolation layers 91, the silicide regions 135, and the STI regions 68. The backside vias 136 and the backside vias 138 extend through and along surfaces of the dielectric layer 130.

The liner layers 137 may be deposited by CVD, ALD, PVD, or the like, and may be etched using an anisotropic etch process or the like prior to depositing the backside vias 136 and the backside vias 138. The backside vias 136 and the backside vias 138 may each comprise one or more layers, such as barrier layers, diffusion layers, and fill materials, in addition to or in place of the liner layers 137. The backside vias 136 are electrically coupled to the front-side vias 112. The backside vias 136 may be T-shaped in a cross-sectional view, and may include a stair-step structure at an interface between the dielectric layer 130 and the STI regions 68.

The backside vias 138 are electrically coupled to the epitaxial source/drain regions 92 through the silicide regions 135. The liner layers 137 may include titanium, titanium nitride, tantalum, tantalum nitride, or the like. The backside vias 136 and the backside vias 138 may include copper, a copper alloy, silver, gold, tungsten, cobalt, aluminum, nickel, ruthenium, titanium, titanium nitride, tantalum, tantalum nitride, molybdenum, or the like. The backside vias 136 and the backside vias 138 may be formed of materials and in a manner the same as or similar to the source/drain contacts 114, described above with respect to FIGS. 23A through 23D. A planarization process, such as a CMP, may be performed to remove excess portions of the liner layers 137, the backside vias 136, and the backside vias 138, which excess portions are over top surfaces of the dielectric layer 130. The planarization process may also thin the dielectric layer 130. Following the planarization process, the dielectric layer 130 and top portions of the backside vias 136 extending through the dielectric layer 130 may have heights H3 in a range from about 3 nm to about 20 nm, or from about 5 nm to about 40 nm. Thinning the dielectric layer 130 and the top portions of the backside vias 136 too much may provide poor isolation for the backside vias 136, the backside vias 138, and the gate electrodes 102, which may result in shorting and other device defects.

Top portions of the backside vias 136 extending through the dielectric layer 130 may have widths greater than bottom portions of the backside vias 136 extending through the STI regions 68, the isolation layers 91, the CESL 94, and the first ILD 96 between the liner layers 137. For example, the top portions of the backside vias 136 may have widths W6 in the cross-section illustrated in FIG. 27A in a range from about 5 nm to about 30 nm. The top portions of the backside vias 136 may have widths W8 in the cross-section illustrated in FIG. 27C in a range from about 5 nm to about 30 nm. The bottom portions of the backside vias 136 may have widths W5 in the cross-section illustrated in FIG. 27A in a range from about 5 nm to about 30 nm. The bottom portions of the backside vias 136 may have widths W7 in the cross-section illustrated in FIG. 27C in a range from about 5 nm to about 30 nm. The top portions of the backside vias 136 may have widths greater than the feedthrough isolation structures 106 and the bottom portions of the backside vias 136, which ensures that the entire area of the feedthrough isolation structures 106 are exposed and etched through the dielectric layer 130. This provides the backside vias 136 with maximum widths, reduces electrical resistance, reduces capacitance, and improves device performance. The bottom portions of the backside vias 136 may have widths greater than the front-side vias 112, which ensures maximum contact between the backside vias 136 and the front-side vias 112. This reduces electrical resistance, reduces capacitance, and improves device performance.

The backside vias 136 and the front-side vias 112 collectively form feedthrough vias 139, which provide connections between the front-side of the substrate 50 and the backside of the substrate 50 through the substrate 50. The feedthrough vias 139 are short, wide conductive features, which have reduced electrical resistance and capacitance. Providing the feedthrough vias 139 provides connections between the front-side of the substrate 50 and the backside of the substrate 50 that feature reduced electrical resistance and capacitance and improve device performance. The backside vias 136 and the front-side vias 112 are self-aligned, which reduces device defects and reduces alignment steps. In some embodiments, the feedthrough vias 139 may be used to provide connections between a driver cell and a receiver cell, or the like.

In FIGS. 28A through 28D, a backside interconnect structure 170 is formed on the dielectric layer 130, the liner layers 137, the backside vias 136, and the backside vias 138. The backside interconnect structure 170 may be referred to as a backside interconnect structure because it is formed on a backside of the substrate 50 (e.g., a side of the substrate 50 opposite the side of the substrate 50 on which active devices are formed). The backside interconnect structure 170 may comprise one or more layers of conductive features 174 formed in one or more stacked dielectric layers 172, a passivation layer 176 on the conductive features 174 and the dielectric layers 172, UBMs 178 extending through the passivation layer 176, and external connectors 180 on the UBMs 178.

The dielectric layers 172 and the conductive features 174 may comprise materials and be formed using processes the same as or similar to those used for the dielectric layers 122 and the conductive features 124, discussed above with respect to FIGS. 23A through 23D. In particular, the backside interconnect structure 170 may comprise stacked layers of the conductive features 174 formed in the dielectric layers 172. The conductive features 174 may include routing lines (e.g., for routing to and from subsequently formed contact pads and external connectors). The conductive features 174 may further be patterned to include one or more embedded passive devices such as, resistors, capacitors, inductors, or the like. In some embodiments, the conductive features 174 may include backside power rails, which are conductive lines that electrically connect the epitaxial source/drain regions 92 to a reference voltage, a supply voltage, or the like. The embedded passive devices may be integrated with the he power rails to provide circuits (e.g., power circuits) on the backside of the nanostructure FETs.

The passivation layer 176 may comprise polymers such as PBO, polyimide, BCB, or the like. Alternatively, the passivation layer 176 may include non-organic dielectric materials such as silicon oxide, silicon nitride, silicon carbide, silicon oxynitride, or the like. The passivation layer 176 may be deposited by, for example, CVD, PVD, ALD, or the like.

The UBMs 178 are formed through the passivation layer 176 to the conductive features 174 in the backside interconnect structure 170 and the external connectors 180 are formed on the UBMs 178. The UBMs 178 may comprise one or more layers of copper, nickel, gold, or the like, which are formed by a plating process, or the like. The external connectors 180 (e.g., solder balls) are formed on the UBMs 178. The formation of the external connectors 180 may include placing solder balls on exposed portions of the UBMs 178 and reflowing the solder balls. In some embodiments, the formation of the external connectors 180 includes performing a plating step to form solder regions over the topmost conductive features 174 and then reflowing the solder regions. The UBMs 178 and the external connectors 180 may be used to provide input/output connections to other electrical components, such as, other device dies, redistribution structures, printed circuit boards (PCBs), motherboards, or the like. The UBMs 178 and the external connectors 180 may also be referred to as backside input/output pads that may provide signal, supply voltage, and/or ground connections to the nanostructure FETs described above.

Figure 29:
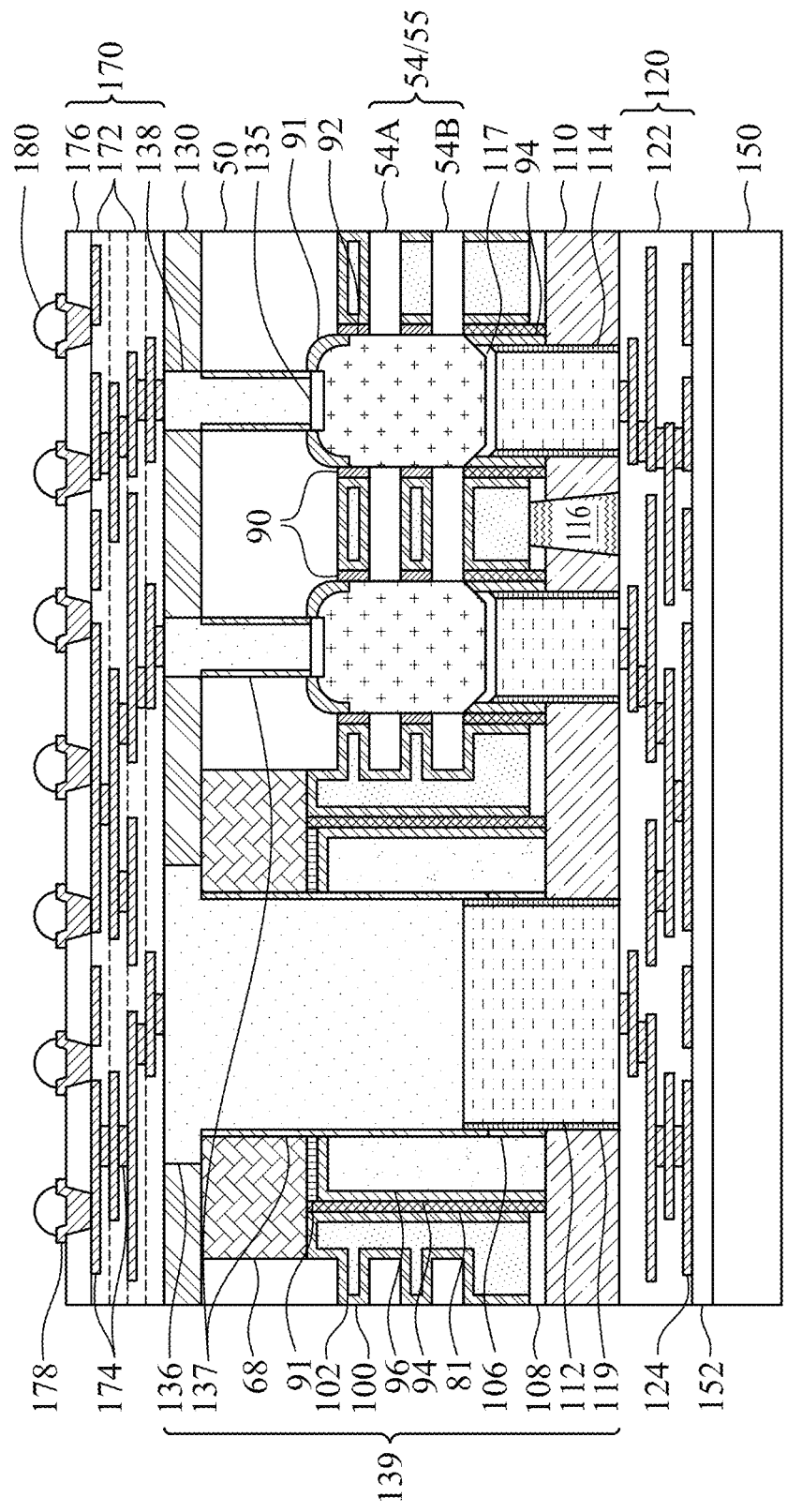

FIG. 29 illustrates an embodiment in which the multi-layer stack 64 is formed with two of the first semiconductor layers 51 (e.g., a first semiconductor layer 51A and a first semiconductor layer 51B) and two of the second semiconductor layers 53 (e.g., a second semiconductor layer 53A and a second semiconductor layer 53B), such that the resulting nanostructure FETs include two second nanostructures 54 (e.g., a second nanostructure 54A and a second nanostructure 54B) in the nanostructures 55. Any number of semiconductor layers may be included in the multi-layer stack 64, and the nanostructure FETs may include any number of stacked nanostructures.

Figure 30A:
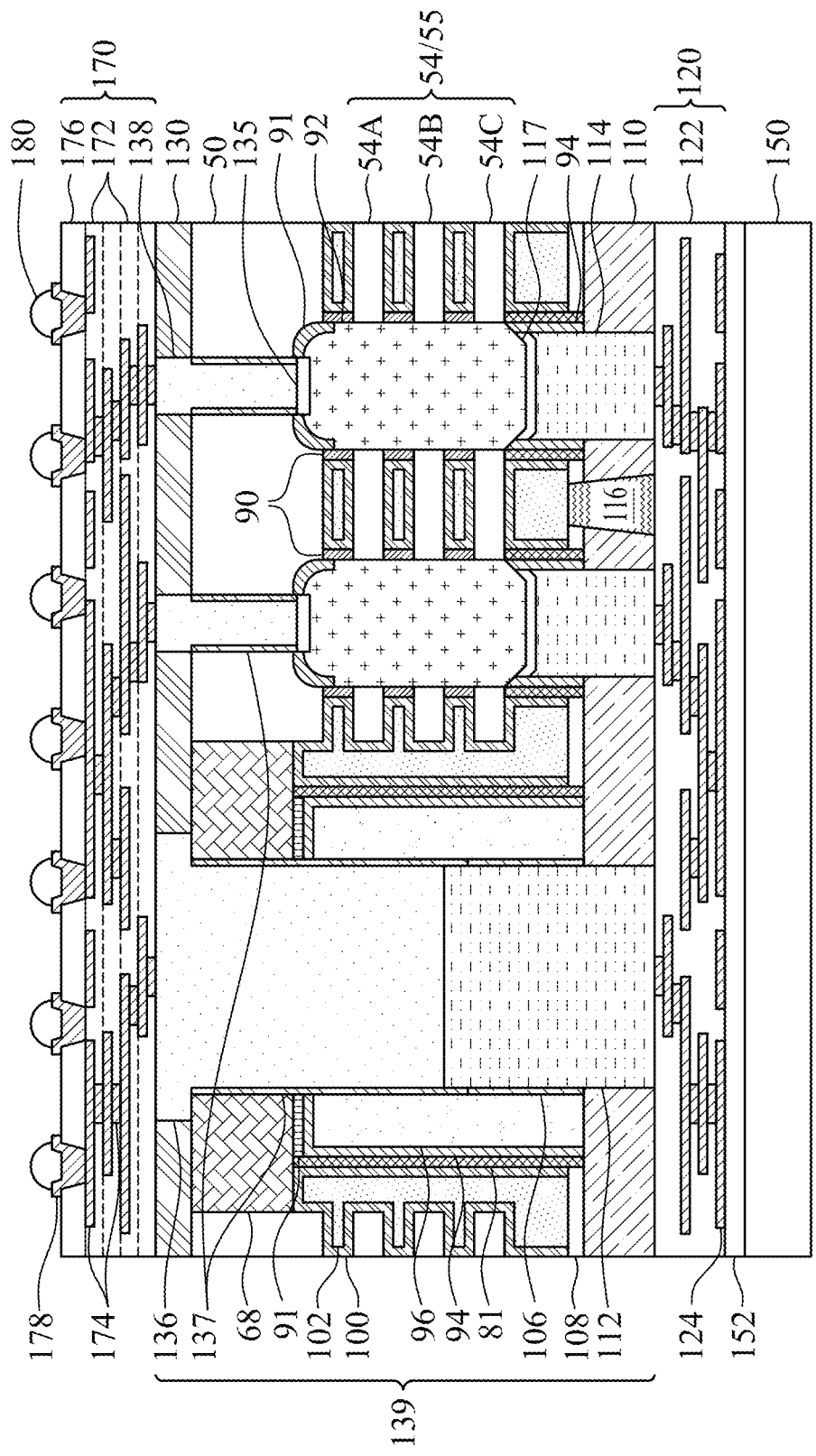
Figure 30B:
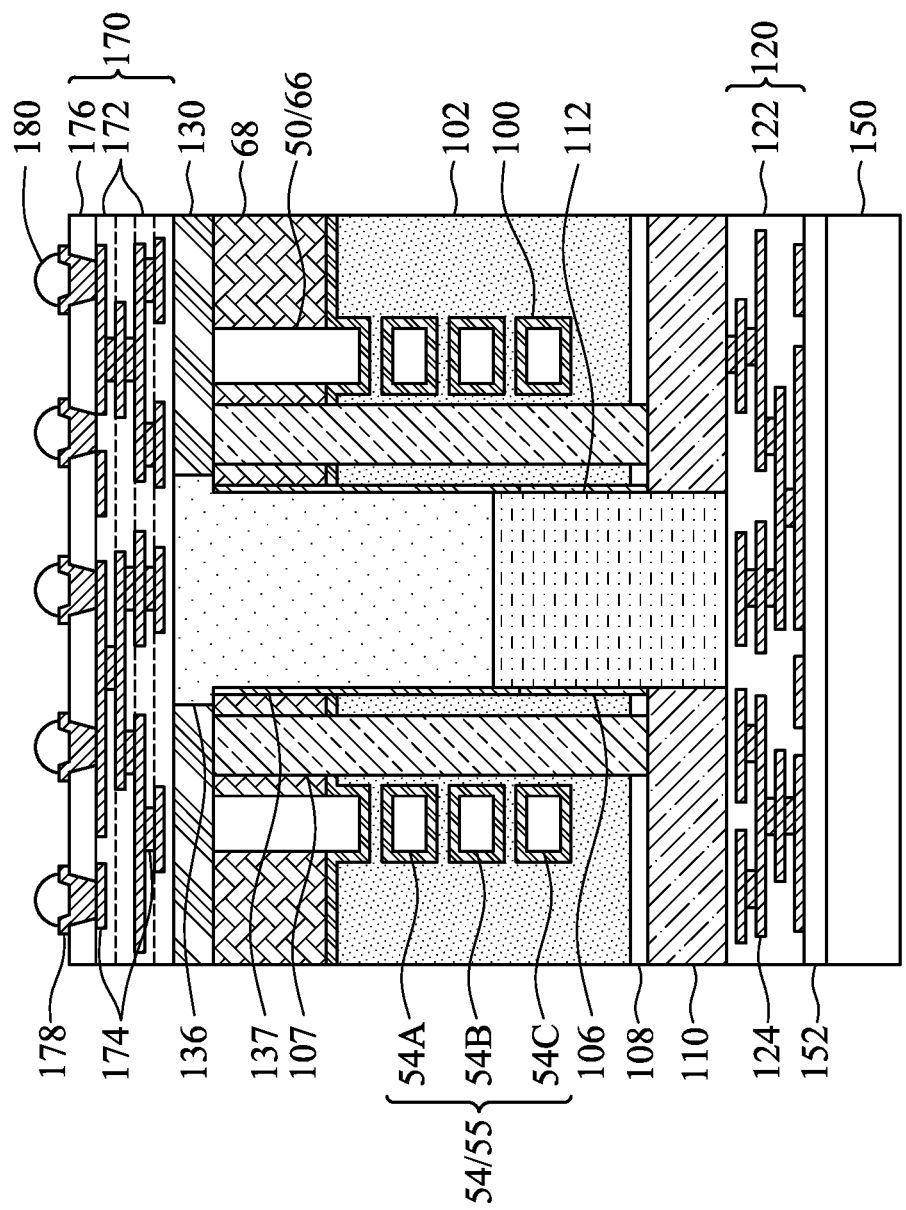

FIGS. 30A and 30B illustrate an embodiment in which the liner layers 119 of the front-side vias 112 and the source/drain contacts 114 are omitted. Omitting the liner layers 119 reduces the costs and processes associated with forming the front-side vias 112 and the source/drain contacts 114, but also reduces isolation between the front-side vias 112 and the source/drain contacts 114. In embodiments in which the liner layers 119 are omitted, the front-side vias 112 and the source/drain contacts 114 may be electrically isolated by the second ILD 110, the feedthrough isolation structures 106, the first ILD 96, the CESL 94, the first spacers 81, and the gate isolation structures 107.

Figure 31:
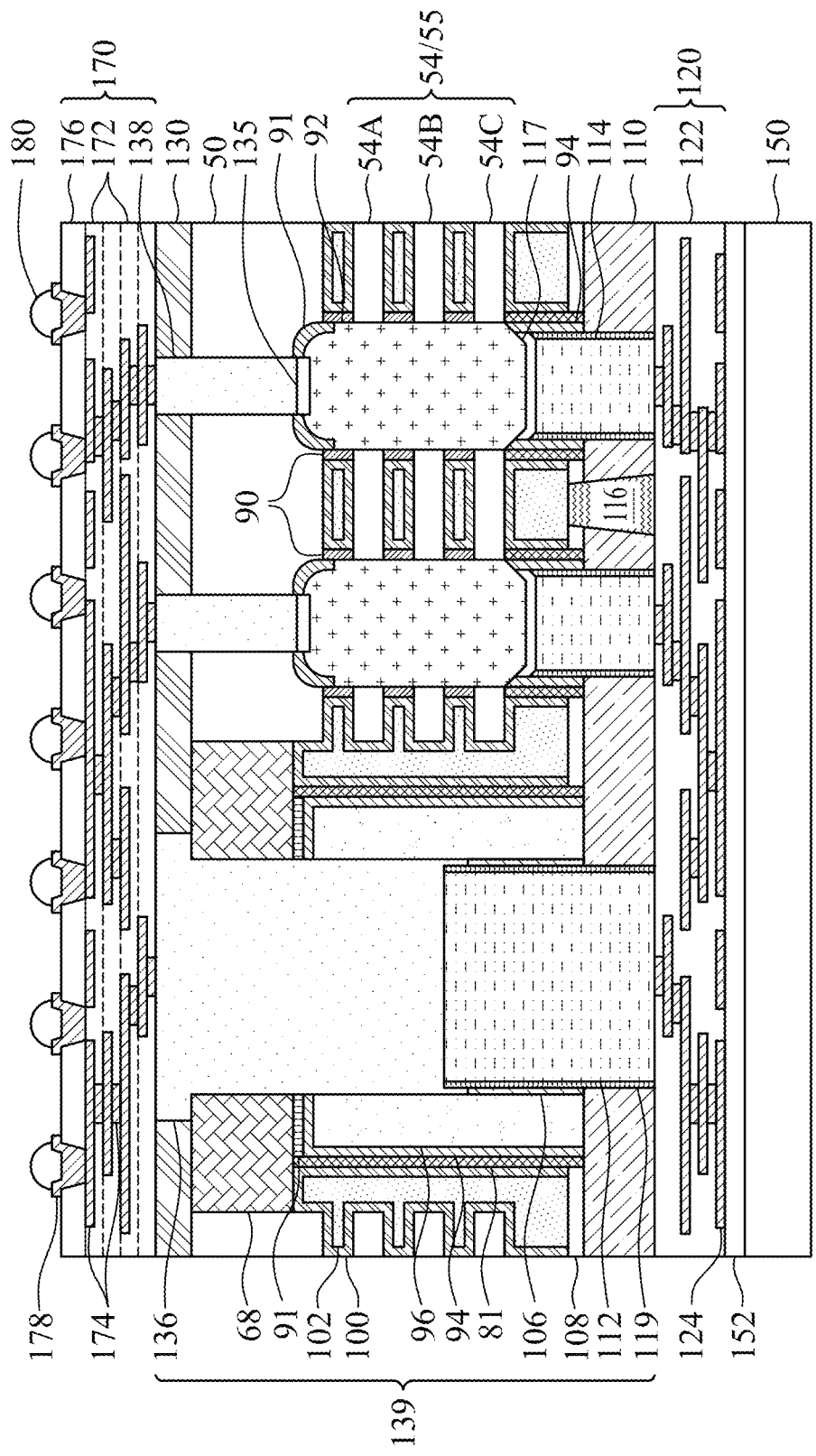

FIG. 31 illustrates an embodiment in which the liner layers 137 of the backside vias 136 and the backside vias 138 are omitted. Omitting the liner layers 137 reduces the costs and processes associated with forming the backside vias 136 and the backside vias 138, but also reduces isolation between the backside vias 136 and the backside vias 138. In embodiments in which the liner layers 137 are omitted, the backside vias 136 and the backside vias 138 may be electrically isolated by the STI regions 68, the dielectric layer 130, the substrate 50, and the gate isolation structures 107.

Figure 32A:
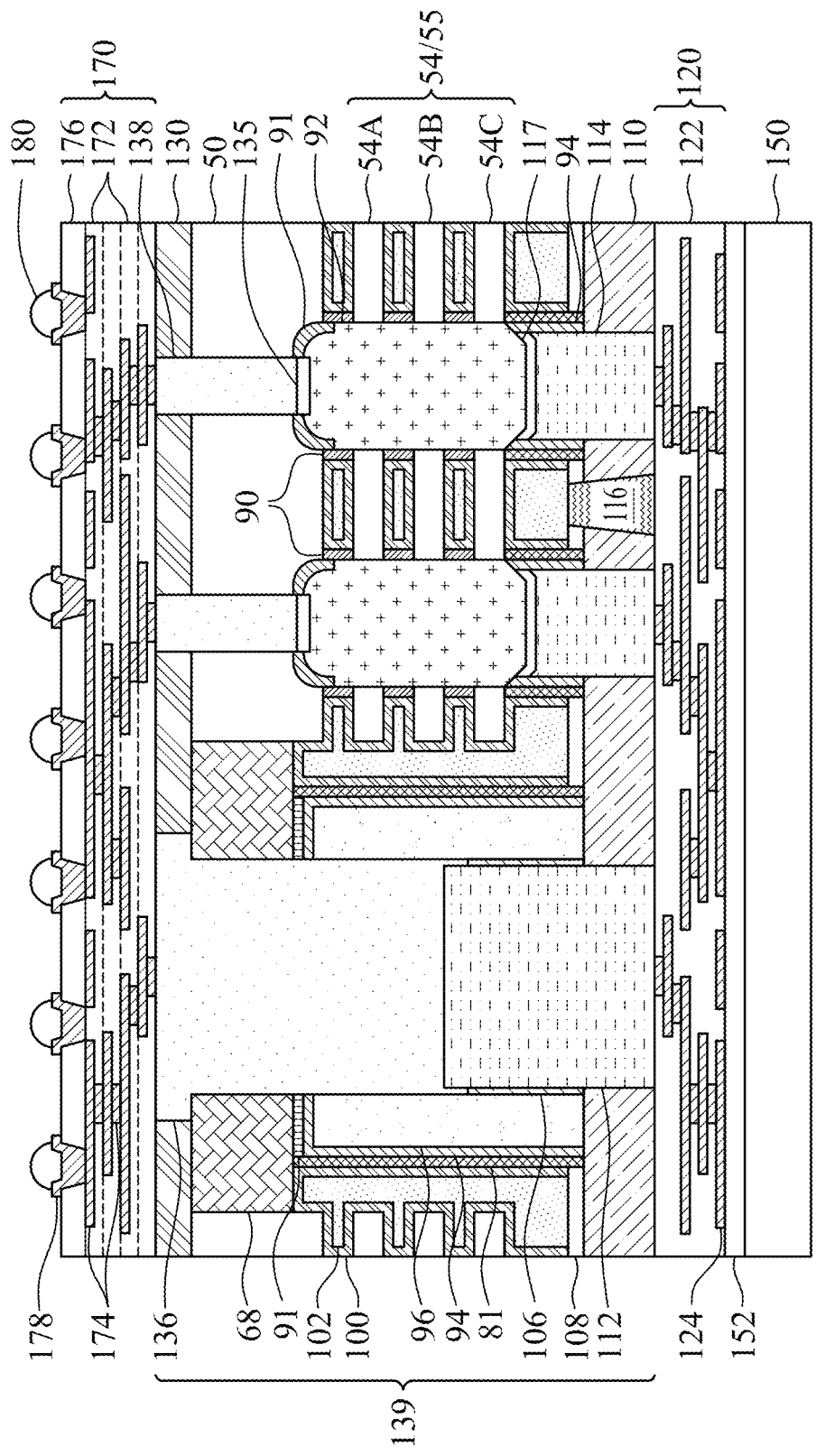
Figure 32B:
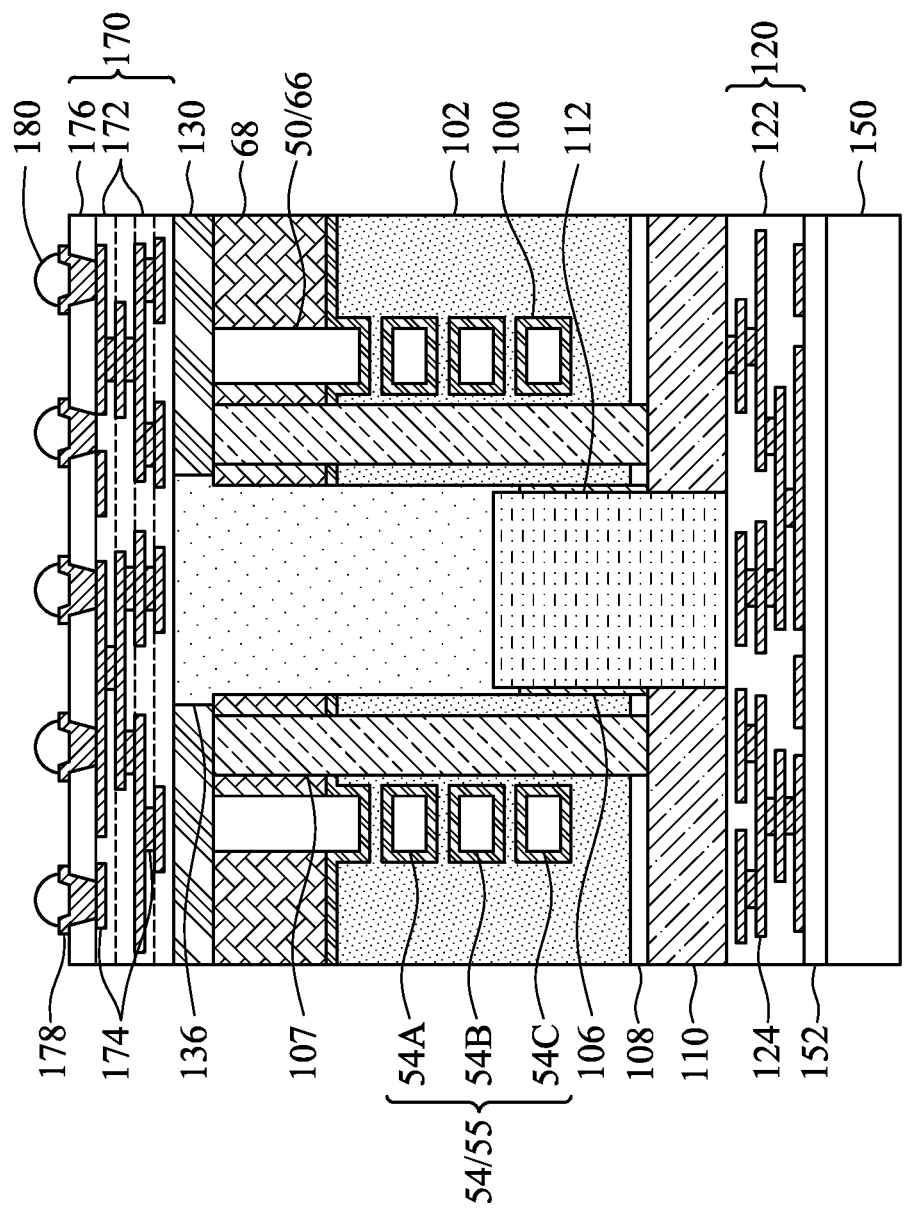

FIGS. 32A and 32B illustrate an embodiment in which the liner layers 119 of the front-side vias 112 and the source/drain contacts 114 and the liner layers 137 of the backside vias 136 and the backside vias 138 are omitted. Omitting the liner layers 119 reduces the costs and processes associated with forming the front-side vias 112 and the source/drain contacts 114, but also reduces isolation between the front-side vias 112 and the source/drain contacts 114. Omitting the liner layers 137 reduces the costs and processes associated with forming the backside vias 136 and the backside vias 138, but also reduces isolation between the backside vias 136 and the backside vias 138. In embodiments in which the liner layers 119 are omitted, the front-side vias 112 and the source/drain contacts 114 may be electrically isolated by the second ILD 110, the feedthrough isolation structures 106, the first ILD 96, the CESL 94, the first spacers 81, and the gate isolation structures 107. In embodiments in which the liner layers 137 are omitted, the backside vias 136 and the backside vias 138 may be electrically isolated by the STI regions 68, the dielectric layer 130, the substrate 50, and the gate isolation structures 107.

Figure 33A:
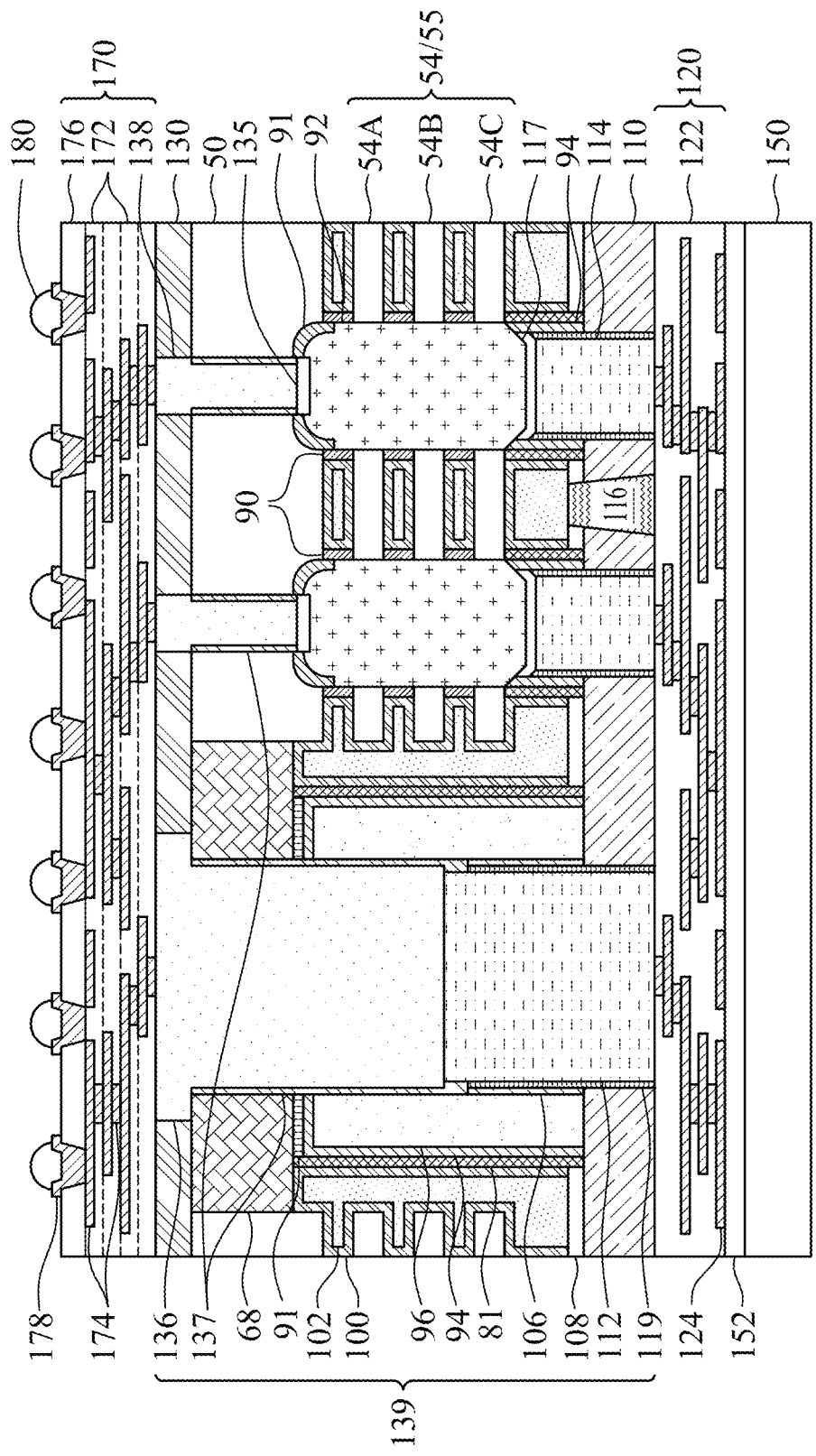
Figure 33B:
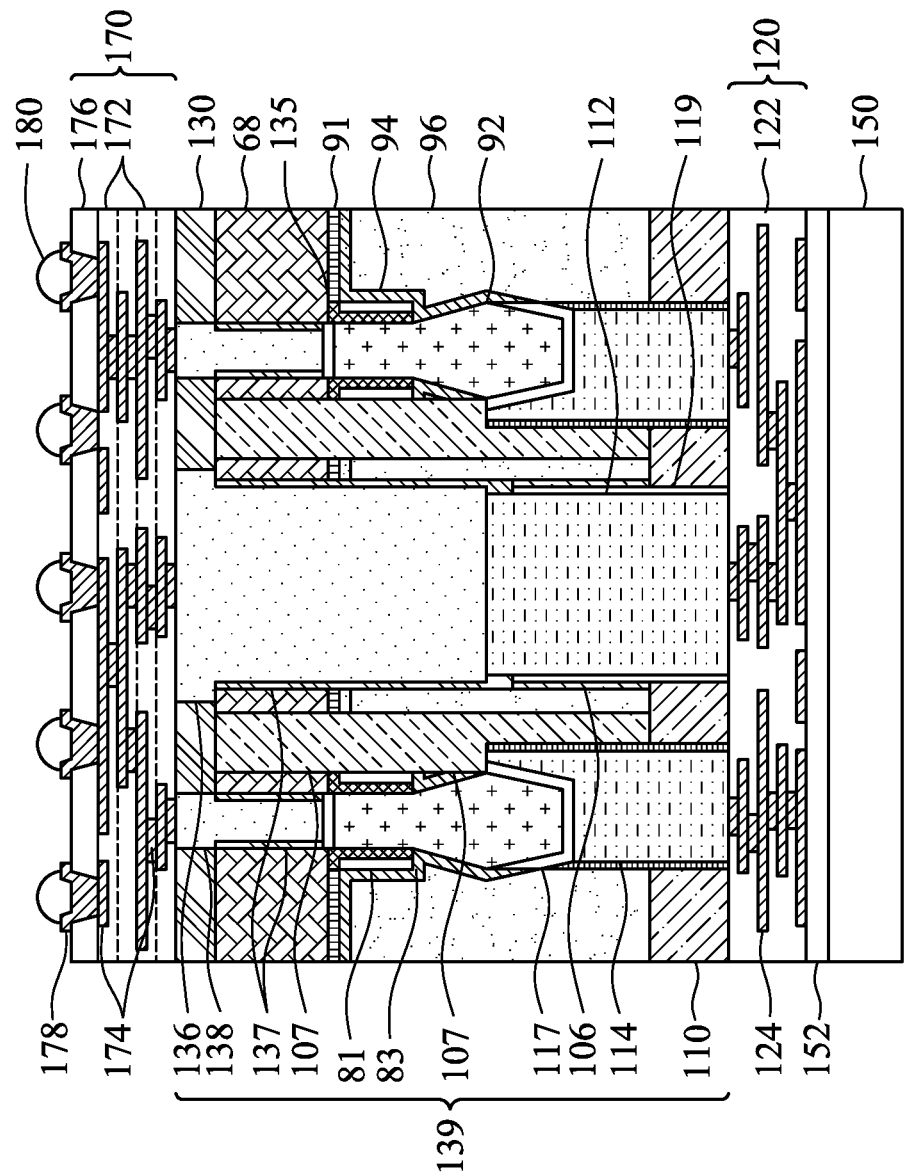

FIGS. 33A and 33B illustrate an embodiment in which the liner layers 119 are etched by the etching processes used to form the backside via recesses 132 and the backside via recesses 134. In some embodiments, the liner layers 119 and the feedthrough isolation structures 106 may be formed of the same materials, such that both the liner layers 119 and the feedthrough isolation structures 106 are etched during the formation of the backside via recesses 132 and the backside via recesses 134. The liner layers 137 may then be deposited along side surfaces of the front-side vias 112. Further in the embodiment of FIGS. 33A and 33B, at least portions of the fins 66 may remain adjacent the liner layers 137.

Figure 34:
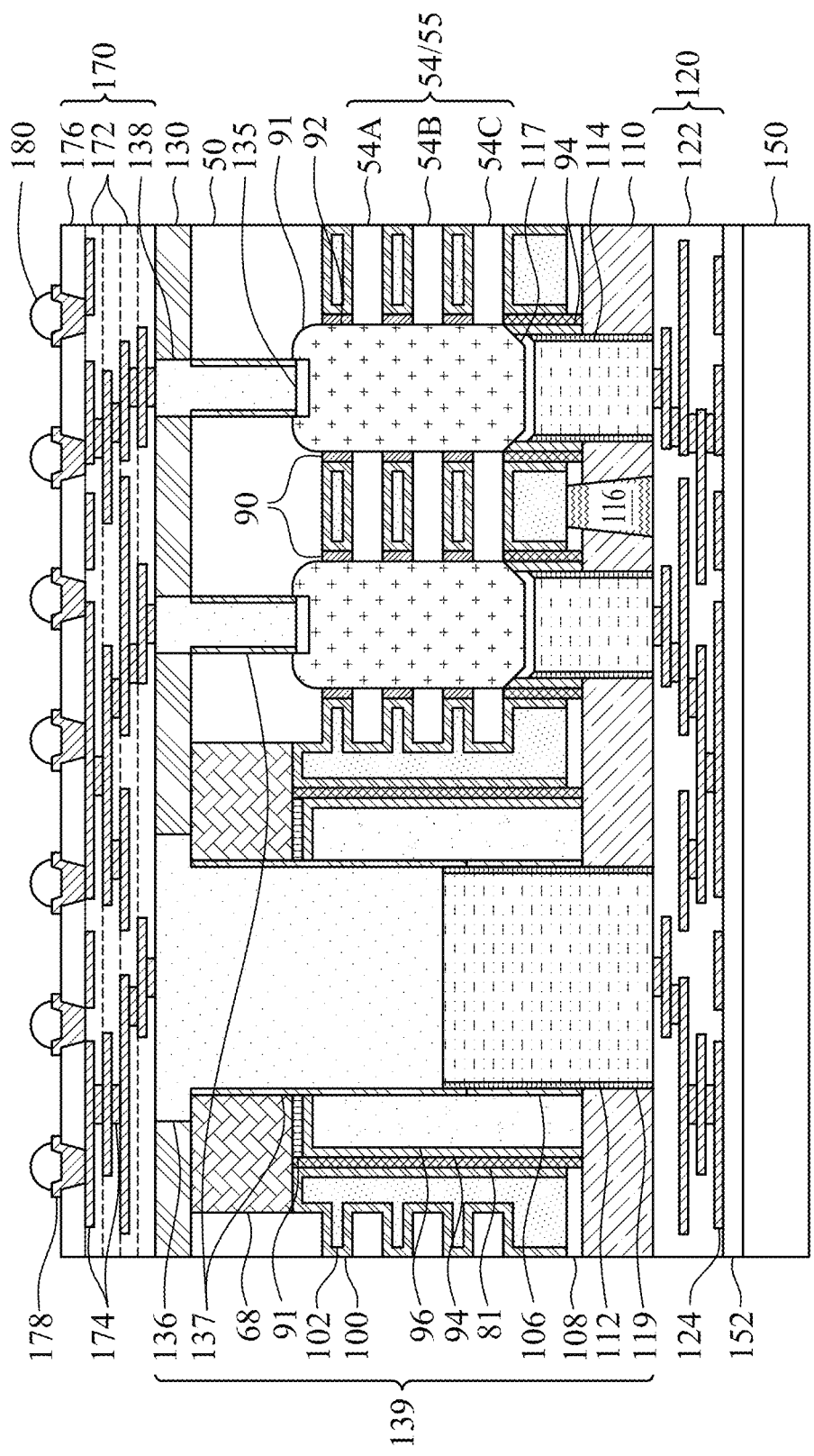
Figure 35A:
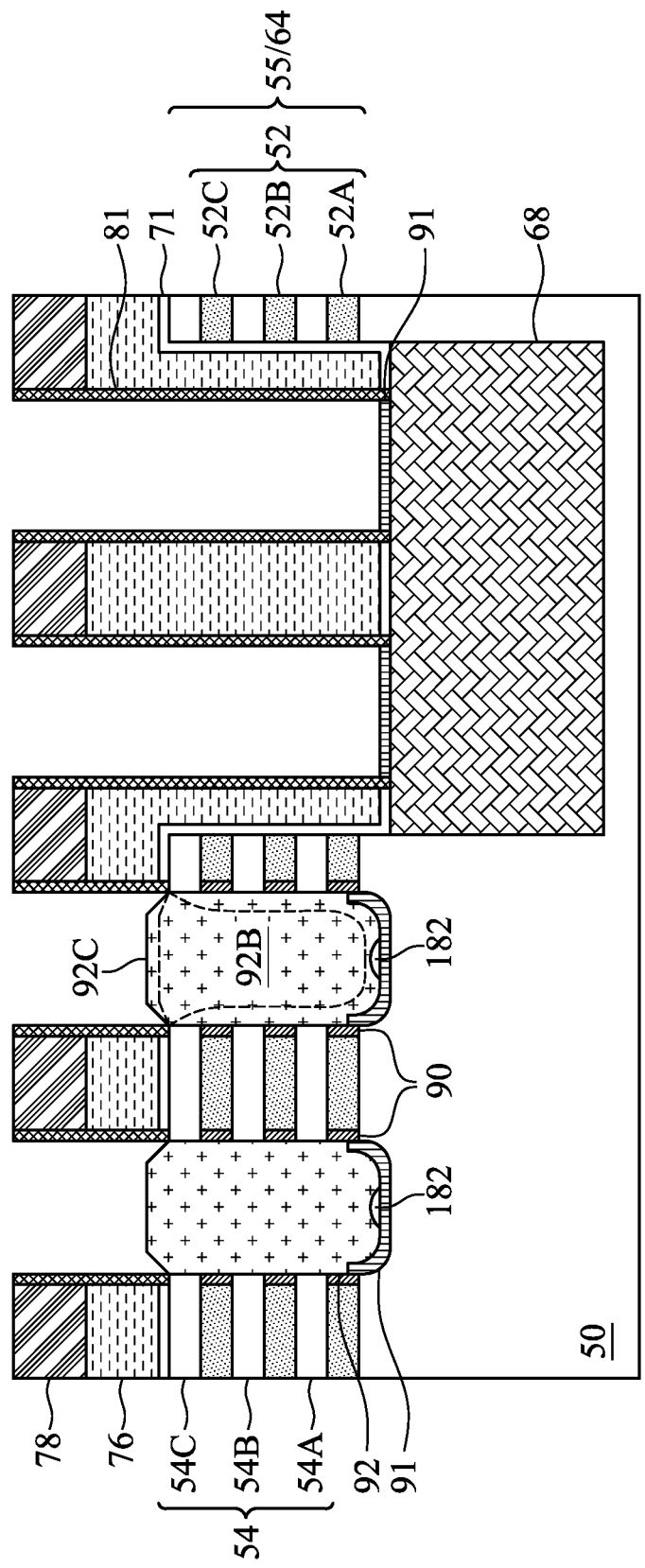
Figure 35B:
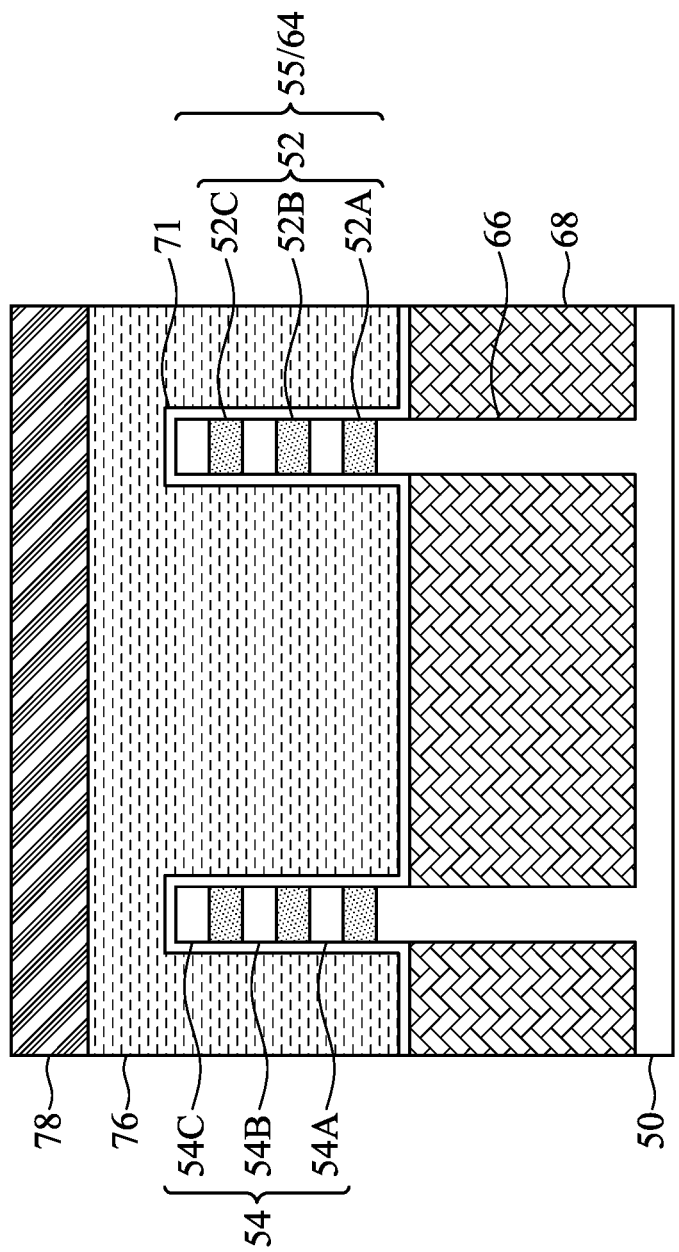
Figure 35C:
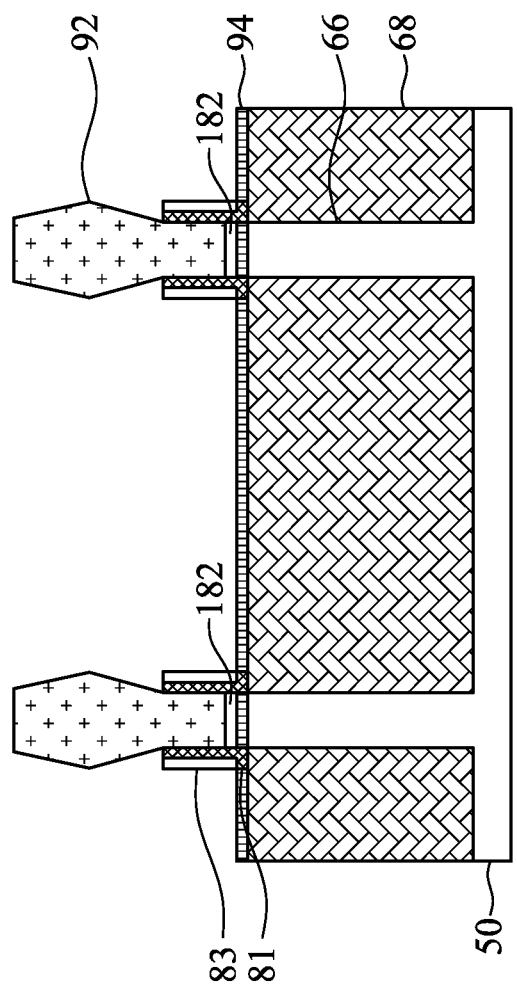
Figure 35D:
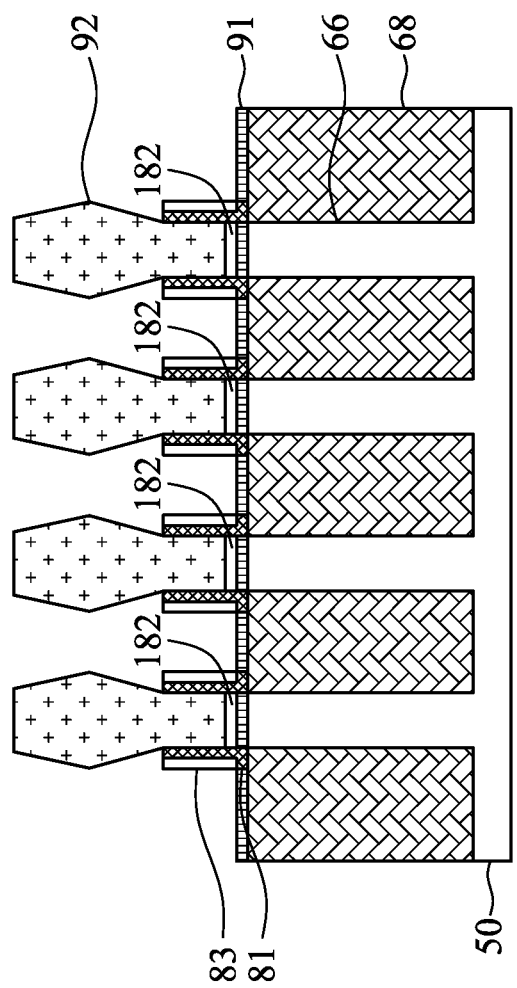

FIG. 34 illustrates an embodiment in which the portions of the isolation layers 91 are omitted. Omitting the isolation layers 91 allows the epitaxial source/drain regions 92 to be epitaxially grown from the substrate 50/fins 66 as well as the nanostructures 55, and may be used to alter the shape and/or growth of the epitaxial source/drain regions 92.

FIGS. 35A through 35D illustrate an intermediate stage in an embodiment in which voids 182 are formed beneath the epitaxial source/drain regions 92. FIGS. 35A through 35D show a similar step of processing as FIGS. 12A through 12D. The voids 182 may be formed as a result of the epitaxial source/drain regions 92 coalescing in the recesses 86 before the recesses 86 are completely filled by the epitaxial source/drain regions 92. The voids 182 are the unfilled portions of the recesses 86, and portions of the isolation layers 91 (when present) are exposed to the voids 182. In some embodiments, the voids 182 are filled by the silicide regions 135 during processing, such that the voids 182 do not remain in the resulting devices.

Embodiments may achieve advantages. For example, providing the backside vias 136 and the front-side vias 112, which collectively form the feedthrough vias 139, provides connections between the front-side of the substrate 50 and the backside of the substrate 50 through the substrate 50. The feedthrough vias 139 are short, wide conductive features, which have reduced electrical resistance and capacitance. Providing the feedthrough vias 139 provides connections between the front-side of the substrate 50 and the backside of the substrate 50 that feature reduced electrical resistance and capacitance and improve device performance. The backside vias 136 and the front-side vias 112 are self-aligned, which reduces device defects and reduces alignment steps. In some embodiments, the feedthrough vias 139 may be used to provide connections between a driver cell and a receiver cell, or the like.

Figure 36:
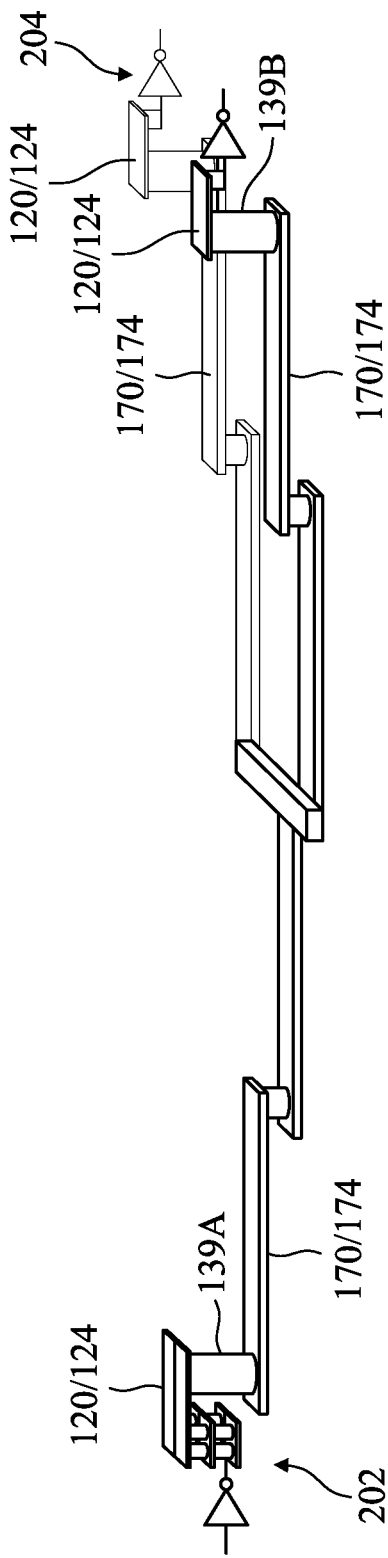
FIG. 36 is a schematic diagram of a circuit that may be formed using feedthrough vias, in accordance with some embodiments.

FIG. 36 is a schematic diagram of a circuit that may be formed using the feedthrough vias 139, in accordance with some embodiments. The previously described nanostructure FETs may be interconnected to form a driver circuit 202 and a receiver circuit 204. The driver circuit 202 may be connected to the receiver circuit 204 by routing a connection from the front-side interconnect structure 120 to the backside interconnect structure 170 with a first feedthrough via 139A and then routing the connection from the backside interconnect structure 170 to the front-side interconnect structure 120 with a second feedthrough via 139B. Utilizing the feedthrough vias 139A, 139B allows the conductive features 174 of the backside interconnect structure 170 to be utilized for at least a portion of the connection between the driver circuit 202 and the receiver circuit 204. The backside interconnect structure 170 may have a lower interconnect density than the front-side interconnect structure 120, and so the conductive features 174 may be wider and shorter than the conductive features 124, which may reduce interconnect resistance and improve device performance.

In accordance with an embodiment, a semiconductor device includes a gate structure on a substrate; a first isolation feature extending partially through the gate structure; a first conductive feature extending through the first isolation feature; and a second conductive feature extending partially through the gate structure, the second conductive feature being electrically coupled to the first conductive feature. In an embodiment, the second conductive feature extends through the substrate. In an embodiment, the second conductive feature extends through a shallow trench isolation region on the substrate. In an embodiment, the second conductive feature includes a barrier layer and a conductive fill material on the barrier layer, a side surface of the barrier layer being aligned with a side surface of the first isolation feature. In an embodiment, the second conductive feature is T-shaped in a cross-sectional view, and a first width of the first isolation feature is less than a second width of the second conductive feature. In an embodiment, the second conductive feature is in physical contact with a side surface of the first conductive feature. In an embodiment, the semiconductor device further includes a shallow trench isolation structure on the substrate; a first interlayer dielectric on the shallow trench isolation structure; and a second interlayer dielectric on the first interlayer dielectric, the second conductive feature extending through the shallow trench isolation structure and partially through the first interlayer dielectric, and the first conductive feature extending through the second interlayer dielectric and partially through the first interlayer dielectric.

In accordance with another embodiment, a semiconductor device includes a semiconductor substrate; a first source/drain region on the semiconductor substrate; a second source/drain region on the semiconductor substrate; a shallow trench isolation (STI) region on the semiconductor substrate; a first interlayer dielectric (ILD) on the first source/drain region, the second source/drain region, and the STI region; a second ILD on the first ILD; a first conductive feature between the first source/drain region and the second source/drain region, the first conductive feature extending in the second ILD and the first ILD; and a second conductive feature between the first source/drain region and the second source/drain region, the second conductive feature extending in the semiconductor substrate, the STI region, and the first ILD, and the second conductive feature being electrically coupled to the first conductive feature. In an embodiment, the semiconductor device further includes a third conductive feature electrically coupled to the first source/drain region opposite the semiconductor substrate, a top surface of the first conductive feature being level with a top surface of the third conductive feature. In an embodiment, the semiconductor device further includes a third conductive feature electrically coupled to the first source/drain region, the third conductive feature extends through the semiconductor substrate, and a bottom surface of the second conductive feature is level with a bottom surface of the third conductive feature. In an embodiment, the semiconductor device further includes a gate structure on the semiconductor substrate adjacent the first source/drain region and the second source/drain region; and a first gate isolation structure extending through the gate structure between the first source/drain region and the first conductive feature and the second conductive feature. In an embodiment, the semiconductor device further includes a second gate isolation structure extending through the gate structure between the second source/drain region and the first conductive feature and the second conductive feature. In an embodiment, the first conductive feature includes a first barrier layer and a first conductive material on the first barrier layer, the second conductive feature includes a second barrier layer and a second conductive material on the second barrier layer, and the second barrier layer extends along a side surface of the first barrier layer. In an embodiment, the semiconductor device further includes a gate structure on the semiconductor substrate adjacent the first source/drain region and the second source/drain region, the first conductive feature and the second conductive feature extending through the gate structure.

In accordance with yet another embodiment, a method including forming first channel layers and second channel layers on a substrate; forming a gate structure around the first channel layers and the second channel layers; forming an isolation feature through the gate structure and between the first channel layers and the second channel layers; forming a first trench in the isolation feature; forming a first conductive feature in the first trench; forming a second trench in the isolation feature; and forming a second conductive feature in the second trench and electrically coupled to the first conductive feature. In an embodiment, the first trench is formed from a front-side of the substrate, and the second trench is formed from a backside of the substrate opposite the front-side. In an embodiment, the method further includes forming a mask layer on a first surface of the isolation feature opposite the first conductive feature; forming an opening through the mask layer exposing the first surface of the isolation feature; and etching the isolation feature exposed by the opening to form the second trench. In an embodiment, the opening in the mask layer has a first width greater than a second width of the second trench. In an embodiment, the isolation feature has a first width greater than a second width of the first conductive feature. In an embodiment, the method further includes alternately stacking first epitaxy layers and second epitaxy layers to form a semiconductor stack on the substrate; patterning the semiconductor stack to form first nanostructures and second nanostructures; and removing the first epitaxy layers of the first nanostructures and the second nanostructures to form the first channel layers and the second channel layers, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming first channel layers and second channel layers on a substrate;
    forming a gate structure around the first channel layers and the second channel layers;
    forming an isolation feature through the gate structure and between the first channel layers and the second channel layers;
    forming a first trench in the isolation feature;
    forming a first conductive feature in the first trench;
    forming a second trench in the isolation feature; and
    forming a second conductive feature in the second trench and electrically coupled to the first conductive feature.

2. The method of claim 1, wherein the first trench is formed from a front-side of the substrate, and wherein the second trench is formed from a backside of the substrate opposite the front-side.

3. The method of claim 1, further comprising:
    forming a mask layer on a first surface of the isolation feature opposite the first conductive feature;
    forming an opening through the mask layer exposing the first surface of the isolation feature; and
    etching the isolation feature exposed by the opening to form the second trench.

4. The method of claim 3, wherein the opening in the mask layer has a first width greater than a second width of the second trench.

5. The method of claim 1, wherein the isolation feature has a first width greater than a second width of the first conductive feature.

6. The method of claim 1, further comprising:
    alternately stacking first epitaxy layers and second epitaxy layers to form a semiconductor stack on the substrate;
    patterning the semiconductor stack to form first nanostructures and second nanostructures; and
    removing the first epitaxy layers of the first nanostructures and the second nanostructures to form the first channel layers and the second channel layers, respectively.

7. A method comprising:
    growing a first source/drain region and a second source/drain region over a substrate;
    depositing an interlayer dielectric over the first source/drain region and the second source/drain region;
    forming an isolation feature through the interlayer dielectric and between the first source/drain region and the second source/drain region;
    forming a first trench in an upper portion of the isolation feature;
    forming a first conductive feature in the first trench;
    forming a second trench in a lower portion of the isolation feature; and
    forming a second conductive feature in the second trench and electrically coupled to the first conductive feature.

8. The method of claim 7, wherein the first trench is formed from a front-side of the substrate, and wherein the second trench is formed from a backside of the substrate opposite the front-side.

9. The method of claim 7, further comprising:
forming a mask layer on a first surface of the isolation feature opposite the first conductive feature;
forming an opening through the mask layer exposing the first surface of the isolation feature; and
etching the isolation feature exposed by the opening to form the second trench.

10. The method of claim 9, wherein the opening in the mask layer has a first width greater than a second width of the second trench.

11. The method of claim 7, wherein the isolation feature has a first width greater than a second width of the first conductive feature.

12. The method of claim 7, further comprising:
forming a semiconductor stack on the substrate by alternately stacking first epitaxy layers and second epitaxy layers;
forming first nanostructures and second nanostructures by patterning the semiconductor stack; and
removing the first epitaxy layers of the first nanostructures and the second nanostructures to form first channel layers and second channel layers, respectively, wherein the first source/drain region is grown adjacent to the first channel layers, and the second source/drain region is grown adjacent to the second channel layers.

13. The method of claim 12, further comprising:
forming a gate structure around the first channel layers and the second channel layers, wherein the isolation feature is also formed through the gate structure and between the first channel layers and the second channel layers.

14. A method comprising:
forming a gate structure over an isolation region, the gate structure disposed around a plurality of channel layers;
forming a first portion of a feedthrough via extending through the gate structure;
forming a front-side interconnect structure that is electrically coupled to the feedthrough via and the gate structure;
after forming the front-side interconnect structure, forming a second portion of the feedthrough via extending through the isolation region; and
forming a back-side interconnect structure, the back-side interconnect structure electrically coupled to the feedthrough via, the feedthrough via electrically coupling the front-side interconnect structure to the back-side interconnect structure.

15. The method of claim 14, further comprising:
forming a feedthrough isolation structure through the gate structure and the isolation region,
wherein forming the first portion of the feedthrough via comprises forming a first conductive feature in an upper portion of the feedthrough isolation structure, and
wherein forming the second portion of the feedthrough via comprises forming a second conductive feature in a lower portion of the feedthrough isolation structure.

16. The method of claim 15, wherein forming the first conductive feature comprises:
forming a first trench in the upper portion of the feedthrough isolation structure; and
forming a first barrier layer and a first fill material in the first trench.

17. The method of claim 16, wherein forming the second conductive feature comprises:
forming a second trench in the lower portion of the feedthrough isolation structure, the second trench exposing the first conductive feature; and
forming a second barrier layer and a second fill material in the second trench.

18. The method of claim 16, wherein a width of the first trench is smaller than a width of the feedthrough isolation structure.

19. The method of claim 15, further comprising:
forming the isolation region over a substrate; and
thinning the substrate to expose the isolation region before forming the second portion of the feedthrough via.

20. The method of claim 14, wherein the feedthrough via has a T-shaped structure in a cross-sectional view.

* * * * *